US012666595B2

(12) United States Patent
Lee et al.

(10) Patent No.: US 12,666,595 B2
(45) Date of Patent: Jun. 23, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: I-Che Lee, Hsinchu (TW); Huai-Ying Huang, New Taipei City (TW); Yen-Chieh Huang, Hsinchu (TW); Wei-Gang Chiu, New Taipei City (TW); Kai-Wen Cheng, Taichung City (TW); Yu-Ming Lin, Hsinchu City (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 360 days.

(21) Appl. No.: 18/449,710

(22) Filed: Aug. 15, 2023

(65) Prior Publication Data

US 2025/0063720 A1    Feb. 20, 2025

(51) Int. Cl.
H10B 12/00        (2023.01)

(52) U.S. Cl.
CPC ......... H10B 12/315 (2023.02); H10B 12/033 (2023.02); H10B 12/0335 (2023.02); H10B 12/05 (2023.02)

(58) Field of Classification Search
CPC .... H10D 12/033; H10D 12/035; H10D 12/05; H10D 12/09; H10D 12/315
See application file for complete search history.

(56) References Cited

U.S. PATENT DOCUMENTS

| | | | |
|---|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |

(Continued)

*Primary Examiner* — Daniel P Shook
(74) *Attorney, Agent, or Firm* — JCIPRNET

(57)        ABSTRACT

A semiconductor device includes a substrate, an interconnect, a memory cell, and a plurality of first barrier structures. The interconnect is disposed over the substrate. The memory cell is disposed in the interconnect within a memory region of the substrate, where the memory cell includes a transistor and a capacitor. The transistor includes a gate, source/drain elements respectively standing at two opposite sides of the gate, and a channel disposed between the source/drain elements and overlapped with the gate. The capacitor is disposed over the transistor and electrically coupled to one of the source/drain elements. The plurality of first barrier structures line sidewalls and bottom surfaces of the source/drain elements, and each include a first barrier layer and a second barrier layer disposed between the source/drain elements and the first barrier layer, where a first absorption interface is disposed between the first barrier layer and the second barrier layer.

20 Claims, 21 Drawing Sheets

(56)     References Cited

U.S. PATENT DOCUMENTS

| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2019/0326296 | A1* | 10/2019 | Wang ................... H10B 12/315 |

* cited by examiner

SEMICONDUCTOR DEVICE AND MANUFACTURING METHOD THEREOF

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
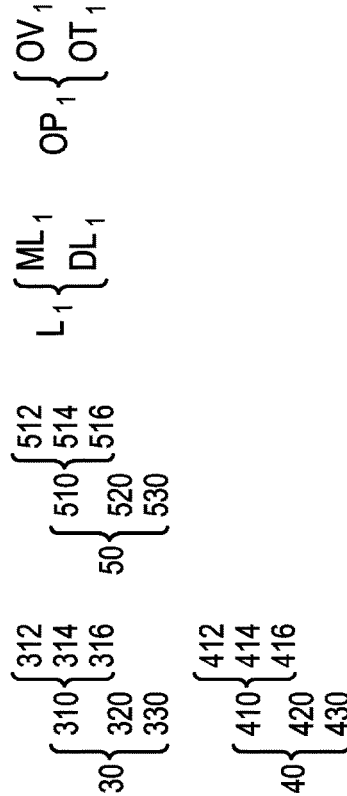
FIG. 1 to FIG. 9 are schematic cross-sectional views of various stages in a manufacturing method of a semiconductor device in accordance with some embodiments of the disclosure.
Figure 1:
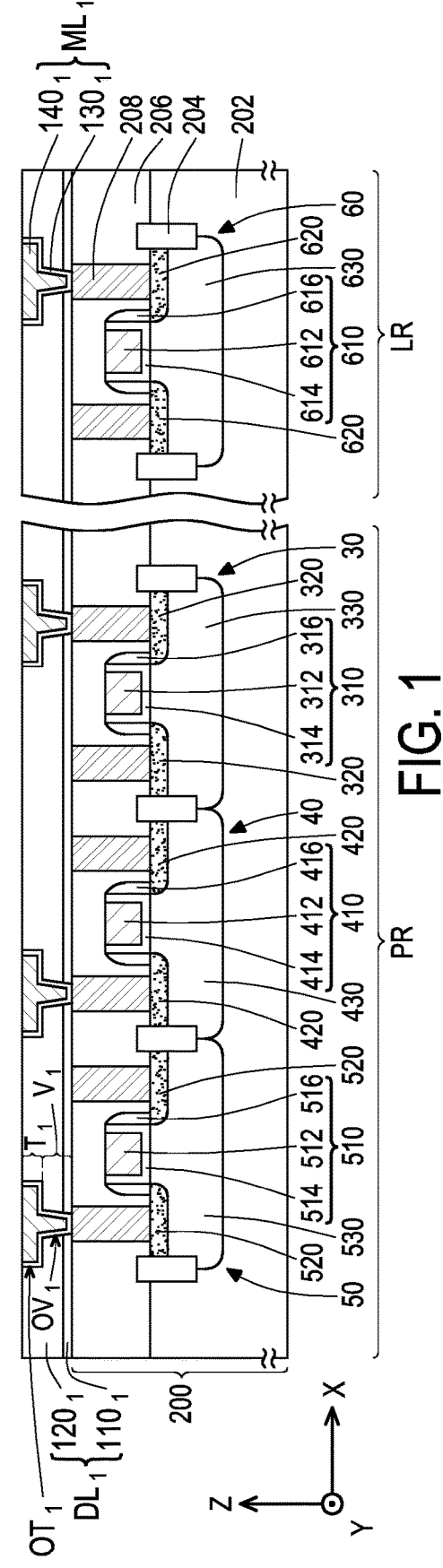

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The embodiments are intended to provide further explanations but are not used to limit the scope of the disclosure. The specific embodiment(s) described herein is related to a semiconductor device (or a semiconductor structure) having one and more transistors and one or more capacitors embedded in an interconnect structure formed during back-end-of-line (BEOL) processes, and is not intended to limit the scope of the disclosure. Due to the transistors and the capacitors electrically coupled thereto are disposed in the interconnect structure over a semiconductor substrate (e.g., a silicon substrate), the occupied area of the semiconductor substrate can be greatly reduced, thereby the complexity of the manufacturing process and the manufacturing cost can also be decreased. In addition, the semiconductor device of the embodiments further includes two or more barrier layers lining conductive feature of the transistors and/or the capacitor, so that the impact (e.g., the contamination caused by the hydrogen or moisture attacks) to the capacitors can be controlled (or saying reduced), the performance of the semiconductor device or semiconductor structure can be improved.

Figure 10A:
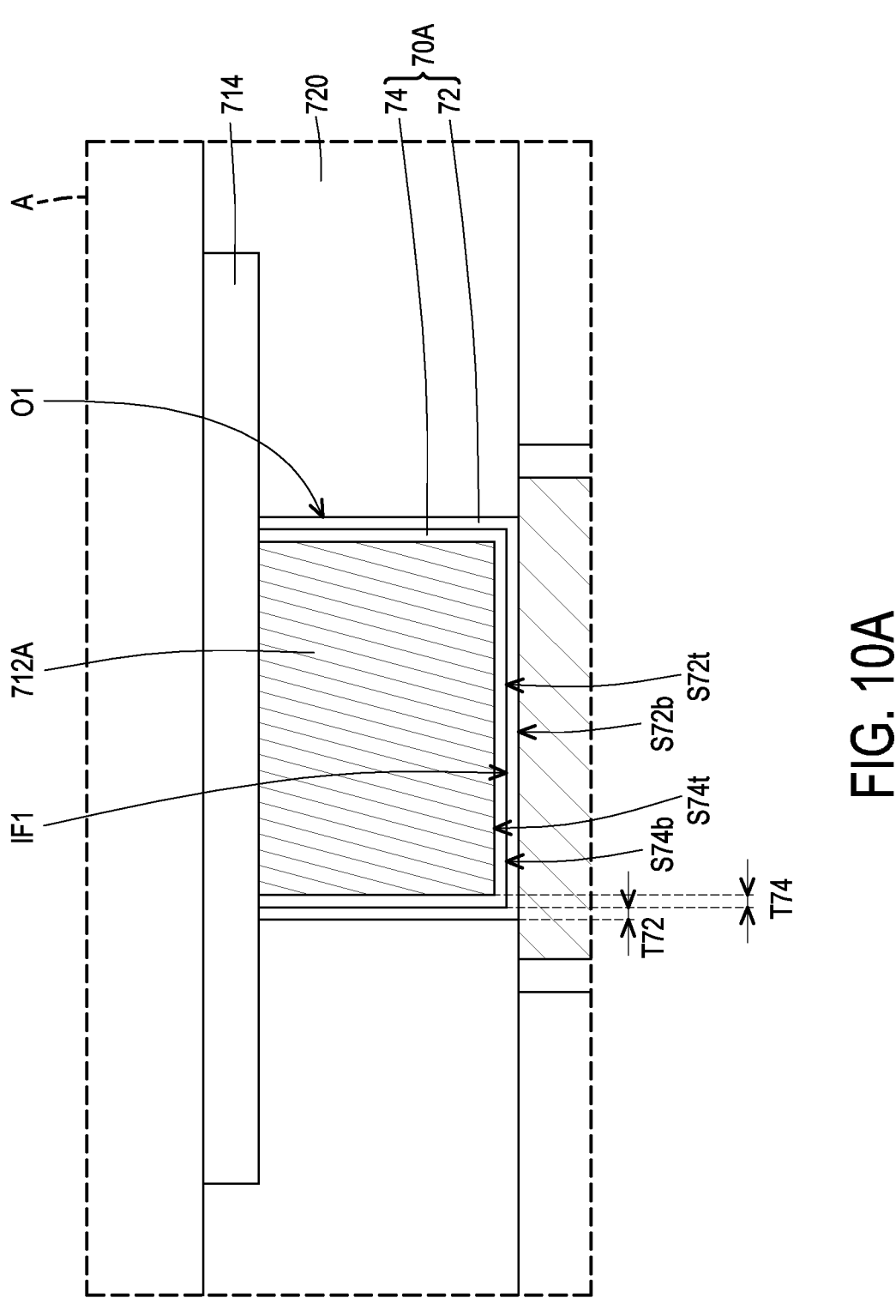
FIG. 10A and FIG. 10B are enlarged and schematic cross-sectional views respectively showing a part of a semiconductor device in accordance with some embodiments of the disclosure.
Figure 10B:
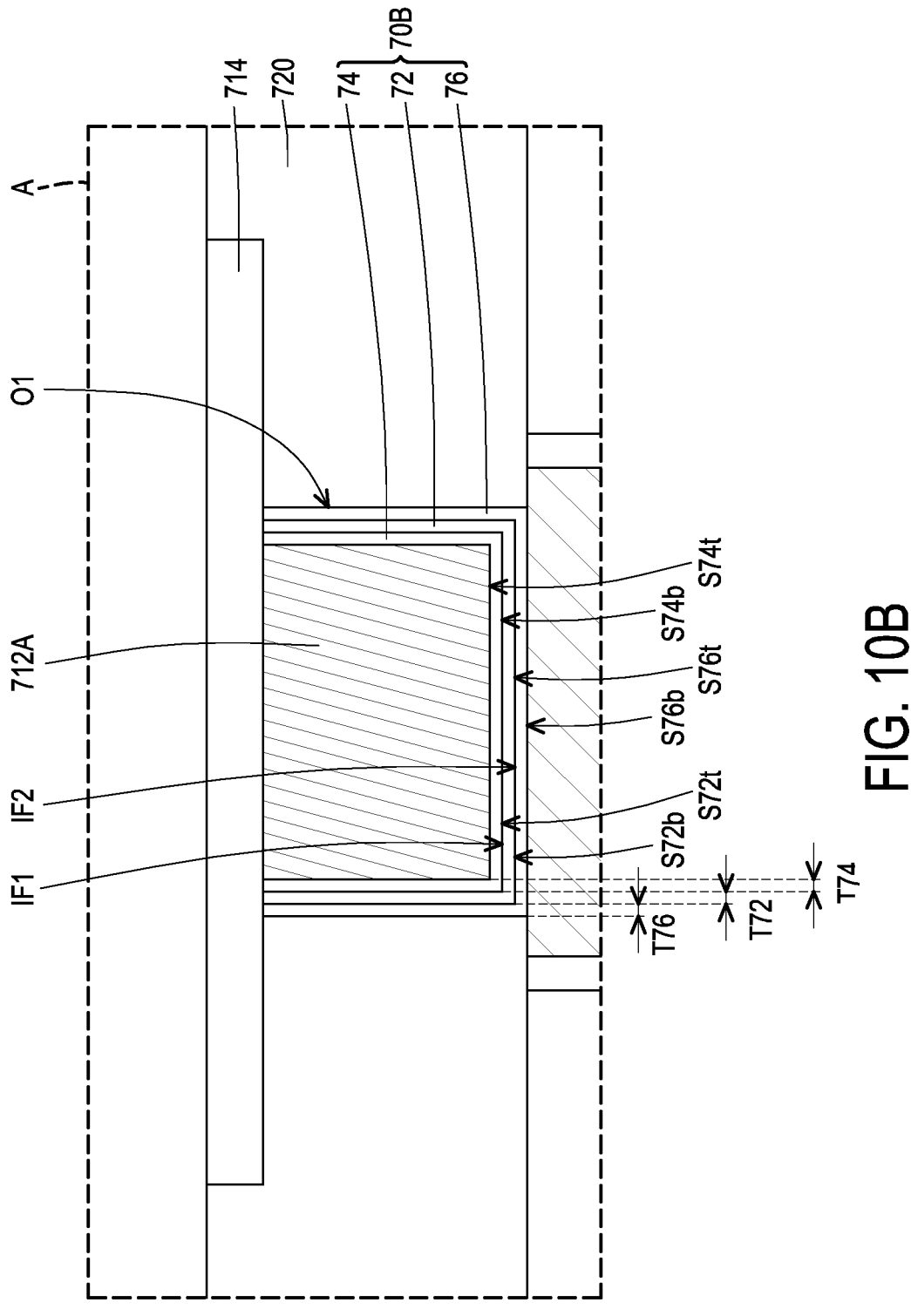
Figure 11A:
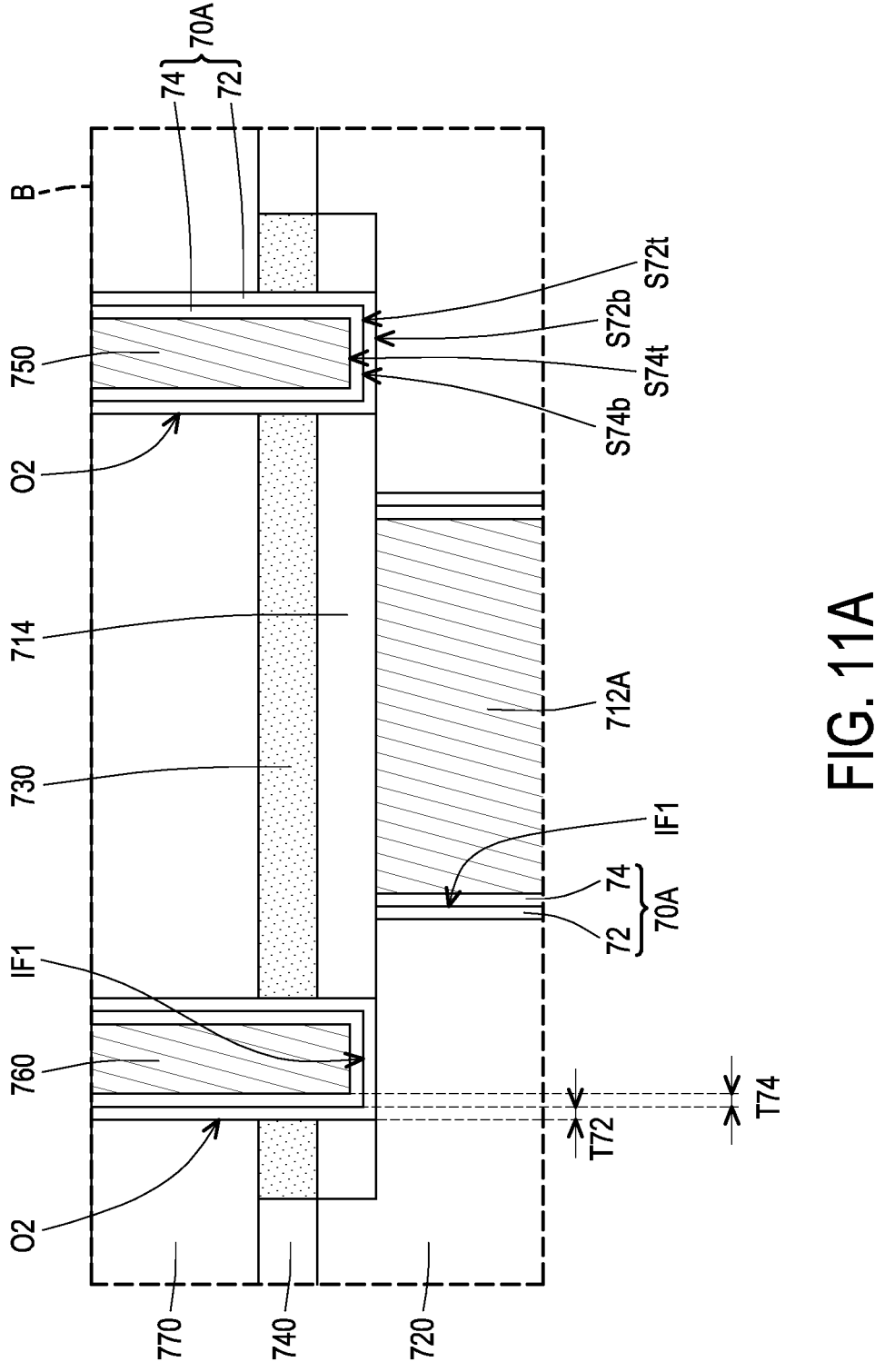
FIG. 11A and FIG. 11B are enlarged and schematic cross-sectional views respectively showing a part of a semiconductor device in accordance with some embodiments of the disclosure.
Figure 11B:
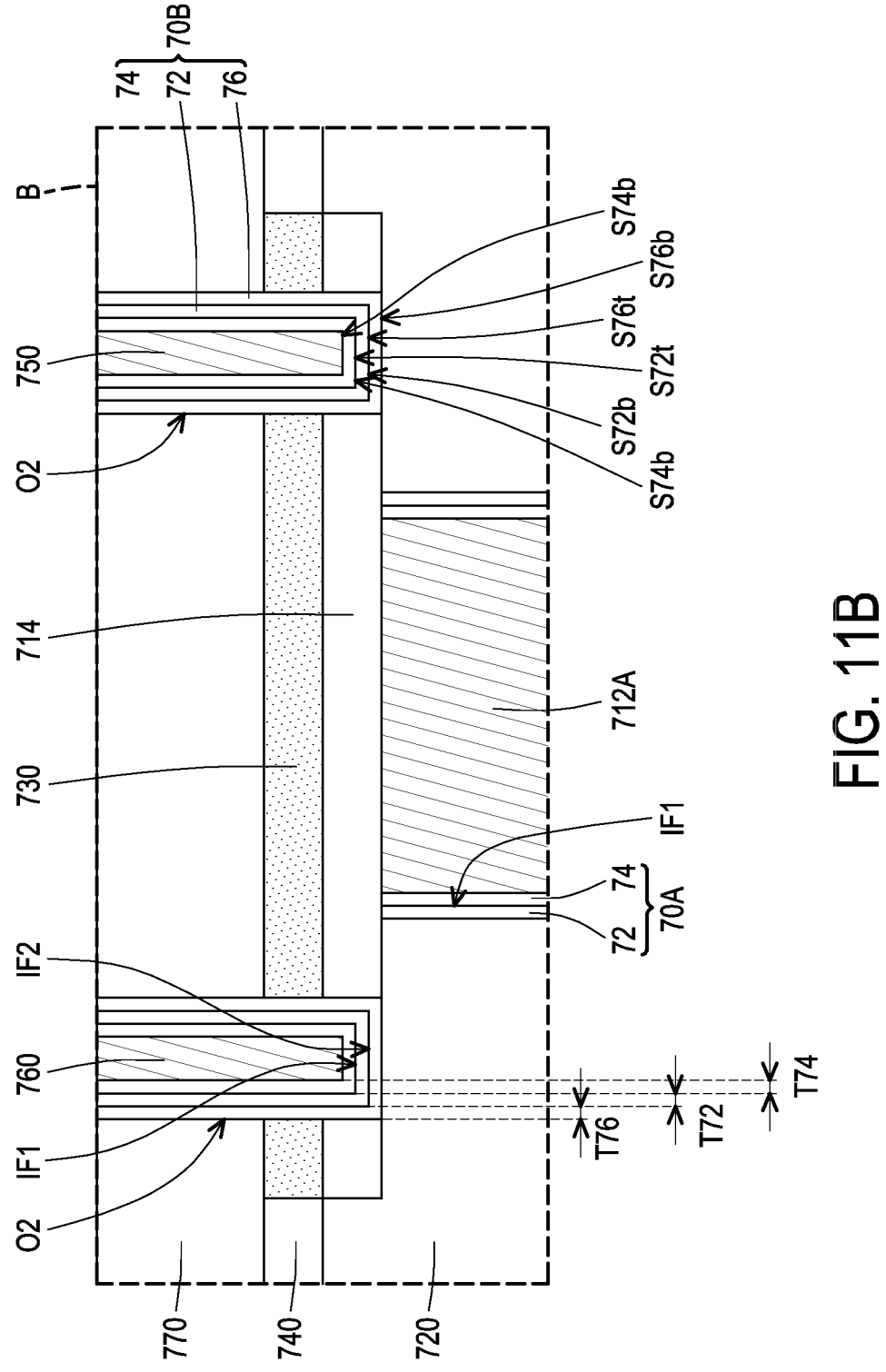
Figure 12A:
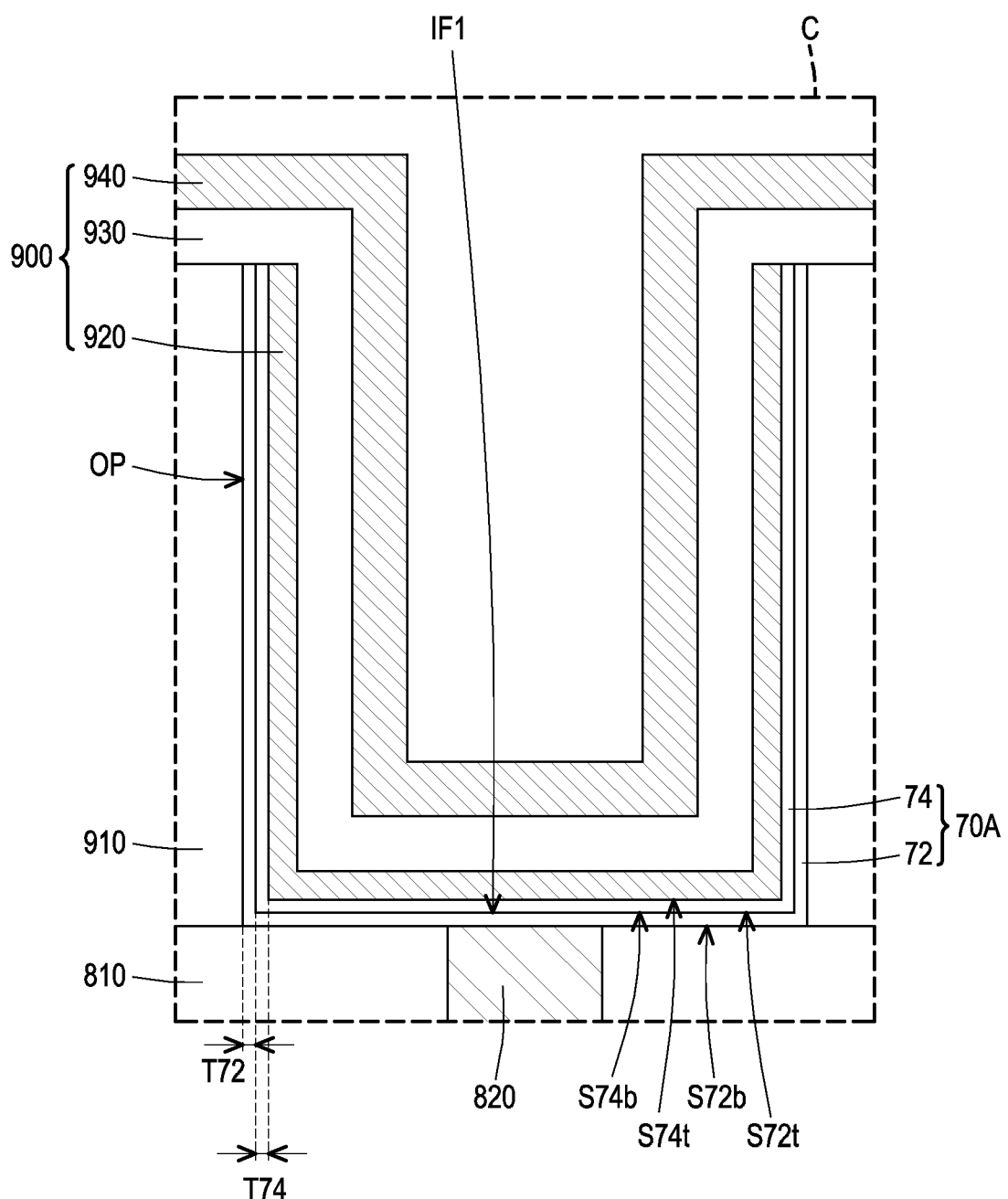
FIG. 12A and FIG. 12B are enlarged and schematic cross-sectional views respectively showing a part of a semiconductor device in accordance with some embodiments of the disclosure.
Figure 12B:
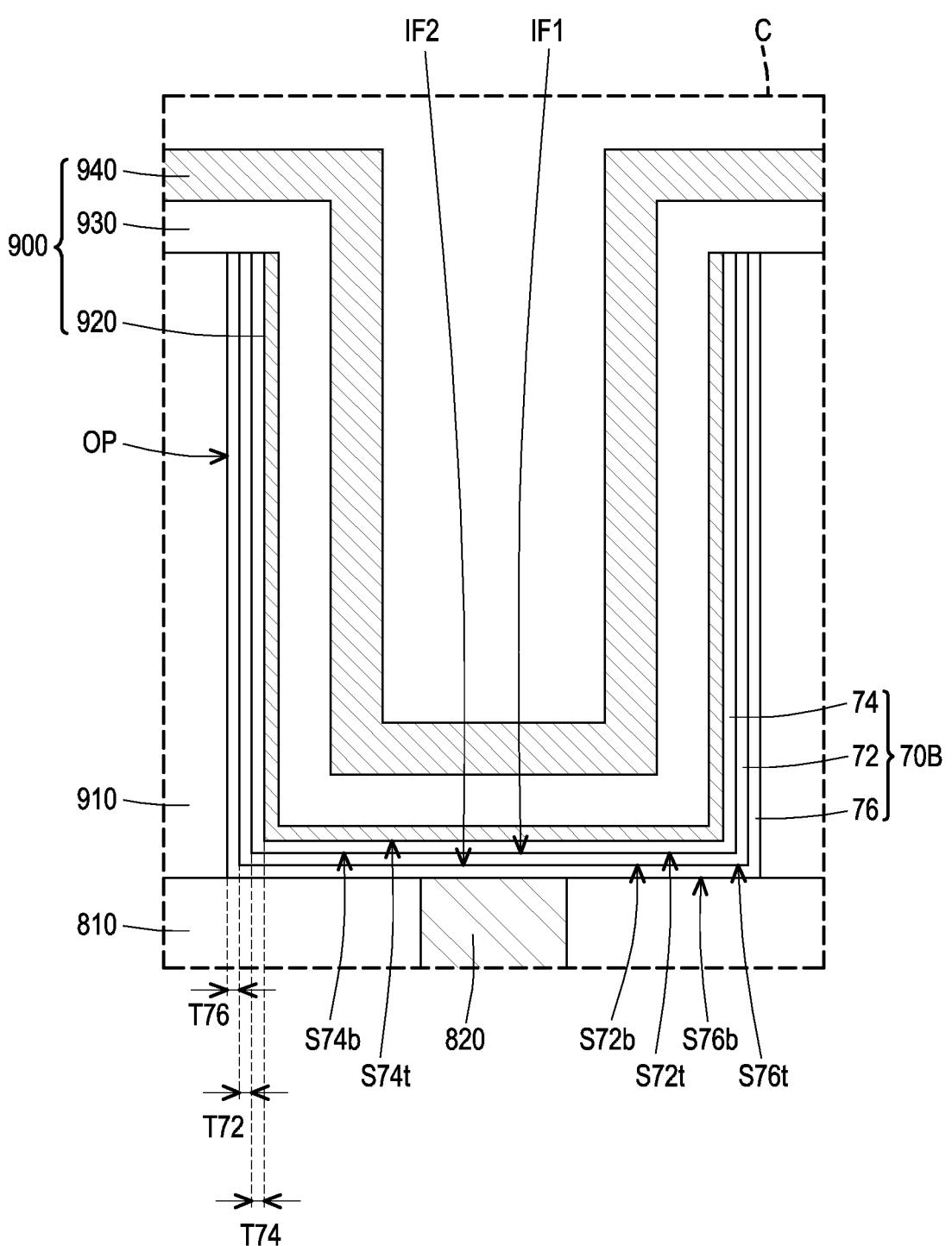
Figure 13:
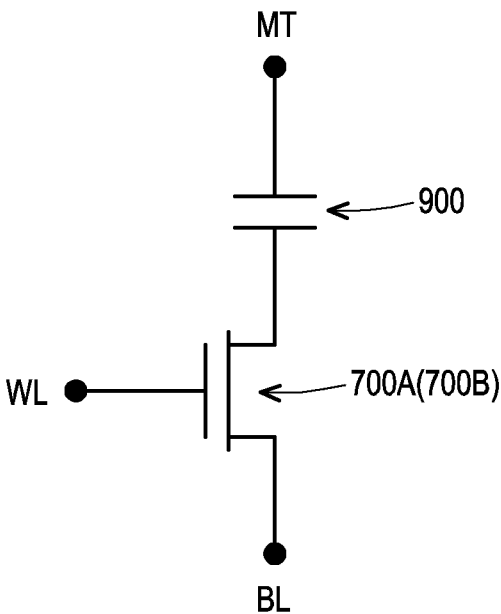
FIG. 13 is a schematic diagram illustrating a memory cell including a selector and a capacitor in an interconnect of a semiconductor device in accordance with some embodiments of the disclosure.

FIG. 1 to FIG. 9 are schematic cross-sectional views of various stages in a manufacturing method of a semiconductor device 1000 in accordance with some embodiments of the disclosure. FIG. 10A and FIG. 10B are enlarged and schematic cross-sectional views respectively showing a part of a semiconductor device in accordance with some embodiments of the disclosure, where the enlarged and schematic cross-sectional views of FIG. 10A and FIG. 10B are outlined in a dash-box A of FIG. 3. FIG. 11A and FIG. 11B are enlarged and schematic cross-sectional views respectively showing a part of a semiconductor device in accordance with some embodiments of the disclosure, where the enlarged and schematic cross-sectional views of FIG. 11A and FIG. 11B are outlined in a dash-box B of FIG. 5. FIG. 12A and FIG. 12B are enlarged and schematic cross-sectional views respectively showing a part of a semiconductor device in accordance with some embodiments of the disclosure, where the enlarged and schematic cross-sectional views of FIG. 12A and FIG. 12B are outlined in a dash-box C of FIG. 8. FIG. 13 is a schematic diagram illustrating a memory cell including a selector (e.g., 700A) and a capacitor (e.g., 900) in an interconnect (e.g., 100A) of a semiconductor device (e.g., 1000) in accordance with some embodiments of the disclosure. In some embodiments, the manufacturing method is part of a wafer level packaging process. It is understood that additional processes may be provided before, during, and after the illustrated method, and that some other processes may only be briefly described herein. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Referring to FIG. 1, in some embodiments, an initial structure is provided. For example, the initial structure includes a substrate 200 including a wide variety of devices (also referred to as semiconductor devices) formed in a semiconductor substrate 202 and a stack structure disposed on the substrate 200, as shown in FIG. 1. The devices may include active components, passive components, or a combination thereof. The devices may include integrated circuits devices. The devices may include transistors, capacitors, resistors, diodes, photodiodes, fuse devices, jumpers, inductors, or other similar devices. The functions of the devices may include memory, processors, sensors, amplifiers, power distribution, input/output circuitry, or the like.

In some embodiments, the semiconductor substrate 202 includes a bulk semiconductor substrate, a crystalline silicon substrate, a doped semiconductor substrate (e.g., p-type semiconductor substrate or n-type semiconductor substrate), a semiconductor-on-insulator (SOI) substrate, or the like. In certain embodiments, the semiconductor substrate 202 includes one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. The doped regions may be configured for an n-type metal-oxide-semiconductor (NMOS) transistor or a p-type MOS (PMOS) transistor. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. Other substrates, such as a multi-layered or gradient substrate may also be used. In some alternative embodiments, the semiconductor substrate 202 includes a semiconductor substrate made of other suitable elemental semiconductor, such as diamond or germanium; a suitable compound semiconductor, such as gallium arsenide, silicon carbide, gallium phosphide, indium phosphide, indium arsenide and indium antimonide, an alloy semiconductor such as SiGe, GaAsP, AlInAs, AlGaAs, GaInAs, GaInP and GaInAsP or combinations thereof. For example, the semiconductor substrate 202 is a silicon bulk substrate.

As shown in FIG. 1, the devices such as a transistor 30, a transistor 40, a transistor 50, and a transistor 60 may be formed in the semiconductor substrate 202. In some embodiments, a plurality of isolation structures 204 are formed in the semiconductor substrate 202 for separating the transistor 30, the transistor 40, the transistor 50, and the transistor 60. In certain embodiments, the isolation structures 204 are trench isolation structures. In other embodiments, the isolation structures 204 includes local oxidation of silicon (LOCOS) structures. In some embodiments, the insulator material of the isolation structures 204 includes silicon oxide, silicon nitride, silicon oxynitride, a spin-on dielectric material, or a low-k dielectric material. For example, the low-k dielectric material generally has a dielectric constant lower than 3.9. In one embodiment, the insulator material may be formed by chemical vapor deposition (CVD) such as high-density plasma CVD (HDP-CVD) and sub-atmospheric CVD (SACVD) or formed by spin-on. In certain embodiments, the devices (such as the transistor 30, the transistor 40, the transistor 50, and the transistor 60) and the isolation structures 204 are formed in the substrate 200 during the front-end-of-line (FEOL) processes. In one embodiment, the transistors 30, 40, 50 and 60 are formed following the complementary MOS (CMOS) processes. The number and configurations of the devices formed in the semiconductor substrate 202 should not be limited by the embodiments or drawings of this disclosure. That is, the number of the devices may be more than four. It is understood that the number and configurations of the devices may have different material or configurations depending on product designs.

The transistor 30, the transistor 40, the transistor 50, and the transistor 60 may be a PMOS transistor. For example, the transistor 30 includes a gate structure 310 and source/drain regions 320 located at two opposite sides of the gate structure 310, where the gate structure 310 is formed on an n-well region 330, and the source/drain regions 320 are formed in the n-well region 330. In one embodiment, the gate structure 310 includes a gate electrode 312, a gate dielectric layer 314 and a gate spacer 316. The gate dielectric layer 314 may spread between the gate electrode 312 and the semiconductor substrate 202, and may or may not further cover a sidewall of the gate electrode 312. The gate spacer 316 may laterally surround the gate electrode 312 and the gate dielectric layer 314. In one embodiment, the source/drain regions 320 include doped regions of p-type dopant that are formed in the n-well region 330 by ion implantation. In an alternative embodiment, the source/drain regions 320 include epitaxial structures formed in and protruding from a surface of the semiconductor substrate 202 that are formed by epitaxial growth.

For example, the transistor 40 includes a gate structure 410 and source/drain regions 420 located at two opposite sides of the gate structure 410, where the gate structure 410 is formed on an n-well region 430, and the source/drain regions 420 are formed in the n-well region 430. In one embodiment, the gate structure 410 includes a gate electrode 412, a gate dielectric layer 414 and a gate spacer 416. The gate dielectric layer 414 may spread between the gate electrode 412 and the semiconductor substrate 202, and may or may not further cover a sidewall of the gate electrode 412. The gate spacer 416 may laterally surround the gate electrode 412 and the gate dielectric layer 414. In one embodiment, the source/drain regions 420 include doped regions of p-type dopant that are formed in the n-well region 430 by ion implantation. In an alternative embodiment, the source/drain regions 420 include epitaxial structures formed in and protruding from a surface of the semiconductor substrate 202 that are formed by epitaxial growth.

For example, the transistor 50 includes a gate structure 510 and source/drain regions 520 located at two opposite sides of the gate structure 510, where the gate structure 510 is formed on an n-well region 530, and the source/drain regions 520 are formed in the n-well region 530. In one embodiment, the gate structure 510 includes a gate electrode 512, a gate dielectric layer 514 and a gate spacer 516. The gate dielectric layer 514 may spread between the gate electrode 512 and the semiconductor substrate 202, and may or may not further cover a sidewall of the gate electrode 512. The gate spacer 516 may laterally surround the gate electrode 512 and the gate dielectric layer 514. In one embodiment, the source/drain regions 520 include doped regions of p-type dopant that are formed in the n-well region 530 by ion implantation. In an alternative embodiment, the source/drain regions 520 include epitaxial structures formed in and protruding from a surface of the semiconductor substrate 202 that are formed by epitaxial growth.

For example, the transistor 60 includes a gate structure 610 and source/drain regions 620 located at two opposite sides of the gate structure 610, where the gate structure 610 is formed on an n-well region 630, and the source/drain regions 620 are formed in the n-well region 630. In one embodiment, the gate structure 610 includes a gate electrode 612, a gate dielectric layer 614 and a gate spacer 616. The gate dielectric layer 614 may spread between the gate electrode 612 and the semiconductor substrate 202, and may or may not further cover a sidewall of the gate electrode 612. The gate spacer 616 may laterally surround the gate electrode 612 and the gate dielectric layer 614. In one embodiment, the source/drain regions 620 include doped regions of p-type dopant that are formed in the n-well region 630 by ion implantation. In an alternative embodiment, the source/drain regions 620 include epitaxial structures formed in and protruding from a surface of the semiconductor substrate 202 that are formed by epitaxial growth.

Alternatively, the transistor 30, the transistor 40, and the transistor 50, and the transistor 60 may be a NMOS transistor. For example, the transistor 30 includes a gate structure 310 and source/drain regions 320 located at two opposite sides of the gate structure 310, where the gate structure 310 is formed on an p-well region 330, and the source/drain regions 320 are formed in the p-well region 330. In one embodiment, the gate structure 310 includes a gate electrode 312, a gate dielectric layer 314 and a gate spacer 316. The gate dielectric layer 314 may spread between the gate electrode 312 and the semiconductor substrate 202, and may or may not further cover a sidewall of the gate electrode 312. The gate spacer 316 may laterally surround the gate electrode 312 and the gate dielectric layer 314. In one embodiment, the source/drain regions 320 include doped regions of n-type dopant that are formed in the p-well region 330 by ion implantation. In an alternative embodiment, the source/drain regions 320 include epitaxial structures formed in and protruding from a surface of the semiconductor substrate 202 that are formed by epitaxial growth.

For example, the transistor 40 includes a gate structure 410 and source/drain regions 420 located at two opposite sides of the gate structure 410, where the gate structure 410 is formed on an p-well region 430, and the source/drain regions 420 are formed in the p-well region 430. In one embodiment, the gate structure 410 includes a gate electrode 412, a gate dielectric layer 414 and a gate spacer 416. The gate dielectric layer 414 may spread between the gate electrode 412 and the semiconductor substrate 202, and may or may not further cover a sidewall of the gate electrode 412. The gate spacer 416 may laterally surround the gate electrode 412 and the gate dielectric layer 414. In one embodiment, the source/drain regions 420 include doped regions of n-type dopant that are formed in the p-well region 430 by ion implantation. In an alternative embodiment, the source/drain regions 420 include epitaxial structures formed in and protruding from a surface of the semiconductor substrate 202 that are formed by epitaxial growth.

For example, the transistor 50 includes a gate structure 510 and source/drain regions 520 located at two opposite sides of the gate structure 510, where the gate structure 510 is formed on an p-well region 530, and the source/drain regions 520 are formed in the p-well region 530. In one embodiment, the gate structure 510 includes a gate electrode 512, a gate dielectric layer 514 and a gate spacer 516. The gate dielectric layer 514 may spread between the gate electrode 512 and the semiconductor substrate 202, and may or may not further cover a sidewall of the gate electrode 512. The gate spacer 516 may laterally surround the gate electrode 512 and the gate dielectric layer 514. In one embodiment, the source/drain regions 520 include doped regions of n-type dopant that are formed in the p-well region 530 by ion implantation. In an alternative embodiment, the source/drain regions 520 include epitaxial structures formed in and protruding from a surface of the semiconductor substrate 202 that are formed by epitaxial growth.

For example, the transistor 60 includes a gate structure 610 and source/drain regions 620 located at two opposite sides of the gate structure 610, where the gate structure 610 is formed on an p-well region 630, and the source/drain regions 620 are formed in the p-well region 630. In one embodiment, the gate structure 610 includes a gate electrode 612, a gate dielectric layer 614 and a gate spacer 616. The gate dielectric layer 614 may spread between the gate electrode 612 and the semiconductor substrate 202, and may or may not further cover a sidewall of the gate electrode 612. The gate spacer 616 may laterally surround the gate electrode 612 and the gate dielectric layer 614. In one embodiment, the source/drain regions 620 include doped regions of n-type dopant that are formed in the p-well region 630 by ion implantation. In an alternative embodiment, the source/drain regions 620 include epitaxial structures formed in and protruding from a surface of the semiconductor substrate 202 that are formed by epitaxial growth.

In further alternative embodiments, one of the transistors 30, 40, 50 and 60 may have a type being different from the types of the rest of the transistors 30, 40, 50 and 60. The disclosure is not limited thereto. In one non-limiting example, the transistors 30, 40 and 50 are PMOS transistors, and the transistor 60 is a NMOS transistor; or vice versa. In another non-limiting example, the transistors 30, 40 and 60 are PMOS transistors, and the transistor 50 is a NMOS transistor; or vice versa. In another non-limiting example, the transistors 30, 50 and 60 are PMOS transistors, and the transistor 40 is a NMOS transistor; or vice versa. In another non-limiting example, the transistors 40, 50 and 60 are PMOS transistors, and the transistor 30 is a NMOS transistor; or vice versa. Or, alternatively, two of the transistors are PMOS transistors, and other two of the transistors are a NMOS transistor; or vice versa.

As illustrated in FIG. 1, for example, the substrate 200 further includes a dielectric layer 206 stacked on the semiconductor substrate 202 and a plurality of contact plugs 208 penetrating through the dielectric layer 206 to electrically connect to the transistors 30, 40, 50, and 60. In certain embodiments, the dielectric layer 206 and the contact plugs 208 are also formed in the structure 200 during the FEOL processes. The dielectric layer 206 may laterally surround the gate structures 310, 410, 510 and 610 and cover the source/drain regions 320, 420, 520 and 620 for providing protections to the devices formed in/on the semiconductor substrate 202. Some of the contact plugs 208 may penetrate through the dielectric layer 206 in order to establish electrical connection with the source/drain regions 320, 420, 520 and 620, while others of the contact plugs 208 (not shown) may penetrate through the dielectric layer 206 to establish electrical connection with the gate electrodes (e.g. the gate electrodes 312, 412, 512 and 612) of the gate structures 310, 410, 510 and 610, in order to provide terminals for electrical connections to later-formed components (e.g. an interconnect or interconnect structure) or external components.

The dielectric layer 206 may be referred to as an interlayer dielectric (ILD) layer, while the contact plugs 208 may be referred to as metal contacts or metallic contacts. For example, the contact plugs 208 electrically connected to the source/drain regions 320, 420, 520 and 620 are referred to as source/drain contacts, and the contact plugs 208 electrically connected to the gate electrodes 312, 412, 512 and 612 are referred to as gate contacts. In some embodiments, the contact plugs 208 may include copper (Cu), copper alloys, nickel (Ni), aluminum (Al), manganese (Mn), magnesium (Mg), silver (Ag), gold (Au), tungsten (W), a combination of thereof, or the like. The contact plugs 208 may be formed by, for example, plating such as electroplating or electroless plating, CVD such as plasma enhanced CVD (PECVD), atomic layer deposition (ALD), and physical vapor deposition (PVD), a combination thereof, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the dielectric layer 206 includes silicon oxide, silicon nitride, silicon carbide, silicon oxynitride, silicon carbonitride, silicon carbide oxynitride, spin-on glass (SOG), phosphosilicate glass (PSG), borosilicate glass (BSG), borophosphosilicate glass (BPSG), fluorinated silica glass (FSG), carbon doped silicon oxide (e.g., SiCOH), polyimide, and/or a combination thereof. In alternative embodiments, the dielectric layer 206 include low-k dielectric materials. For example, the low-k dielectric material generally has a dielectric constant lower than 3.9. Examples of low-k dielectric materials may include BLACK DIA- MOND® (Applied Materials of Santa Clara, Calif.), Xerogel, Acrogel, amorphous fluorinated carbon, Parylene, benzocyclobutene (BCB), Flare, SILK® (Dow Chemical, Midland, Mich.), hydrogen silsesquioxane (HSQ) or fluorinated silicon oxide (SiOF), and/or a combination thereof. It is understood that the dielectric layer 206 may include one or more dielectric materials. For example, the dielectric layer 206 include a single-layer structure or a multilayer structure. In some embodiments, the dielectric layer 206 is formed to a suitable thickness by CVD such as flowable chemical vapor deposition (FCVD), HDP-CVD, and SACVD, spin-on, sputtering, or other suitable methods.

A seed layer (not shown) may be optionally formed between the dielectric layer 206 and the contact plugs 208. That is, for example, the seed layer covers a bottom surface and sidewalls of each of the contact plugs 208. In some embodiments, the seed layer is a metal layer, which may be a single layer or a composite layer comprising a plurality of sub-layers formed of different materials. In some embodiments, the seed layer includes copper layer and the seed layer includes a titanium layer and a copper layer over the titanium layer. The seed layer is formed using, for example, PVD or the like. In one embodiment, the seed layer may be omitted.

In addition, an additional barrier layer or adhesive layer (not shown) may be optionally formed between the contact plugs 208 and the dielectric layer 206. Owing to the additional barrier layer or adhesive layer, it is able to prevent the seed layer and/or the contact plugs 208 from diffusing to the underlying layers and/or the surrounding layers. The additional barrier layer or adhesive layer may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer is interposed between the dielectric layer 206 and the seed layer, and the seed layer is interposed between the contact plugs 208 and the additional barrier layer or adhesive layer. In one embodiment, the additional barrier layer or adhesive layer may be omitted.

Figure 9:
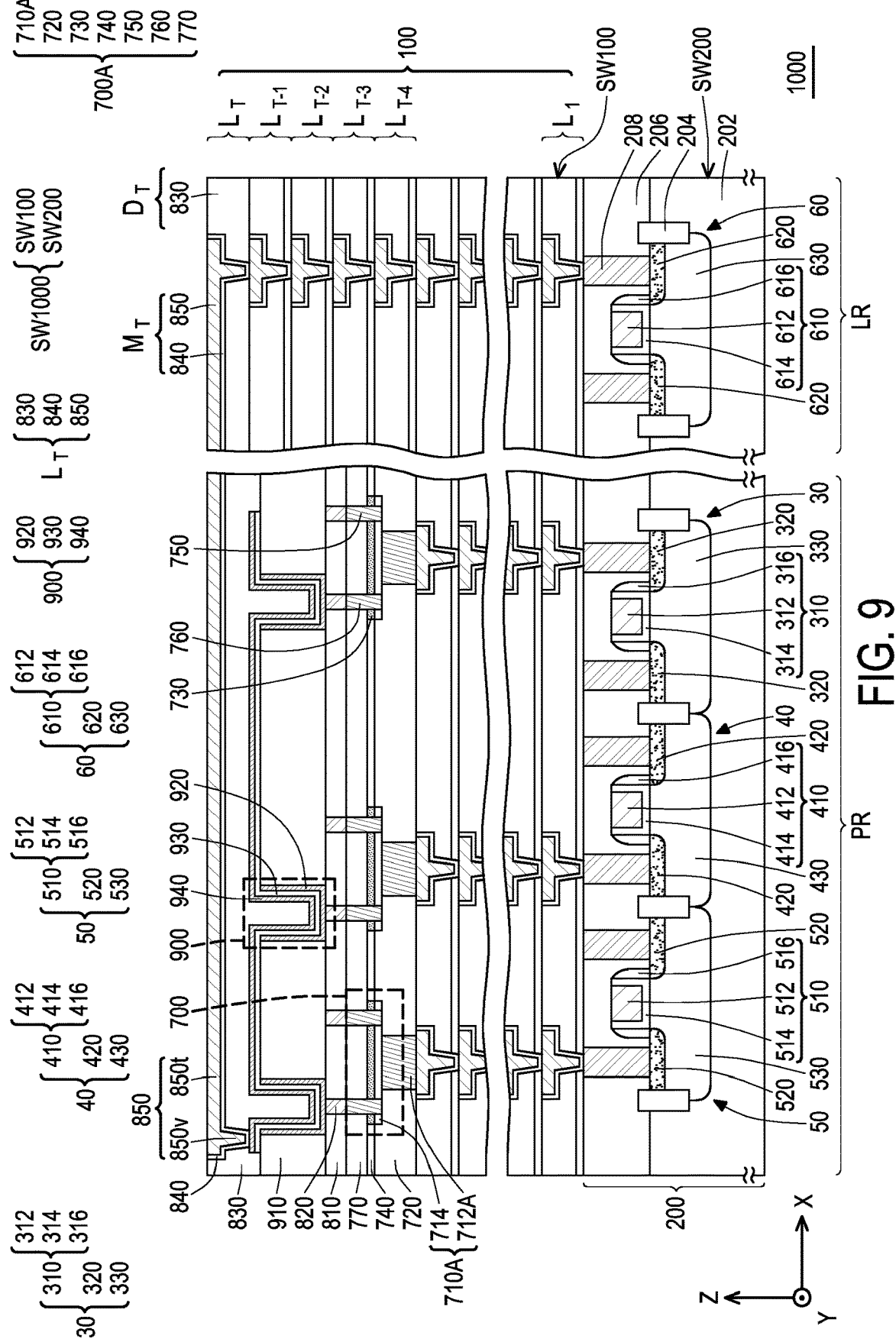

In some embodiments, at least one build-up layer of an interconnect 100 (depicted in FIG. 9, with a stacked structure having a plurality of build-up layers (e.g., three or more than three build-up layers)) is formed on the substrate 200. In some embodiments, the at least one build-up layer formed in the initial structure of FIG. 1 includes one build-up layer (e.g., a build-up layer $L_1$) as shown in FIG. 1 for illustrative purposes; however, the number of the at least one build-up layer formed in the initial structure of FIG. 1 may be two, three or more than three, depending on the demand and design requirement. As illustrated in FIG. 1, for example, the build-up layer $L_1$ is disposed over and electrically coupled to the devices such as the transistors 30, 40, 50, and 60 through the contact plugs 208 for providing routing function thereto. In some embodiments, the build-up layer $L_1$ is disposed on (e.g., in physical contact with) the dielectric layer 206 over the semiconductor substrate 202, and is physical contacted and electrically connected to the contact plugs 208 formed in the dielectric layer 206. The build-up layer $L_1$ may be referred to as a first build-up layer $L_1$ of the interconnect 100. In such case, the build-up layer $L_1$ is globally disposed on the substrate 200 for providing routing function to the transistors 30, 40, 50, and 60 in the substrate 200.

The formation of the build-up layer $L_1$ of the stacked structure of the interconnect 100 may include, but not limited to, forming a blanket layer of a first dielectric material (not shown) over the substrate 200 to cover up the devices such as the transistors 30, 40, 50, and 60 and the contact plugs 208; forming a blanket layer of a second dielectric material (not shown) over the first dielectric material blanket layer so to sandwich the first dielectric material blanket layer between the second dielectric material blanket layer and the substrate 200; patterning the first dielectric material blanket layer and the second dielectric material blanket layer to form a first dielectric layer 110$_1$ and a second dielectric layer 120$_1$ disposed thereon, where a plurality of openings $OP_1$ penetrate through the first dielectric layer 110$_1$ and the second dielectric layer 120$_1$; forming a seed layer 130$_1$ in the openings $OP_1$; and forming a conductive material in the opening $OP_1$ to form a conductive layer 140$_1$ over the seed layer 130$_1$ so to form a metallization layer $ML_1$ in the openings $OP_1$, thereby forming the build-up layer $L_1$. For example, as shown in FIG. 1, the metallization layer $ML_1$ of the build-up layer $L_1$ includes the seed layer 130$_1$ and the conductive layer 140$_1$ standing thereon and electrically connected thereto, and is embedded in a dielectric structure $DL_1$ of the build-up layer $L_1$, where the dielectric structure $DL_1$ includes the first dielectric layer 110$_1$ and the second dielectric layer 120$_1$ stacked thereon. As shown in FIG. 1, for example, the conductive layer 140$_1$ is electrically coupled to the transistors 30, 40, 50, and 60 through direct contacts between the seed layer 130$_1$ and the conductive plugs 208.

In some embodiments, the first dielectric layer 110$_1$ and the second dielectric layer 120$_1$ have different materials. For example, the first dielectric layer 110$_1$ includes a silicon carbide (SiC) layer, a silicon nitride ($Si_3N_4$) layer, an aluminum oxide layer, or the like. For example, the second dielectric layer 120$_1$ includes a silicon-rich oxide (SRO) layer. In some embodiments, the second dielectric layer 120$_1$ is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. In some alternative embodiments, the first dielectric layer 110$_1$ and the second dielectric layer 120$_1$ have different etching selectivities. In the case, the first dielectric layer 110$_1$ may be referred to as an etching stop layer to prevent the underlying elements (e.g., the contact plugs 208 and the dielectric layer 206) from damage caused by the over-etching.

In some embodiments, the first dielectric material blanket layer and the second dielectric material blanket layer are patterned through a set(s) of photolithography and etching processes. The etching process may include a dry etching, a wet etching, or a combination thereof. After the etching process, a cleaning step may be optionally performed, for example, to clean and remove the residue generated from the etching process. However, the disclosure is not limited thereto, and the etching process may be performed through any other suitable method. The openings $OP_1$ each may include a trench hole $OT_1$ and a via hole $OV_1$ underlying and spatially communicated to the trench hole $OT_1$. For example, the trench holes $OT_1$ are formed in the second dielectric layer 120$_1$ and extend from an illustrated top surface of the second dielectric layer 120$_1$ to a position inside the second dielectric layer 120$_1$. For example, the via holes $OV_1$ are formed in the second dielectric layer 120$_1$ and the first dielectric layer 110$_1$ and extend from the position inside the second dielectric layer 120$_1$ to an illustrated bottom surface of the first dielectric layer 110$_1$. The position may be about ½ to about ⅓ of a thickness of the second dielectric layer 120$_1$; however, the disclosure is not limited thereto. In some embodiments, the openings $OP_1$ includes a dual damascene structure. The formation of the openings $OP_1$ is not limited to the disclosure. The formation of opening $OP_1$ (with the dual damascene structure) can be formed by any suitable forming process, such as a via first approach or a trench first approach.

As shown in FIG. 1, a lateral size of the trench holes $OT_1$ may be greater than a lateral size of the via holes $OV_1$. In some embodiments, a sidewall of each of the via holes $OV_1$ is a slant sidewall. In alternative embodiments, the sidewall of each of the via holes $OV_1$ is a vertical sidewall. In some embodiments, a sidewall of each of the trench holes $OT_1$ is a vertical sidewall. In alternative embodiments, the sidewall of each of the trench holes $OT_1$ is a slant sidewall. The sidewall of one via hole $OV_1$ and the sidewall of a respective one trench hole $OT_1$ may be collectively referred to as a sidewall of one opening $OP_1$. For illustrative purposes, the number of the openings $OP_1$ shown in FIG. 1 does not limit the disclosure, and may be designated and selected based on the demand and layout design. As illustrated in FIG. 1, portions of the metallization layer $ML_1$ formed in the trench holes $OT_1$ may be referred to as conductive lines, conductive traces or conductive wires $T_1$ horizontally extended (e.g., extending in a direction X and/or a direction Y), and portions of the metallization layer $ML_1$ formed in the via holes $OV_1$ may be referred to as conductive vias Vi vertically extended (e.g., extending in a direction Z). The directions X, Y and Z may be different from each other. For example, as shown in FIG. 1, the directions X, Y and Z are substantially perpendicular to each other. The direction Z may be referred to as a stacking direction Z of the interconnect 100 and the substrate 200.

In some embodiments, the seed layer 130$_1$ and the conductive layer 140$_1$ are sequentially formed in the openings $OP_1$ by, but not limited to, conformally forming a blanket layer made of metal or metal alloy materials over the dielectric structure $DL_1$ and extending into the openings $OP_1$, so to line the sidewalls of the openings $OP_1$; filling the conductive material in the openings $OP_1$; and removing excess amount of the blanket layer made of metal or metal alloy materials and the conductive material over the illustrated top surface of the second dielectric layer 120$_1$, thereby the metallization layer $ML_1$ including the seed layer 130$_1$ and the conductive layer 140$_1$ is manufactured. The removal may be performed by a planarizing process such as a mechanical grinding, a chemical mechanical polishing (CMP), and/or an etching process. After the planarizing process, a cleaning process may be optionally performed, for example, to clean and remove the residue generated from the planarizing process. However, the disclosure is not limited thereto, and the planarizing process may be performed through any other suitable method. Herein, when a layer is described as conformal or conformally formed, it indicates that the layer has a substantially equal thickness extending along the region on which the layer is formed.

In some embodiments, the seed layer 130$_1$ is referred to as a metal layer, which can be a single layer or a composite layer including a plurality of sub-layers formed of different materials. In some embodiments, the seed layer 130$_1$ includes titanium, copper, molybdenum, tungsten, titanium nitride, titanium tungsten, combinations thereof, or the like. For example, the seed layer 130$_1$ may include a titanium layer and a copper layer over the titanium layer. The seed layer 130$_1$ may be formed using, for example, sputtering, PVD, or the like. The seed layer 130$_1$ may have a thickness (as measured in the direction Z) of about 0.5 nm to about 100 nm, although other suitable thickness may alternatively be utilized.

In some embodiments, a material of the conductive material for forming the conductive layer $140_1$ includes a suitable conductive material, such as metal and/or metal alloy. For example, the conductive material can be Al, aluminum alloys, Cu, copper alloys, or combinations thereof (e.g., AlCu), the like, or combinations thereof. In some embodiments, the conductive material is formed by plating process or any other suitable method, which the plating process may include electroplating or electroless plating, or the like. In alternative embodiments, the conductive material may be formed by deposition. The disclosure is not limited thereto. In the case, an illustrated top surface of the metallization layer $ML_1$ is substantially level with an illustrated top surface of the dielectric structure $DL_1$. That is, the illustrated top surface of the metallization layer $ML_1$ is substantially coplanar to the illustrated top surface of the dielectric structure $DL_1$.

In some embodiments, the initial structure provided in FIG. 1 includes several regions, such as a region PR (e.g., a peripheral region or a memory region), a region LR (e.g., an active region or a logic region), and other regions (not shown) (if any). For example, the region LR is surrounded by the region PR. In an non-limiting example, the region LR is completely enclosed by the region PR on a X-Y plane, in a vertical projection along the direction Z. In the alternative embodiments of which other regions (not shown) are presented, the region LR is completely enclosed by one or more of the other regions and/or next to the one or more of the other regions, where the region PR completely encloses the region LR and the other regions on the X-Y plane, in the vertical projection along the direction Z.

Figure 2:
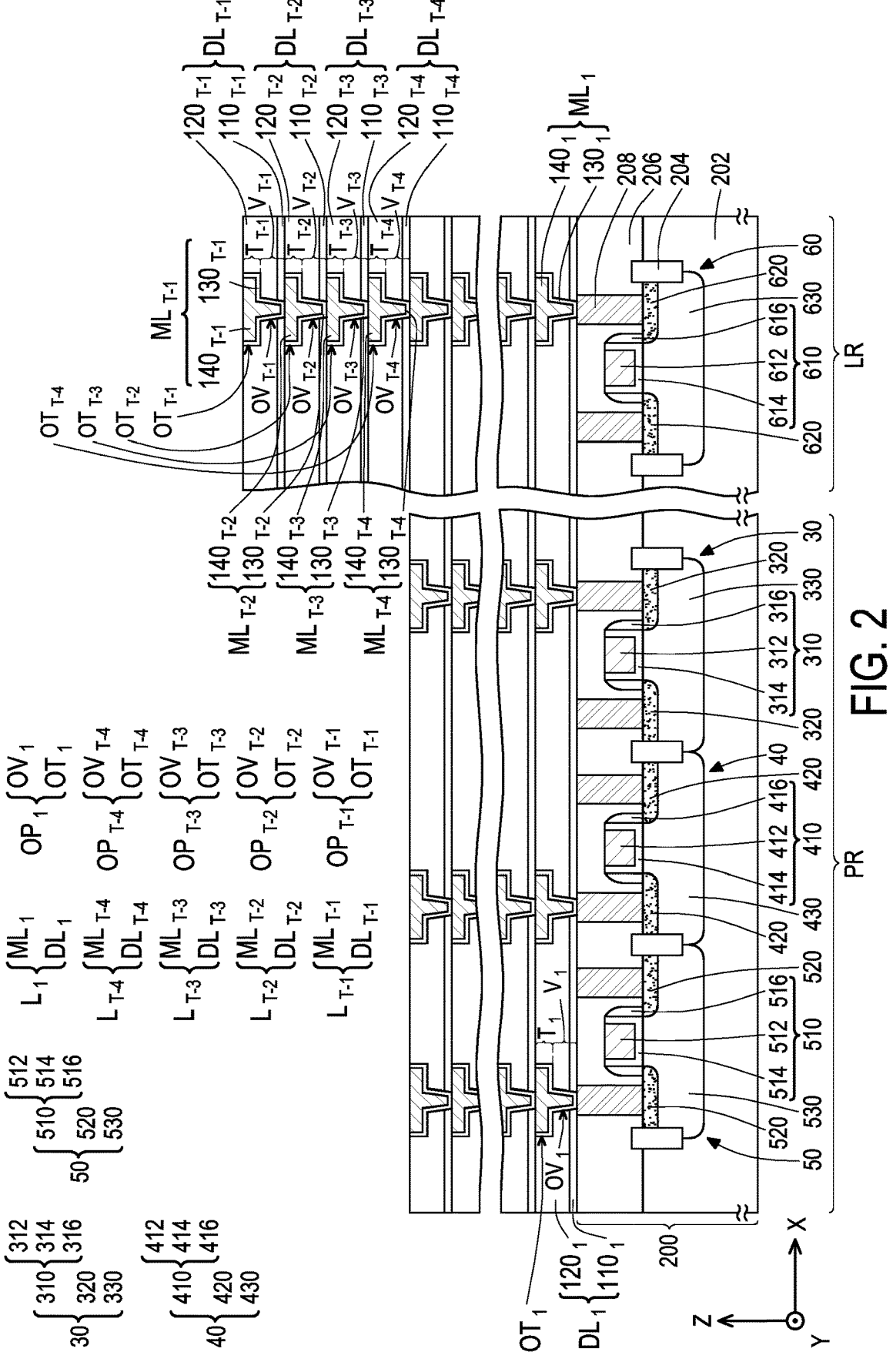

Referring to FIG. 2, in some embodiments, at least another one build-up layer of the interconnect 100 (depicted in FIG. 9, with the stacked structure having the plurality of build-up layers (e.g., three or more than three build-up layers)) is formed over the build-up layer $L_1$ included in the initial structure depicted in FIG. 1 within the region LR. For example, the at least another one build-up layer formed within the region LR includes four build-up layers (e.g., build-up layers $L_{T-4}$, $L_{T-3}$, $L_{T-2}$, and $L_{T-1}$) as shown in FIG. 2 for illustrative purposes; however, the disclosure is not limited thereto. The number of the at least another one build-up layer formed in within the region LR depicted in FIG. 2 may be one, two, three or more than three, depending on the demand and design requirement.

In addition, prior to forming the at least another one build-up layer of the interconnect 100 formed within the region LR, an additional build-up layer (not label, which is optional) of the interconnect 100 may be globally formed on and electrically coupled to the build-up layer $L_1$ for further providing routing function to the transistors 30, 40, 50, and 60 if need (based on the demand and design layout/requirement), where the formation, material, and configuration of each component of the additional build-up layer are similar to or substantially identical to the forming process, material, and configuration of each component of the build-up layer $L_1$ as aforementioned above, and thus are not repeated herein for brevity. That is, in one non-limiting example, there is no additional build-up layer in the interconnect 100. On the other hand, in another non-limiting example, the number of the additional build-up layer included in the interconnect 100 is one, where the build-up layer $L_1$ is sandwiched between and electrically coupled to the additional build-up and the substrate 200, and the additional build-up layer is electrically coupled to the devices (such as the transistors 30-60) through the contact plugs 208 and the build-up layer $L_1$. Or, in another non-limiting example, there are a plurality (e.g., more two or more than two) of additional build-up layers included in the interconnect 100, where these additional build-up layers are sequentially formed over the build-up layer $L_1$, and are electrically coupled to each other and to the devices (such as the transistors 30-60) through the contact plugs 208 and the build-up layer $L_1$. In FIG. 2, detailed drawings of these additional build-up layers are then omitted from the drawings for simplicity.

Continued on FIG. 2, in some embodiments, the build-up layer $L_{T-4}$ is disposed over and electrically coupled to the build-up layer $L_1$ (e.g. through the additional build-up layers formed there-between, if any) within the region LR, and thus is electrically coupled to the devices formed in the region LR (such as the transistor 60) through the contact plugs 208 and the build-up layer $L_1$ for providing routing function thereto. In the case, the build-up layer $L_{T-3}$ is disposed on (e.g., in physical contact with) and electrically connected to the build-up layer $L_{T-4}$, and thus is electrically coupled to the devices formed in the region LR (such as the transistor 60) through the contact plugs 208 and the build-up layers $L_1$ to $L_{T-4}$ for providing routing function thereto. The build-up layer $L_{T-2}$ is disposed on (e.g., in physical contact with) and electrically connected to the build-up layer $L_{T-3}$, and thus is electrically coupled to the devices formed in the region LR (such as the transistor 60) through the contact plugs 208 and the build-up layers $L_1$ to $L_{T-3}$ for providing routing function thereto. The build-up layer $L_{T-1}$ is disposed on (e.g., in physical contact with) and electrically connected to the build-up layer $L_{T-2}$, and thus is electrically coupled to the devices formed in the region LR (such as the transistor 60) through the contact plugs 208 and the build-up layers $L_1$ to $L_{T-2}$ for providing routing function thereto.

For example, as shown in FIG. 2, the build-up layer $L_{T-4}$ is between the build-up layer $L_{T-3}$ and the build-up layer $L_1$, the build-up layer $L_{T-3}$ is sandwiched between the build-up layer $L_{T-2}$ and the build-up layer $L_{T-4}$, and the build-up layer $L_{T-2}$ is sandwiched between the build-up layer $L_{T-1}$ and the build-up layer $L_{T-3}$. The build-up layers $L_1$ through $L_{T-1}$ are electrically coupled to each other, in some embodiments. The formation, material, and configuration of components of each of the build-up layer $L_{T-4}$, the build-up layer $L_{T-3}$, the build-up layer $L_{T-2}$, and the build-up layer $L_{T-1}$ are similar to or substantially identical to the forming process, material, and configuration of the components of the build-up layer $L_1$ as aforementioned above in FIG. 1 (except that the build-up layer $L_{T-4}$ to the build-up layer $L_{T-1}$ are not globally formed over the substrate 200), and thus are not repeated herein for brevity.

Continued on FIG. 2, for example, the build-up layer $L_{T-4}$ includes a dielectric structure $DL_{T-4}$ and a metallization layer $ML_{T-4}$ disposed therein. The dielectric structure $DL_{T-4}$ may include a first dielectric layer $110_{T-4}$ and a second dielectric layer $120_{T-4}$ disposed thereon, where the dielectric structure $DL_{T-4}$ may be penetrated by a plurality of opening $OP_{T-4}$. In the case, the metallization layer $ML_{T-4}$ is disposed inside the openings $OP_{T-4}$, where the metallization layer $ML_{T-4}$ includes a seed layer $130_{T-4}$ and a conductive layer $140_{T-4}$ disposed thereon, the seed layer $130_{T-4}$ lines sidewalls of the openings $OP_{T-4}$, and the conductive layer $140_{T-4}$ directly stacked on the seed layer $130_{T-4}$. The conductive layer $140_{T-4}$ of the metallization layer $ML_{T-4}$ is electrically coupled to the conductive layer $140_1$ of the metallization layer $ML_1$ through the seed layer $130_{T-4}$, for example. The openings $OP_{T-4}$ each may include a trench hole $OT_{T-4}$ and a via hole $OV_{T-4}$ underlying and spatially communicated to the trench hole $OT_{T-4}$. For example, the trench holes $_{T-4}$ are formed in the second dielectric layer $120_{T-4}$ and extend from an illustrated top surface of the second dielectric layer $120_{T-4}$ to a position inside the second dielectric layer $120_{T-4}$. For example, the via holes $OV_{T-4}$ are formed in the second dielectric layer $120_{T-4}$ and the first dielectric layer $110_{T-4}$ and extend from the position inside the second dielectric layer $120_{T-4}$ to an illustrated bottom surface of the first dielectric layer $110_{T-4}$. The position may be about ½ to about ⅓ of a thickness of the second dielectric layer $120_{T-4}$; however, the disclosure is not limited thereto. As illustrated in FIG. 2, portions of the metallization layer $ML_{T-4}$ formed in the trench holes $OT_{T-4}$ may be referred to as conductive lines, conductive traces or conductive wires $T_{T-4}$ horizontally extended (e.g., extending in the direction X and/or the direction Y), and portions of the metallization layer $ML_{T-4}$ formed in the via holes $OV_{T-4}$ may be referred to as conductive vias $V_{T-4}$ vertically extended (e.g., extending in the direction Z). In the case, an illustrated top surface of the metallization layer $ML_{T-4}$ is substantially level with an illustrated top surface of the dielectric structure $DL_{T-4}$. That is, the illustrated top surface of the metallization layer $ML_{T-4}$ is substantially coplanar to the illustrated top surface of the dielectric structure $DL_{T-4}$.

In some embodiments, the build-up layer $L_{T-3}$ includes a dielectric structure $DL_{T-3}$ and a metallization layer $ML_{T-3}$ disposed therein. The dielectric structure $DL_{T-3}$ may include a first dielectric layer $110_{T-3}$ and a second dielectric layer $120_{T-3}$ disposed thereon, where the dielectric structure $DL_{T-3}$ may be penetrated by a plurality of opening $OP_{T-3}$. In the case, the metallization layer $ML_{T-3}$ is disposed inside the openings $OP_{T-3}$, where the metallization layer $ML_{T-3}$ includes a seed layer $130_{T-3}$ and a conductive layer $140_{T-3}$ disposed thereon, the seed layer $130_{T-3}$ lines sidewalls of the openings $OP_{T-3}$, and the conductive layer $140_{T-3}$ directly stacked on the seed layer $130_{T-3}$. The conductive layer $140_{T-3}$ of the metallization layer $ML_{T-3}$ is electrically coupled to the conductive layer $140_{T-4}$ of the metallization layer $ML_{T-4}$ through the seed layer $130_{T-3}$, for example, as shown in FIG. 2. The openings $OP_{T-3}$ each may include a trench hole $OT_{T-3}$ and a via hole $OV_{T-3}$ underlying and spatially communicated to the trench hole $OT_{T-3}$. For example, the trench holes $OT_{T-3}$ are formed in the second dielectric layer $120_{T-3}$ and extend from an illustrated top surface of the second dielectric layer $120_{T-3}$ to a position inside the second dielectric layer $120_{T-3}$. For example, the via holes $OV_{T-3}$ are formed in the second dielectric layer $120_{T-3}$ and the first dielectric layer $110_{T-3}$ and extend from the position inside the second dielectric layer $120_{T-3}$ to an illustrated bottom surface of the first dielectric layer $110_{T-3}$. The position may be about ½ to about ⅓ of a thickness of the second dielectric layer $120_{T-3}$; however, the disclosure is not limited thereto. As illustrated in FIG. 2, portions of the metallization layer $ML_{T-3}$ formed in the trench holes $OT_{T-3}$ may be referred to as conductive lines, conductive traces or conductive wires $T_{T-3}$ horizontally extended (e.g., extending in the direction X and/or the direction Y), and portions of the metallization layer $ML_{T-3}$ formed in the via holes $OV_{T-3}$ may be referred to as conductive vias $V_{T-3}$ vertically extended (e.g., extending in the direction Z). In the case, an illustrated top surface of the metallization layer $ML_{T-3}$ is substantially level with an illustrated top surface of the dielectric structure $DL_{T-3}$. That is, the illustrated top surface of the metallization layer $ML_{T-3}$ is substantially coplanar to the illustrated top surface of the dielectric structure $DL_{T-3}$.

In some embodiments, the build-up layer $L_{T-2}$ includes a dielectric structure $DL_{T-2}$ and a metallization layer $ML_{T-2}$ disposed therein. The dielectric structure $DL_{T-2}$ may include a first dielectric layer $110_{T-2}$ and a second dielectric layer $120_{T-2}$ disposed thereon, where the dielectric structure $DL_{T-2}$ may be penetrated by a plurality of opening $OP_{T-2}$. In the case, the metallization layer $ML_{T-2}$ is disposed inside the openings $OP_{T-2}$, where the metallization layer $ML_{T-2}$ includes a seed layer $130_{T-2}$ and a conductive layer $140_{T-2}$ disposed thereon, the seed layer $130_{T-2}$ lines sidewalls of the openings $OP_{T-2}$, and the conductive layer $140_{T-2}$ directly stacked on the seed layer $130_{T-2}$. The conductive layer $140_{T-2}$ of the metallization layer $ML_{T-2}$ is electrically coupled to the conductive layer $140_{T-3}$ of the metallization layer $ML_{T-3}$ through the seed layer $130_{T-2}$, for example, as shown in FIG. 2. The openings $OP_{T-2}$ each may include a trench hole $OT_{T-2}$ and a via hole $OV_{T-2}$ underlying and spatially communicated to the trench hole $OT_{T-2}$. For example, the trench holes $OT_{T-2}$ are formed in the second dielectric layer $120_{T-2}$ and extend from an illustrated top surface of the second dielectric layer $120_{T-2}$ to a position inside the second dielectric layer $120_{T-2}$. For example, the via holes $OV_{T-2}$ are formed in the second dielectric layer $120_{T-2}$ and the first dielectric layer $110_{T-2}$ and extend from the position inside the second dielectric layer $120_{T-2}$ to an illustrated bottom surface of the first dielectric layer $110_{T-2}$. The position may be about ½ to about ⅓ of a thickness of the second dielectric layer $120_{T-2}$; however, the disclosure is not limited thereto. As illustrated in FIG. 2, portions of the metallization layer $ML_{T-2}$ formed in the trench holes $OT_{T-2}$ may be referred to as conductive lines, conductive traces or conductive wires $T_{T-2}$ horizontally extended (e.g., extending in the direction X and/or the direction Y), and portions of the metallization layer $ML_{T-2}$ formed in the via holes $OV_{T-2}$ may be referred to as conductive vias $V_{T-2}$ vertically extended (e.g., extending in the direction Z). In the case, an illustrated top surface of the metallization layer $ML_{T-2}$ is substantially level with an illustrated top surface of the dielectric structure $DL_{T-2}$. That is, the illustrated top surface of the metallization layer $ML_{T-2}$ is substantially coplanar to the illustrated top surface of the dielectric structure $DL_{T-2}$.

In some embodiments, the build-up layer $L_{T-1}$ includes a dielectric structure $DL_{T-1}$ and a metallization layer $ML_{T-1}$ disposed therein. The dielectric structure $DL_{T-1}$ may include a first dielectric layer $110_{T-1}$ and a second dielectric layer $120_{T-1}$ disposed thereon, where the dielectric structure $DL_{T-1}$ may be penetrated by a plurality of opening $OP_{T-1}$. In the case, the metallization layer $ML_{T-1}$ is disposed inside the openings $OP_{T-1}$, where the metallization layer $ML_{T-1}$ includes a seed layer $130_{T-1}$ and a conductive layer $140_{T-1}$ disposed thereon, the seed layer $130_{T-1}$ lines sidewalls of the openings $OP_{T-1}$, and the conductive layer $140_{T-1}$ directly stacked on the seed layer $130_{T-1}$. The conductive layer $140_{T-1}$ of the metallization layer $ML_{T-1}$ is electrically coupled to the conductive layer $140_{T-2}$ of the metallization layer $ML_{T-2}$ through the seed layer $130_{T-1}$, for example, as shown in FIG. 2. The openings $OP_{T-4}$ each may include a trench hole $OT_{T-1}$ and a via hole $OV_{T-1}$ underlying and spatially communicated to the trench hole $OT_{T-1}$. For example, the trench holes $OT_{T-1}$ are formed in the second dielectric layer $120_{T-1}$ and extend from an illustrated top surface of the second dielectric layer $120_{T-1}$ to a position inside the second dielectric layer $120_{T-1}$. For example, the via holes $OV_{T-1}$ are formed in the second dielectric layer $120_{T-1}$ and the first dielectric layer $110_{T-1}$ and extend from the position inside the second dielectric layer $120_{T-1}$ to an illustrated bottom surface of the first dielectric layer $110_{T-1}$.

The position may be about ½ to about ⅓ of a thickness of the second dielectric layer $120_{T\text{-}1}$; however, the disclosure is not limited thereto. As illustrated in FIG. 2, portions of the metallization layer $ML_{T\text{-}1}$ formed in the trench holes $OT_{T\text{-}4}$ may be referred to as conductive lines, conductive traces or conductive wires $T_{T\text{-}1}$ horizontally extended (e.g., extending in the direction X and/or the direction Y), and portions of the metallization layer $ML_{T\text{-}1}$ formed in the via holes $OV_{T\text{-}1}$ may be referred to as conductive vias $V_{T\text{-}1}$ vertically extended (e.g., extending in the direction Z). In the case, an illustrated top surface of the metallization layer $ML_{T\text{-}1}$ is substantially level with an illustrated top surface of the dielectric structure $DL_{T\text{-}1}$. That is, the illustrated top surface of the metallization layer $ML_{T\text{-}1}$ is substantially coplanar to the illustrated top surface of the dielectric structure $DL_{T\text{-}1}$.

Figure 3:
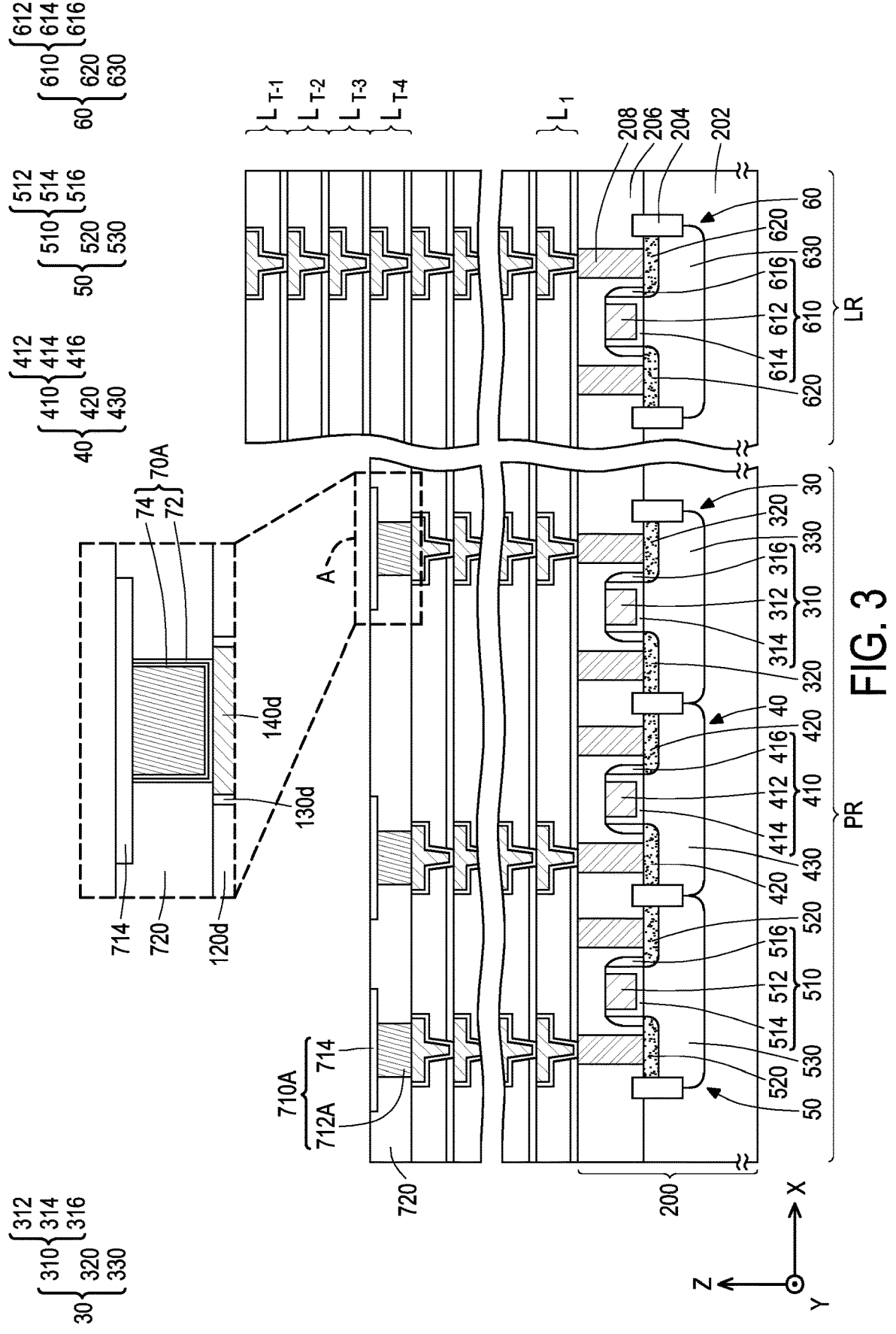

Referring to FIG. 3, in some embodiments, at least one gate structure 710A is disposed over the underlying build-up layer (not label) underlying thereto within the region PR. For example, as shown in FIG. 3, the at least one gate structure 710A includes a plurality of gate structures 710A. Each gate structure 710A may include a gate electrode 712A and a gate dielectric pattern 714 stacked thereon. For example, the gate electrodes 712A are disposed over and electrically coupled to a metallization layer (e.g., a conductive layer) of the build-up layer (not label) underlying thereto, where the gate electrodes 712A are disposed between the gate dielectric patterns 714 and the build-up layer underlying thereto. In some embodiments, the gate structures 710A are electrically coupled to the devices formed in the substrate 200, respectively. In other words, each of the gate structures 710A is electrically communicated to a respective one of the devices (e.g., the transistors 30, 40, and 50) formed in the substrate 200 within the region PR.

The gate electrodes 712A may include a single layer or multi-layered structure. In one embodiment, the gate electrodes 712A may be a poly gate consisting of a silicon-containing material, such as poly-silicon, amorphous silicon or a combination thereof. In an alternative embodiment, the gate electrodes 712A may be a metal gate, a metal oxide gate, a metal nitride gate, the disclosure is not limited thereto. The metal gate, the metal oxide gate, the metal nitride gate may include a metal, such as Ti, Ta, W, Mo, Ni, Co, Ru, Au, Ag, Pt, Mn, Cu, Al, TiN, TiAl, TiAlN, TaN, NiSi, CoSi, other conductive materials with a work function compatible with the substrate material, or combinations thereof. In some embodiments, the gate electrodes 712A include a thickness (as measured in the direction Z) approximately in the range of 1 nm to 3000 nm, although other suitable thickness may alternatively be utilized. The gate electrodes 712A may be formed by using a suitable process such as ALD, CVD, PVD, plating, or combinations thereof. The disclosure is not limited thereto.

In some embodiments, as shown in FIG. 3, the gate dielectric patterns 714 are disposed on the gate electrodes 712A. The gate dielectric patterns 714 may include silicon oxide, silicon nitride, silicon oxy-nitride, or high-k dielectric materials. In some embodiments, the high-k dielectric materials include metal oxides, metal nitrides, or metal carbides. Examples of metal oxides, metal nitrides, or metal carbides used for high-k dielectric materials include oxides, nitrides, and/or carbides of Li, Ta, Ti, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the gate dielectric patterns 714 include a thickness (as measured in the direction Z) approximately in the range of 1 nm to 1000 nm, although other suitable thickness may alternatively be utilized. The gate dielectric patterns 714 may be formed by using a suitable process such as ALD, CVD, PVD, thermal oxidation, UV-ozone oxidation, or combinations thereof. The disclosure is not limited thereto.

Continued on FIG. 3, in some embodiments, a dielectric layer 720 is disposed over the substrate 200 and laterally covers the gate structures 710A. For example, the sidewalls of the gate structures 710A are covered by the dielectric layer 720. The dielectric layer 720 further covers (e.g., are in physical contact with) the build-up layer exposed by the gate structures 710A. For example, an illustrated top surface of the dielectric layer 720 is substantially level with illustrated top surfaces of the gate structures 710A. That is, the illustrated top surface of the dielectric layer 720 is substantially coplanar to the illustrated top surfaces of the gate structures 710A.

In some embodiments, the material of the dielectric layer 720 may be polyimide, polybenzoxazole (PBO), BCB, PSG, BSG, BPSG, a combination thereof, or the like. In alternative embodiments, the dielectric layer 720 is referred to as an IMD layer which includes a dielectric material, such as a nitride such as silicon nitride, an oxide such as silicon oxide, silicon oxynitride, a spin-on dielectric material, or a low-k dielectric material. It should be noted that the low-k dielectric materials are generally dielectric materials having a dielectric constant lower than 3.9. In some embodiments, the dielectric layer 720 may be formed by suitable fabrication techniques such as spin-on coating, CVD (e.g., PECVD), or the like. The dielectric layer 720 may be planarized by mechanical grinding, CMP, etching, or a combination thereof. In one embodiment, the material of the dielectric layer 720 may be the same as the materials of the dielectric layers $120_1$, $120_{T\text{-}4}$, $120_{T\text{-}3}$, $120_{T\text{-}2}$, and/or $120_{T\text{-}1}$. Alternatively, the material of the dielectric layer 720 may be different from the materials of the dielectric layers $120_1$, $120_{T\text{-}4}$, $120_{T\text{-}3}$, $120_{T\text{-}2}$, and/or $120_{T\text{-}1}$.

In some embodiments, at least one barrier structure is disposed between the gate electrodes 712A and the dielectric layer 720. As illustrated in FIG. 3 in conjunction with FIG. 10A, the at least one barrier structure 70A includes a plurality of barrier structures 70A which respectively separate one gate electrode 712A from the dielectric layer 720, for example. The barrier structures of the disclosure each may include a composite structure with two or more sub-layers formed of different materials. For example, each barrier structure 70A incudes a barrier layer 72 and a barrier layer 74 disposed thereon, and one barrier structure 70A separates a respective one gate electrode 712A and the dielectric layer 720 surrounding thereto, where the barrier layer 74 is disposed between the barrier layer 72 and the gate electrode 712A, and the barrier layer 72 is disposed between the barrier layer 74 and the dielectric layer 720 surrounding thereto. In some embodiments, an illustrated top surface of the barrier layer 72 and an illustrated top surface of the barrier layer 74 of each of the barrier structures 70A respectively prop against (e.g., in physical contact with) illustrate bottom surfaces of the gate dielectric patterns 714 of the gate structures 710A. That is, the illustrated top surface of each of the gate electrodes 712A of the gate structures 710A may be substantially level with the illustrated top surfaces of the barrier layers 72 and 74 of the respectively one barrier structure 70A. In other words, the illustrated top surface of each of the gate electrodes 712A of the gate structures 710A may be substantially coplanar to the illustrated top surfaces of the barrier layers 72 and 74 of the respectively one barrier structure 70A. As shown in FIG. 3, the barrier structures 70A line the sidewalls and the bottom surfaces of the gate electrodes 712A, for example. In some embodiments, the gate dielectric patterns 714 are directly laid on the gate electrodes 712A and the barrier structure 70A lining thereto. As shown in FIG. 3 and FIG. 10A, the gate electrode 712A is surround by (e.g., completely enclosed by) the barrier structure 70A and the respective one gate dielectric pattern 714.

In some embodiments, a material of the barrier layer 72 is different from a material of the barrier layer 74. The material of the barrier layer 72 and the material of the barrier layer 74 independently include conductive materials (e.g., pure metals such as Ti, Cu, Al, Ag, Pt, Zr, W, Ta or the like; metal alloys such as CuAl, or the like), conductive oxides (e.g., metal oxides such as TiOx, CuOx, AlOx, or the like), conductive nitrides (such as metal nitrides such as TiN or the like), or other suitable conductive materials. In some embodiments, the barrier layer 72 and the barrier 74 can be formed by deposition and etching process. The deposition may independently include CVD, ALD, PVD, a combination thereof, or the like. The etching process may independently include dry etching, wet etching, or a combination thereof.

In some embodiments, a thickness T72 of the barrier layer 72 is substantially the same as or different from a thickness T74 of the barrier layer 74. For example, the barrier layer 72 has the thickness T72 (e.g., a minimum distance between two main surfaces S72$t$ and S72$b$) approximately in range of 5 Å to 50 nm, although other suitable thickness may alternatively be utilized. In a non-limiting example, the thickness T72 of the barrier layer 72 may be 5 Å, 6 Å, 7 Å, 8 Å, 9 Å, 1 nm, 1.5 nm, 2 nm, 2.5 nm, 3 nm, 3.5 nm, 4 nm, 4.5 nm or 5 nm, although other suitable thickness may alternatively be utilized. The thickness T72 of the barrier layer 72 may be 5 Å, 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm or 50 nm, although other suitable thickness may alternatively be utilized. In some embodiments, the barrier layer 74 has the thickness T74 (e.g., a minimum distance between two main surfaces S74$t$ and S74$b$) approximately in range of 5 Å to 50 nm, although other suitable thickness may alternatively be utilized. In a non-limiting example, the thickness T74 of the barrier layer 74 may be 5 Å, 6 Å, 7 Å, 8 Å, 9 Å, 1 nm, 1.5 nm, 2 nm, 2.5 nm, 3 nm, 3.5 nm, 4 nm, 4.5 nm or 5 nm, although other suitable thickness may alternatively be utilized. The thickness T74 of the barrier layer 74 may be 5 Å, 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm or 50 nm, although other suitable thickness may alternatively be utilized.

Continued on FIG. 3 in conjunction with FIG. 10A, an interface IF1 is disposed between the barrier layer 72 and the barrier layer 74. For example, the interface IF1 is formed by performing a surface treatment on the barrier layer 72. In some embodiments, the interface IF1 is referred to as an artificial interface of the disclosure. Owing to the interfaces IF1, the moisture or hydrogen (from the other components inside the semiconductor device 1000 or the external environment, during the operation or in the manufacture of the semiconductor device 1000) can be trapped at (e.g., absorbed by) the interface IF1, so that the gate electrodes 712A can be prevented from the contamination (e.g., negative impacts); thereby enhancing the performance of the semiconductor device 1000. The interface IF1 may also be referred to as an barrier interface, an absorption interface or a moisture or hydrogen absorption interface, while the barrier structures 70A may also be referred to as a barrier layer or film with multi-layer structure, an absorption layer, an absorption structure, a moisture and/or hydrogen absorption layer, or a moisture and/or hydrogen absorption structure, sometimes.

The gate structures 710A (each including the gate electrode 712A and the gate dielectric pattern 714), the barrier structures 70A (each including the barrier layer 72, the interface IF1 and the barrier layer 74) and the dielectric layer 720 may be formed by, but not limited to, the following steps, depositing a dielectric material to cover the structure depicted in FIG. 2; patterning the dielectric material to form a plurality of openings O1 (see FIG. 10A) exposing the underlying conductive features (e.g., portions of the conductive layer of the metallization layer of the build-up layer underlying thereto, see FIG. 3); conformally forming a blanket layer of a first barrier material over the substrate 200 to cover the dielectric material and further extend into the openings O1 (see FIG. 10A) formed in the dielectric material, so to at least line the openings O1 and in contact with the underlying conductive features (e.g., the portions of the conductive layer of the metallization layer of the build-up layer underlying thereto, see FIG. 3); performing a surface treatment on the first barrier material blanket layer to form a barrier interface IF1 at an exposed surface (e.g., S72$t$) of the first barrier material blanket layer; conformally forming a blanket layer of a second barrier material over the substrate 200 to cover the first barrier material blanket layer and further extend into the openings O1 (see FIG. 10A) formed in the dielectric material, so to at least cover the barrier interface IF1 at the exposed surface (e.g., S72$t$) of the first barrier material blanket layer disposed inside the openings O1, the second barrier material being different from the first barrier material; filling the openings O1 by a conductive material to cover the second barrier material blanket layer; removing the excessive amounts of the conductive material, the second barrier material blanket layer and the first barrier material blanket layer from the dielectric material, thereby forming the gate electrode 712A and the barrier structure 70A (including the barrier layer 72, the barrier layer 74, and the interface IF1 between the barrier layer 72 and the barrier layer 74) inside the openings O1 formed in the dielectric material; forming a blanket layer of a gate dielectric material to cover the dielectric material and in contact with the gate electrodes 712A and the barrier structure 70A; patterning the gate dielectric material blanket layer to form multiple gate dielectric patterns 714 respectively in contact with the gate electrodes 712A and the barrier structure 70A, thereby forming the gate structures 710A; depositing the dielectric material to further embed the gate dielectric patterns 714; and planarizing the dielectric material to form the dielectric layer 720 accessibly revealing the gate structures 710A (e.g., the gate dielectric patterns 714). The conductive material may be formed by deposition or plating. The gate dielectric patterns 714 may be formed by deposition, photolithography, and etching processes. The etching process may include a dry etching, a wet etching, or a combination thereof. The dielectric material (for dielectric layer 720) may be planarized by mechanical grinding, CMP, etching, or a combination thereof. The disclosure is not limited thereto. After the planarizing step, a cleaning step may be optionally performed, for example, to clean and remove the residue generated from the planarizing step. However, the disclosure is not limited thereto, and the planarizing step may be performed through any other suitable method.

The surface treatment may include performing purge after the formation of the first barrier layer blanket layer, without vacuum break, performing a vacuum break after the formation of the first barrier layer blanket layer, performing a plasma treatment on the first barrier layer blanket layer, or any other suitable method. By doing the surface treatment, the barrier interface IF1 formed at the exposed surface (e.g., S72t) of the first barrier material blanket layer is considered as a defective interface which has dangling bonds for trapping the hydrogen (H) atom from hydrogen vapor or moisture.

For example, in a plane view (e.g., X-Y plane), a vertical projection of one gate dielectric pattern 714 is greater than a vertical projection of the respective one gate electrode 712A disposed underneath thereto. That is, as shown in FIG. 3 and FIG. 10A, a sidewall of the gate dielectric pattern 714 may be extended behind a sidewall of the respective one gate electrode 712A. In the case, the sidewall of the gate dielectric pattern 714 and the sidewall of the respective one gate electrode 712A together constitute a sidewall of a respective one gate structure 710A. However, the disclosure is not limited thereto; alternatively, in the plane view (e.g., X-Y plane), one gate dielectric pattern 714 has a contour similar to or substantially identical to a contour of the respective one gate electrode 712A disposed underneath thereto. For a non-limiting example, a sidewall of the gate dielectric pattern 714 is aligned with a sidewall of the respective one gate electrode 712A.

In some embodiments, a seed layer (not shown) is optionally disposed between the barrier structure 70A and the gate electrodes 712A. The formation of the seed layer is formed after the second barrier material blanket layer and prior to the conductive material. The seed layer is a metal layer, which may be a single layer or a composite layer comprising a plurality of sub-layers formed of different materials. In some embodiments, the seed layer includes a titanium layer and a copper layer over the titanium layer. The seed layer is formed using, for example, PVD or the like. The details of the seed layer may be substantially identical to or similar to the details (e.g., the forming process, etc.) of the seed layer seed layer $130_1$ as described in FIG. 1, and thus are not repeated herein for brevity.

As shown in FIG. 3, for example, the gate electrodes 712A are lined by (e.g., in physical contact with) the barrier layers 74 of the barrier structures 70A, the barrier layers 74 are lined by (e.g., in physical contact with) the barrier layers 72 of the barrier structures 70A, and the dielectric layer laterally covers (e.g., in physical contact with) the barrier layers 72 of the barrier structures 70A and the gate dielectric patterns 714 of the gate structures 710A. In alternative embodiments of which the seed layer is included in the gate structures 710A, the gate electrodes 712A are lined by (e.g., in physical contact with) the optional seed layers, the optional seed layers are lined by (e.g., in physical contact with) the barrier layers 74 of the barrier structures 70A, the barrier layers 74 are lined by (e.g., in physical contact with) the barrier layers 72 of the barrier structures 70A, and the dielectric layer 720 laterally covers (e.g., in physical contact with) the barrier layers 72 of the barrier structures 70A and the gate dielectric patterns 714 of the gate structures 710A.

In the disclosure, the barrier structure may include more than two sub-layers. In a non-limiting example, the barrier structure 70A depicted in FIG. 10A and FIG. 3 may be substituted by a barrier structure 70B depicted in FIG. 10B. For example, the barrier structure 70B includes a composite structure with more than two sub-layers formed of different materials. As shown in FIG. 10B, the barrier structure 70B may include three sub-layers, such as a barrier layer 72, a barrier 74 and a barrier layer 76. For example, the barrier structure 70B is formed in the dielectric layer 720 to line the sidewall and bottom surface of the opening O1, where the gate electrode 712A is separated from the dielectric layer 720 through the barrier structure 70B, and the sidewall and bottom surface of the gate electrode 712A are covered by (e.g., in physical contact with) the barrier structure 70B. In some embodiments, the illustrated top surface of the gate electrode 712A and an illustrated top surface of the barrier structure 70B are substantially level with each other and in (e.g., physical) contact with the illustrated bottom surface of the gate dielectric pattern 714. That is, the illustrated top surface of the gate electrode 712A is substantially coplanar to the illustrated top surface of the barrier structure 70B. In some embodiments, the gate dielectric pattern 714 is directly laid on the gate electrodes 712A and the barrier structure 70B lining thereto. As shown in FIG. 10B, the gate electrode 712A is surround by (e.g., completely enclosed by) the barrier structure 70B and the respective one gate dielectric pattern 714, for example.

Continued on FIG. 10B, in some embodiments, the sidewall and the bottom surface of the gate electrode 712A is lined by (e.g., in direct contact with) the barrier layer 74, the outer surface of the barrier layer 74 are lined by (e.g., in direct contact with) the barrier layer 72, and the outer surface of the barrier layer 72 are lined by (e.g., in direct contact with) the barrier layer 76. The dielectric layer 720 laterally covers the barrier structure 70B lining the gate electrode 712A. That is, the barrier layer 76 is disposed between the dielectric layer 720 and the barrier layer 72, the barrier layer 72 is disposed between the barrier layer 76 and the barrier layer 74, and the barrier layer 74 is disposed between the barrier layer 72 and the gate electrode 712A. The details of the barrier layer 72 and the details of the barrier layer 74 have been discussed in FIG. 10A and FIG. 3, and thus are not repeated herein for brevity.

In some embodiments, a material of the barrier layer 76 is different from the material of the barrier layer 72 and is the same as the material of the barrier layer 74. Alternatively, the material of the barrier layer 76 is different from the material of the barrier layer 74. The material of the barrier layer 76 includes conductive materials (e.g., pure metals such as Ti, Cu, Al, Ag, Pt, Zr, W, Ta or the like; metal alloys such as CuAl, or the like), conductive oxides (e.g., metal oxides such as TiOx, CuOx, AlOx, or the like), conductive nitrides (such as metal nitrides such as TiN or the like), or other suitable conductive materials. In some embodiments, the barrier layer 76 can be formed by deposition and etching process. The deposition may independently include CVD, ALD, PVD, a combination thereof, or the like. The etching process may independently include dry etching, wet etching, or a combination thereof.

In some embodiments, a thickness T76 of the barrier layer 76 is substantially the same as or different from the thickness T74 of the barrier layer 74 and/or the thickness T72 of the barrier layer 72. For example, the barrier layer 76 has the thickness T76 (e.g., a minimum distance between two main surfaces S76t and S76b) approximately in range of 5 Å to 50 nm, although other suitable thickness may alternatively be utilized. In a non-limiting example, the thickness T76 of the barrier layer 76 may be 5 Å, 6 Å, 7 Å, 8 Å, 9 Å, 1 nm, 1.5 nm, 2 nm, 2.5 nm, 3 nm, 3.5 nm, 4 nm, 4.5 nm or 5 nm, although other suitable thickness may alternatively be utilized. The thickness T76 of the barrier layer 76 may be 5 Å, 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm or 50 nm, although other suitable thickness may alternatively be utilized.

As illustrated in FIG. 10B, an interface IF1 is disposed between the barrier layer 72 and the barrier layer 74, and an interface IF2 is disposed between the barrier layer 72 and the barrier layer 76, for example. The details of the interface IF1 have been discussed in FIG. 10A and FIG. 3, and thus are not repeated herein for brevity. For example, the interface IF2 is formed by performing a surface treatment on the barrier layer 76. In some embodiments, the interface IF2 is referred to as an artificial interface of the disclosure. Owing to the interfaces IF1 and IF2, the moisture or hydrogen (from the other components inside the semiconductor device 1000 or the external environment, during the operation or in the manufacture of the semiconductor device 1000) can be trapped at (e.g., absorbed by) the interfaces IF1 and IF2, so that the gate electrodes 712A can be prevented from the contamination (e.g., negative impacts); thereby enhancing the performance of the semiconductor device 1000. The interface IF2 may also be referred to as an barrier interface, an absorption interface or a moisture or hydrogen absorption interface, while the barrier structures 70B may also be referred to as a barrier layer or film with multi-layer structure, an absorption layer, an absorption structure, a moisture and/or hydrogen absorption layer, or a moisture and/or hydrogen absorption structure, sometimes.

The gate structures 710A (each including the gate electrode 712A and the gate dielectric pattern 714), the barrier structures 70B (each including the barrier layer 76, the interface IF2, the barrier layer 72, the interface IF1 the barrier layer 74) and the dielectric layer 720 may be formed by, but not limited to, the following steps, depositing a dielectric material to cover the structure depicted in FIG. 2; patterning the dielectric material to form a plurality of openings O1 (see FIG. 10A) exposing the underlying conductive features (e.g., portions of the conductive layer of the metallization layer of the build-up layer underlying thereto, see FIG. 3); conformally forming a blanket layer of a third barrier material over the substrate 200 to cover the dielectric material and further extend into the openings O1 (see FIG. 10B) formed in the dielectric material, so to at least line the openings O1 and in contact with the underlying conductive features (e.g., the portions of the conductive layer of the metallization layer of the build-up layer underlying thereto, see FIG. 3); performing a surface treatment on the third barrier material blanket layer to form a barrier interface IF2 at an exposed surface (e.g., S76t) of the third barrier material blanket layer; conformally forming a blanket layer of the first barrier material over the substrate 200 to cover the third barrier material blanket layer and further extend into the openings O1 (see FIG. 10B) formed in the dielectric material, so to at least cover the barrier interface IF2 at the exposed surface (e.g., S76t) of the third barrier material blanket layer disposed inside the openings O1, the first barrier material being different from the third barrier material; performing another surface treatment on the first barrier material blanket layer to form a barrier interface IF1 at the exposed surface (e.g., S72t) of the first barrier material blanket layer; conformally forming a blanket layer of the second barrier material over the substrate 200 to cover the first barrier material blanket layer and further extend into the openings O1 (see FIG. 10B) formed in the dielectric material, so to at least cover the barrier interface IF1 at the exposed surface (e.g., S72t) of the first barrier material blanket layer disposed inside the openings O1, the second barrier material being different from the first barrier material; filling the openings O1 by a conductive material to cover the second barrier material blanket layer; removing the excessive amounts of the conductive material, the third barrier material blanket layer, the second barrier material blanket layer and the first barrier material blanket layer from the dielectric material, thereby forming the gate electrode 712A and the barrier structure 70B (including the barrier layer 76, the barrier layer 72, the interface IF2 between the barrier layer 76 and the barrier layer 72, the barrier layer 74, the interface IF1 between the barrier layer 72 and the barrier layer 74) inside the opening O1 formed in the dielectric material; forming a blanket layer of a gate dielectric material to cover the dielectric material and in contact with the gate electrodes 712A and the barrier structure 70B; patterning the gate dielectric material blanket layer to form multiple gate dielectric patterns 714 respectively in contact with the gate electrodes 712A and the barrier structure 70B, thereby forming the gate structures 710A; depositing the dielectric material to further embed the gate dielectric patterns 714; and planarizing the dielectric material to form the dielectric layer 720 accessibly revealing the gate structures 710A (e.g., the gate dielectric patterns 714). The surface treatments individually may include performing purge after the formation of the first barrier layer blanket layer, without vacuum break, performing a vacuum break after the formation of the first barrier layer blanket layer, performing a plasma treatment on the first barrier layer blanket layer, or any other suitable method. The conductive material may be formed by deposition or plating. The gate dielectric patterns 714 may be formed by deposition, photolithography, and etching processes. The etching process may include a dry etching, a wet etching, or a combination thereof. The dielectric material (for dielectric layer 720) may be planarized by mechanical grinding, CMP, etching, or a combination thereof. The disclosure is not limited thereto. After the planarizing step, a cleaning step may be optionally performed, for example, to clean and remove the residue generated from the planarizing step. However, the disclosure is not limited thereto, and the planarizing step may be performed through any other suitable method.

The surface treatment may include performing purge after the formation of the first barrier layer blanket layer, without vacuum break, performing a vacuum break after the formation of the first barrier layer blanket layer, performing a plasma treatment on the first barrier layer blanket layer, or any other suitable method. By doing the surface treatment, the barrier interface IF1 formed at the exposed surface (e.g., S72t) of the first barrier material blanket layer is considered as a defective interface and the barrier interface IF2 formed at the exposed surface (e.g., S76t) of the third barrier material blanket layer are considered as defective interfaces which have dangling bonds for trapping the hydrogen (H) atom from hydrogen vapor or moisture.

For example, in the plane view (e.g., X-Y plane), the vertical projection of one gate dielectric pattern 714 is greater than the vertical projection of the respective one gate electrode 712A disposed underneath thereto. That is, as shown in FIG. 3 and FIG. 10B, the sidewall of the gate dielectric pattern 714 may be extended behind the sidewall of the respective one gate electrode 712A. In the case, the sidewall of the gate dielectric pattern 714 and the sidewall of the respective one gate electrode 712A together constitute a sidewall of a respective one gate structure 710A. However, the disclosure is not limited thereto; alternatively, in the plane view (e.g., X-Y plane), one gate dielectric pattern 714 has a contour similar to or substantially identical to a contour of the respective one gate electrode 712A disposed underneath thereto. For a non-limiting example, a sidewall of the gate dielectric pattern 714 is aligned with a sidewall of the respective one gate electrode 712A.

In some embodiments, a seed layer (not shown) is optionally disposed between the barrier structure 70B and the gate electrodes 712A. The formation of the seed layer is formed after the second barrier material blanket layer and prior to the conductive material. The seed layer is a metal layer, which may be a single layer or a composite layer comprising a plurality of sub-layers formed of different materials. In some embodiments, the seed layer includes a titanium layer and a copper layer over the titanium layer. The seed layer is formed using, for example, PVD or the like. The details of the seed layer may be substantially identical to or similar to the details (e.g., the forming process, etc.) of the seed layer seed layer $130_1$ as described in FIG. 1 in conjunction with FIG. 3 and FIG. 10A, and thus are not repeated herein for brevity. In the embodiments of which the seed layer is included in the gate structures 710A, the gate electrodes 712A are lined by (e.g., in physical contact with) the optional seed layers, the optional seed layers are lined by (e.g., in physical contact with) the barrier layers 74 of the barrier structures 70B, the barrier layers 74 are lined by (e.g., in physical contact with) the barrier layers 72 of the barrier structures 70B, the barrier layers 72 are lined by (e.g., in physical contact with) the barrier layers 76 of the barrier structures 70B, and the dielectric layer 720 laterally covers (e.g., in physical contact with) the barrier layers 76 of the barrier structures 70B and the gate dielectric patterns 714 of the gate structures 710A.

It is appreciated that the barrier structure of the disclosure can be a composite structure of two sub-layers (e.g., 70A), three sub-layers (e.g., 70B), four sub-layers, or more sub-layers, etc. The disclosure does not specifically limit the number of the sub-layers included in one barrier structure, as long as there is an interface formed between at least one set of two immediately adjacent sub-layers (e.g., 72 and 74, 72 and 76, and/or the like). That is, alternatively, the barrier structure 70B may only include the interface IF1 between the barrier layers 72 and 74. Or alternatively, the barrier structure 70B may only include the interface IF2 between the barrier layers 72 and 76. In addition, it is appreciated that the immediately adjacent sub-layers of the barrier structure (e.g., 70A, 70B and/or the like) may be made of different materials, so to promptly facilitate the formation of the interface (e.g., IF1, IF2, and/or the like). However, the disclosure is not limited thereto; alternatively, the immediately adjacent sub-layers of the barrier structure (e.g., 70A, 70B and/or the like) may be made of same material.

Figure 4:
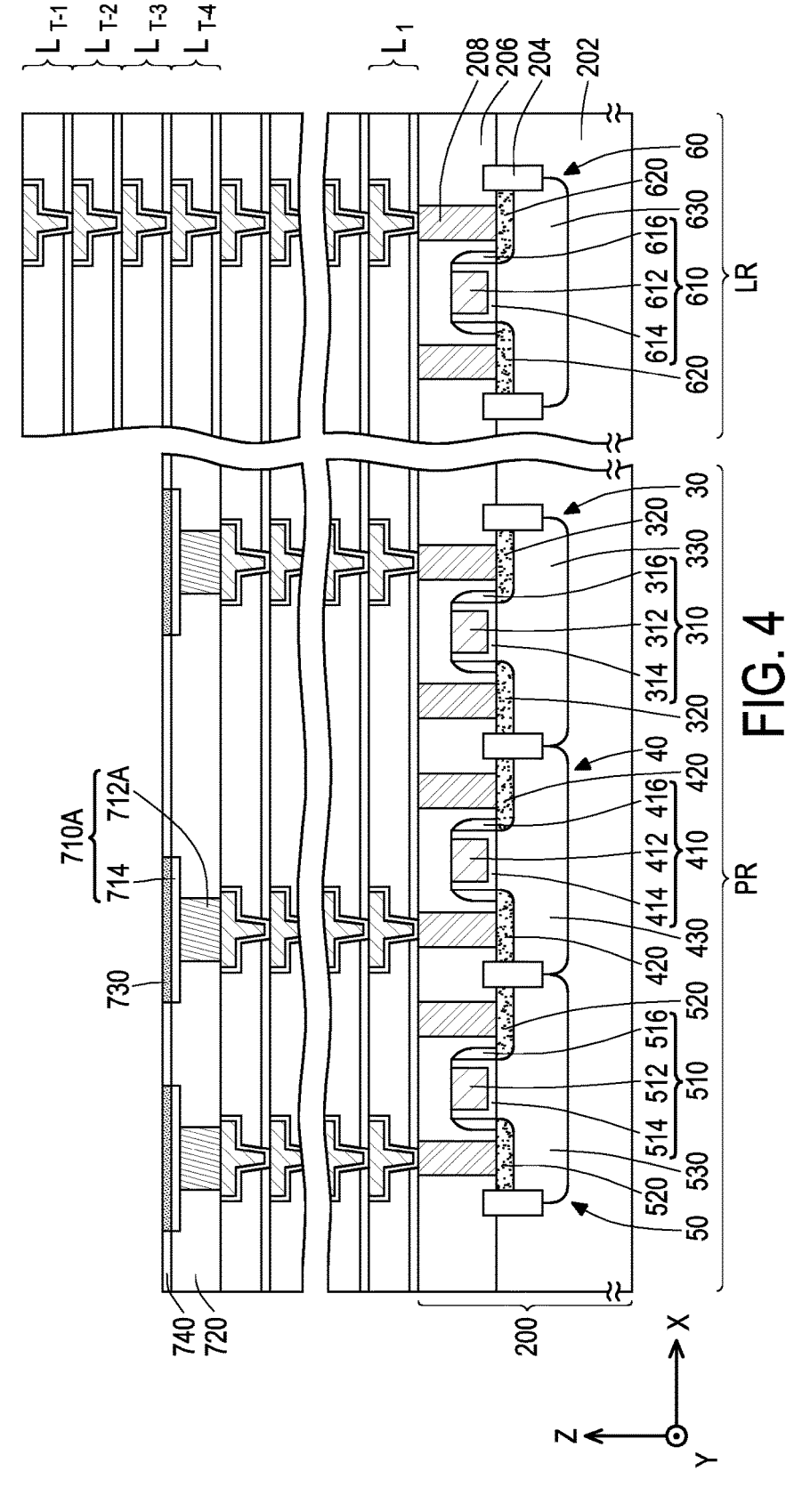

Referring to FIG. 4, in some embodiments, a plurality of semiconductor patterns 730 are formed over the gate structures 710A, and a dielectric layer 740 is then formed to laterally cover the semiconductor patterns 730. For example, as shown in FIG. 4, the semiconductor patterns 730 are disposed on (e.g., in physical contact with) the gate dielectric patterns 714, respectively. In that case, the semiconductor patterns 730 are respectively overlapped with the gate electrodes 712A in the direction Z. As shown in FIG. ', the semiconductor patterns 730 are accessibly revealed by the dielectric layer 740, for example. In some embodiments, illustrated top surface of the semiconductor patterns 730 are substantially level with an illustrated top surface of the dielectric layer 740. In other words, the illustrated top surface of the semiconductor patterns 730 are substantially coplanar to the illustrated top surface of the dielectric layer 740.

The semiconductor patterns 730 may be formed by, but not limited to, forming a blanket layer of semiconductor material over the structure depicted in FIG. 3; and patterning the semiconductor material blanket layer to form multiple semiconductor patterns 730 over the gate structures 710A. The patterning may include photolithograph and etching processes. In some embodiments, the semiconductor patterns 730 include a thickness (as measured in the direction Z) approximately in the range of 1 nm to 1000 nm, although other suitable thickness may alternatively be utilized. For example, the semiconductor material blanket layer includes a metal oxide, which is formed by CVD or the like. Examples of metal oxides used for semiconductor materials include oxides of In, Ga, Zn, Al, Sn, Cu, Ni, and/or mixtures thereof. For example, the semiconductor patterns 730 are made of indium gallium zinc oxide (IGZO).

For example, as shown in FIG. 4, a lateral size of one semiconductor pattern 730 is greater than a lateral size of a respective one gate electrode 712A and is substantially equal to a lateral size of a respective one gate dielectric pattern 714. In alternative embodiments, the lateral size of one semiconductor pattern 730 may be substantially equal to the lateral size of the respective one gate electrode 712A. In further alternative embodiments, the lateral size of one semiconductor pattern 730 may be less than the lateral size of the respective one gate electrode 712A. In other alternative embodiments, the lateral size of one semiconductor pattern 730 is greater than the lateral size of the respective one gate dielectric pattern 714. In yet alternative embodiments, the lateral size of one semiconductor pattern 730 is less than the lateral size of the respective one gate dielectric pattern 714. The disclosure is not limited thereto.

The dielectric layer 740 may be formed by, but not limited to, forming a blanket layer of dielectric material over the semiconductor patterns 730 and the dielectric layer 720 exposed therefrom, so that the semiconductor patterns 730 and the dielectric layer 720 are not accessibly revealed by the dielectric material blanket layer; and planarizing the dielectric material blanket layer to form the dielectric layer 740 exposing the semiconductor patterns 730. In some embodiments, the material of the dielectric layer 740 may be polyimide, PBO, BCB, PSG, BSG, BPSG, a combination thereof, or the like. In alternative embodiments, the dielectric layer 740 is referred to as an IMD layer which includes a dielectric material, such as a nitride such as silicon nitride, an oxide such as silicon oxide, silicon oxynitride, a spin-on dielectric material, or a low-k dielectric material. It should be noted that the low-k dielectric materials are generally dielectric materials having a dielectric constant lower than 3.9. In some embodiments, the dielectric layer 740 may be formed by suitable fabrication techniques such as spin-on coating, CVD (e.g., PECVD), or the like. The dielectric layer 740 may be planarized by mechanical grinding, CMP, etching, or a combination thereof. After the planarizing step, a cleaning step may be optionally performed, for example, to clean and remove the residue generated from the planarizing step. However, the disclosure is not limited thereto, and the planarizing step may be performed through any other suitable method. In one embodiment, the material of the dielectric layer 740 may be the same as the materials of the dielectric layers 720, $120_1$, $120_{T-4}$, $120_{T-3}$, $120_{T-2}$, and/or $120_{T-1}$. Alternatively, the material of the dielectric layer 740 may be different from the materials of the dielectric layers 720, $120_1$, $120_{T-4}$, $120_{T-3}$, $120_{T-2}$, and/or $120_{T-1}$. For example, sidewalls of the semiconductor patterns 730 are covered by (e.g., in physical contact with) the dielectric layer 740.

Figure 5:
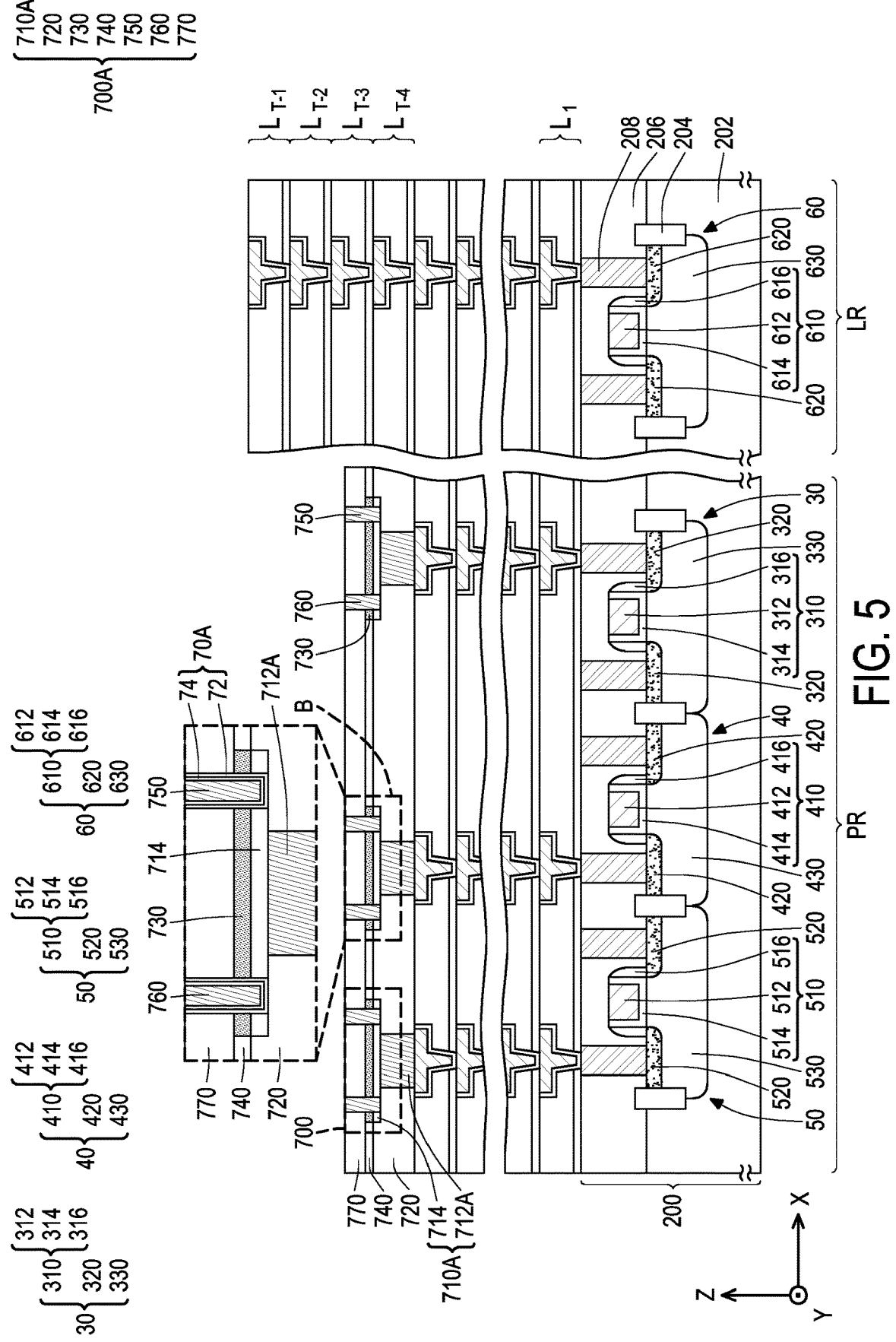

Referring to FIG. 5, in some embodiments, a plurality of source/drain regions 750, 760 are disposed over the gate structures 710A and the dielectric layer 720. In some embodiments, the source/drain regions 750, 760 are grouped into a plurality of pairs, where each pair of source/drain regions 750, 760 are corresponding to a respective one gate structure 710A, with at least a portion of a respective one semiconductor pattern 730 disposed therebetween. As shown in FIG. 5, the source/drain regions 750, 760 may further extend through the semiconductor patterns 730 and the gate dielectric patterns 714 of the gate structures 710A to have bottom surfaces of the source/drain regions 750, 760 be in (e.g., physical) contact with the dielectric layer 720 and to have sidewalls of the source/drain regions 750, 760 to be in (e.g., physical) contact with the semiconductor patterns 730 and the gate dielectric patterns 714. However, the disclosure is not limited thereto; alternatively, the source/drain regions 750, 760 may further extend through the semiconductor patterns 730 to have the bottom surfaces of the source/drain regions 750, 760 be in (e.g., physical) contact with the gate dielectric patterns 714 and to have the sidewalls of the source/drain regions 750, 760 to be in (e.g., physical) contact with the semiconductor patterns 730. Or alternatively, the source/drain regions 750, 760 may stand on (e.g., directly laid on) the semiconductor patterns 730, so to have the bottom surfaces of the source/drain regions 750, 760 be in (e.g., physical) contact with the semiconductor patterns 730. In some embodiments, each pair of the source/drain regions 750, 760 are disposed at two opposite sides of the gate electrode 712A of the respective one gate structure 710A, where a portion of the respective one semiconductor pattern 730 (e.g., overlapped with the respective one gate electrode 712A) and a portion of the respective one gate dielectric pattern 714 (e.g., overlapped with the respective one gate electrode 712A) are disposed between the pair of source/drain regions 750, 760 and the respective one gate electrode 712A.

In some embodiments, a dielectric layer 770 is disposed over the substrate 200 and laterally covers the source/drain regions 750, 760. For example, the sidewalls of source/drain regions 750, 760 exposed from the semiconductor patterns 730 and the gate dielectric patterns 714 are covered by the dielectric layer 770. The dielectric layer 770 further covers (e.g., are in physical contact with) the semiconductor patterns 730 exposed by the dielectric layer 740. For example, an illustrated top surface of the dielectric layer 770 is substantially level with illustrated top surfaces of the source/drain regions 750, 760. That is, the illustrated top surface of the dielectric layer 770 is substantially coplanar to the illustrated top surfaces of the source/drain regions 750, 760.

In some embodiments, at least one barrier structure is disposed between the source/drain regions 750, 760 and the dielectric layer 770, between the source/drain regions 750, 760 and the semiconductor patterns 730, and between the source/drain regions 750, 760 and the gate dielectric patterns 714. As illustrated in FIG. 5, the at least one barrier structure 70A includes a plurality of barrier structures 70A which separate the source/drain regions 750, 760 from the dielectric layer 770, the semiconductor patterns 730 and the gate dielectric patterns 714, for example. The barrier structures of the disclosure each may include a composite structure with two or more sub-layers formed of different materials. For example, each barrier structure 70A incudes a barrier layer 72 and a barrier layer 74 disposed thereon, and one barrier structure 70A separates one of the source/drain regions 750, 760 from the dielectric layer 770 surrounding thereto, the semiconductor pattern 730 surrounding thereto and the gate dielectric pattern 714 surrounding thereto, where the barrier layer 74 is disposed between the barrier layer 72 and the respective one of the source/drain regions 750, 760, and the barrier layer 72 is disposed between the barrier layer 74 and the dielectric layer 770 surrounding thereto, between the barrier layer 74 and the semiconductor pattern 730 surrounding thereto, and between the barrier layer 74 and the gate dielectric pattern 714 surrounding thereto. In some embodiments, an illustrated top surface of the dielectric layer 770 is substantially level with an illustrated top surface of the barrier layer 72 and an illustrated top surface of the barrier layer 74 of each of the barrier structures 70A and illustrated top surfaces of the source/drain regions 750, 760. That is, the illustrated top surface of the dielectric layer 770 is substantially coplanar to the illustrated top surface of the barrier layer 72 and the illustrated top surface of the barrier layer 74 of each of the barrier structures 70A and the illustrated top surfaces of the source/drain regions 750, 760. The barrier structures 70A line the sidewalls and the bottom surfaces of the source/drain regions 750, 760, for example. As shown in FIG. 5 and FIG. 11A, the source/drain regions 750, 760 may be formed in a plurality of openings O2 formed in the dielectric layer 770, where the openings O2 further extend through the semiconductor patterns 730 and the gate dielectric patterns 714 underlying thereto. In the case, the barrier structures 70A may line the sidewalls and the bottom surfaces of the openings O2, and the source/drain regions 750, 760 may be disposed inside the openings O2 and disposed on the barrier structure 70A.

Continued on FIG. 5 in conjunction with FIG. 11A, an interface IF1 is disposed between the barrier layer 72 and the barrier layer 74. For example, the interface IF1 is formed by performing a surface treatment on the barrier layer 72. In some embodiments, the interface IF1 is referred to as an artificial interface of the disclosure. Owing to the interfaces IF1, the moisture or hydrogen (from the other components inside the semiconductor device 1000 or the external environment, during the operation or in the manufacture of the semiconductor device 1000) can be trapped at (e.g., absorbed by) the interface IF1, so that the source/drain regions 750, 760 can be prevented from the contamination (e.g., negative impacts); thereby enhancing the performance of the semiconductor device 1000. The details, formations and materials of the source/drain regions 750, 760 may be similar to or substantially identical the formations and materials of the gate electrodes 710A as described in FIG. 3, the details, formations and materials of the dielectric layer 770 may be similar to or substantially identical the formations and materials of the dielectric layer 720 as described in FIG. 3, the details, formations and materials of the barrier structures 70A (e.g., the barrier layer 72, the barrier layer 74 and the interface IF1) have been discussed in FIG. 10A, and thus are not repeated herein for brevity. In one embodiment, the material of the dielectric layer 770 may be the same as the materials of the dielectric layers 720, 740, $120_1$, $120_{T-4}$, $120_{T-3}$, $120_{T-2}$, and/or $120_{T-1}$. Alternatively, the material of the dielectric layer 770 may be different from the materials of the dielectric layers 720, 740, $120_1$, $120_{T-4}$, $120_{T-3}$, $120_{T-2}$, and/or $120_{T-1}$.

In the disclosure, the barrier structure may include more than two sub-layers. In a non-limiting example, the barrier structure 70A depicted in FIG. 11A and FIG. 5 may be substituted by a barrier structure 70B depicted in FIG. 11B. For example, the barrier structure 70B includes a composite structure with more than two sub-layers formed of different materials. As shown in FIG. 11B, the barrier structures 70B each may include three sub-layers, such as a barrier layer 72, a barrier 74 and a barrier layer 76. For example, the barrier structures 70B are formed to line the sidewalls and bottom surfaces of the openings O2 penetrating the dielectric layer 770, the semiconductor patterns 730 and the gate dielectric layer 714, where the source/drain regions 750, 760 are separated from the dielectric layer 770, the semiconductor patterns 730 and the gate dielectric patterns 714 through the barrier structure 70B, and the sidewalls and bottom surfaces of the source/drain regions 750, 760 are covered by (e.g., in physical contact with) the barrier structures 70B.

As illustrated in FIG. 11B, an interface IF1 is disposed between the barrier layer 72 and the barrier layer 74, and an interface IF2 is disposed between the barrier layer 72 and the barrier layer 76, for example. In some embodiments, the interface IF2 is formed by performing a surface treatment on the barrier layer 76. The details of the interface IF1 have been discussed in FIG. 10A and FIG. 3, the details of the interface IF2 have been discussed in FIG. 10B and FIG. 3, and thus are not repeated herein for brevity. In some embodiments, the interface IF2 is referred to as an artificial interface of the disclosure. Owing to the interfaces IF1 and IF2, the moisture or hydrogen (from the other components inside the semiconductor device 1000 or the external environment, during the operation or in the manufacture of the semiconductor device 1000) can be trapped at (e.g., absorbed by) the interfaces IF1 and IF2, so that the source/drain regions 750, 760 can be prevented from the contamination (e.g., negative impacts); thereby enhancing the performance of the semiconductor device 1000. The interface IF2 may also be referred to as an barrier interface, an absorption interface or a moisture or hydrogen absorption interface, while the barrier structures 70B may also be referred to as a barrier layer or film with multi-layer structure, an absorption layer, an absorption structure, a moisture and/or hydrogen absorption layer, or a moisture and/or hydrogen absorption structure, sometimes.

In some embodiments, the illustrated top surface of the dielectric layer 770 is substantially level with the illustrated top surfaces of the barrier layer 72, the illustrated top surface of the barrier layer 74 and an illustrated top surface of the barrier layer 76 of each of the barrier structures 70B and the illustrated top surfaces of the source/drain regions 750, 760. That is, the illustrated top surface of the dielectric layer 770 is substantially coplanar to the illustrated top surfaces of the barrier layer 72, the barrier layer 74 and the barrier layer 76 of each of the barrier structures 70B and the illustrated top surfaces of the source/drain regions 750, 760. The barrier structures 70B line the sidewalls and the bottom surfaces of the source/drain regions 750, 760, for example. The details, formations and materials of the barrier structures 70B have been discussed in FIG. 10B, and thus are not repeated herein for brevity.

In some embodiments, a seed layer (not shown) is optionally disposed between the barrier structure (e.g., 70A and/or 70B) and the source/drain regions 750, 760. The formations and materials of the optional seed layer may be substantially identical to or similar to the details (e.g., the forming process, etc.) of the seed layer seed layer 130₁ as described in FIG. 1 and the details of the optional seed layer have been discussed in FIG. 3 in conjunction with FIGS. 10A-10B, and thus are not repeated herein for brevity.

Up to here, a plurality of thin film transistors (TFTs) 700A disposed in the interconnect 100 of the semiconductor device 1000 are manufactured. The TFTs 700A may be referred to as bottom gate TFTs. Each of the TFTs 700A includes one gate structure 710A, one semiconductor pattern 730, and one pair of the source/drain regions 750, 760, for example. The TFTs 700A may further include the dielectric layer 720 laterally covering the gate structure 710A, the dielectric layer 740 laterally covering the semiconductor pattern 730, and the dielectric layer 770 laterally covering the source/drain regions 750, 760. In some embodiments, each of the TFTs 700A further includes at least one barrier structure (e.g., 70A and/or 70B) to line the sidewalls and bottom surfaces of one or more of the gate structure 710A and the source/drain regions 750, 760. The gate electrode 712A of the gate structure 710A is referred to as a gate of each TFT 700A, the pair of the source/drain regions 750, 760 is referred to as source/drain elements or regions of the each TFT 700A, and the portion of the semiconductor pattern 730 (e.g., overlapped with the gate electrode 712A of the gate structure 710A and disposed between the pair of the source/drain regions 750, 760) is referred to as a channel or a channel region of each TFT 700A, where a conduction status of the channel or the channel region is controlled by a voltage applied or induced onto the gate electrode 712A (e.g., through the metallization layer of the build-up layer underlying thereto electrically coupled thereto). In the case, the conduction status of the channel or the channel region can be detected and/or controlled by the devices (such as the transistor 30, the transistor 40, and the transistor 50 embedded in the substrate 200) electrically coupled thereto. The gate dielectric pattern 714 of the gate structure 710A may be referred to as a gate dielectric layer of each TFT 700A. In some embodiments, the gate dielectric patterns 714 formed in the same process may together be referred to as a gate dielectric layer. In some embodiments, the semiconductor patterns 730 formed in the same process may together be referred to as a semiconductor layer.

The TFTs (e.g., 700A) may be considered as low-temperature TFTs, which is able to be formed in the BEOL process. It is appreciated that due to the TFTs 700A are the low-temperature TFTs, the low temperature process is adopted, thereby reducing the complexity of the manufacture. The gate (e.g., 712A) of each TFT 700A is electrically coupled to and electrically communicated to one of the transistors (e.g., 30-50) embedded in the substrate 200 within the region PR through the build-up layers and at least one of the conductive plugs 208, while a first source/drain element (e.g., one of 750 or 760) of the pair of the source/drain elements (e.g., 750, 760) of each TFT 700A is electrically coupled to and electrically communicated to another one of the transistors (not shown) embedded in the substrate 200 within the region PR through the build-up layers and respective ones of conductive plugs 208, and a second source/drain element (e.g., other one of 750 or 760) of the pair of the source/drain elements (e.g., 750, 760) of each TFT 700A is electrically coupled to and electrically communicated to an later-formed component (e.g., 900 in FIG. 8) overlying thereto, in some embodiments. In the case, the gates (e.g., 712A) of TFTs 700A may be electrically coupled to and electrically communicated to different transistors of a first set of the transistors (e.g., 30-50) embedded in the substrate 200 within the region PR. The first source/drain elements (e.g., one of 750 or 760) of the TFTs 700A may be electrically coupled to and electrically communicated to different transistors of a second set of the transistors (not shown) embedded in the substrate 200 within the region PR. The second source/drain elements (e.g., other one of 750 or 760) of the TFTs 700A may be electrically coupled to and electrically communicated to different components (e.g., capacitors in FIG. 8) sequentially formed in the interconnect 100 of the semiconductor device 1000.

As shown in FIG. 5, the TFTs 700A are separated from one another, for example. In some embodiments, structures and configurations of the TFTs 700A are substantially identical to each other. However, the disclosure is not limited thereto; in certain embodiments, sizes and/or shapes (in a plane view and/or the cross-sectional view) of the TFTs 700A may differ from one another based on the demand and design requirements. Owing to the configurations of the TFTs 700A, their fabrication is able to formed in the interconnect 100 (FIG. 9) during the BEOL processes, thus the manufacturing process of the semiconductor device 1000 is simplified, thereby lowering the manufacturing cost. In addition, due to the TFTs 700A are formed in the interconnect 100 (FIG. 9) during the BEOL processes, the occupied area in a silicon substrate/wafer of the semiconductor device 1000 is reduced, the manufacturing cost is further reduced. In the disclosure, the TFTs 700A may be referred to as low-temperature processed bottom-gate transistors, which may function as selectors of the components (e.g., capacitors in FIG. 8) sequentially formed in the interconnect 100. The components (e.g., capacitors in FIG. 8) sequentially formed in the interconnect 100 will be discussed in the greater details in conjunction with FIG. 7 through FIG. 8.

Figure 6:
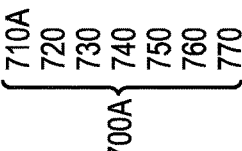

Referring to FIG. 6, in some embodiments, a dielectric layer 810 is disposed over the TFTs 700A to cover the TFTs 700A, and a plurality of conductive vias 820 penetrate through the dielectric layer 810 to be electrically coupled to the TFTs 700A. For example, the conductive vias 820 are laterally covered by the dielectric layer 810 and are electrically connected to the source/drain regions 750, 760 of the TFTs 700A. The formation and materials of the dielectric layer 810 may be substantially identical to or similar to the formation of the dielectric layer 720 as described in FIG. 3, the details, formations and materials of the conductive vias 820 may be substantially identical to or similar to the formation of the contact plugs 208 as described in FIG. 1, and thus are not repeated herein for brevity. In one embodiment, the material of the dielectric layer 810 may be the same as the materials of the dielectric layers 720, 740, 770, 120₁, 120_{T-4}, 120_{T-3}, 120_{T-2}, and/or 120_{T-1}. Alternatively, the material of the dielectric layer 810 may be different from the materials of the dielectric layers 720, 740, 770, 120₁, 120_{T-4}, 120_{T-3}, 120_{T-2}, and/or 120_{T-1}. As shown in FIG. 6, the conductive vias 820 are accessibly revealed by the dielectric layer 810, for example. In some embodiments, an illustrated top surface of the dielectric layer 810 is substantially level with illustrated to surfaces of the conductive vias 820. In other words, the illustrated top surface of the dielectric layer 810 is substantially coplanar to the illustrated to surfaces of the conductive vias 820. The conductive vias 820 may be referred to as connectors or conductive connectors of the TFTs 700A so to establish an electrical connection between the TFTs 700A and other components (e.g., other conductive layer disposed thereon or underlying thereto) in the semiconductor device 1000.

A seed layer (not shown) may be optionally formed between the dielectric layer 810 and the conductive vias 820. That is, for example, the seed layer covers a bottom surface and sidewalls of each of the conductive vias 820. In some embodiments, the seed layer is a metal layer, which may be a single layer or a composite layer comprising a plurality of sub-layers formed of different materials. In some embodiments, the seed layer includes copper layer and the seed layer includes a titanium layer and a copper layer over the titanium layer. The seed layer is formed using, for example, PVD or the like. In one embodiment, the seed layer may be omitted.

In addition, an additional barrier layer or adhesive layer (not shown) may be optionally formed between the conductive vias 820 and the dielectric layer 810. Owing to the additional barrier layer or adhesive layer, it is able to prevent the seed layer and/or the conductive vias 820 from diffusing to the underlying layers and/or the surrounding layers. The additional barrier layer or adhesive layer may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer is interposed between the dielectric layer 810 and the seed layer, and the seed layer is interposed between the conductive vias 820 and the additional barrier layer or adhesive layer. In one embodiment, the additional barrier layer or adhesive layer may be omitted.

Figure 7:
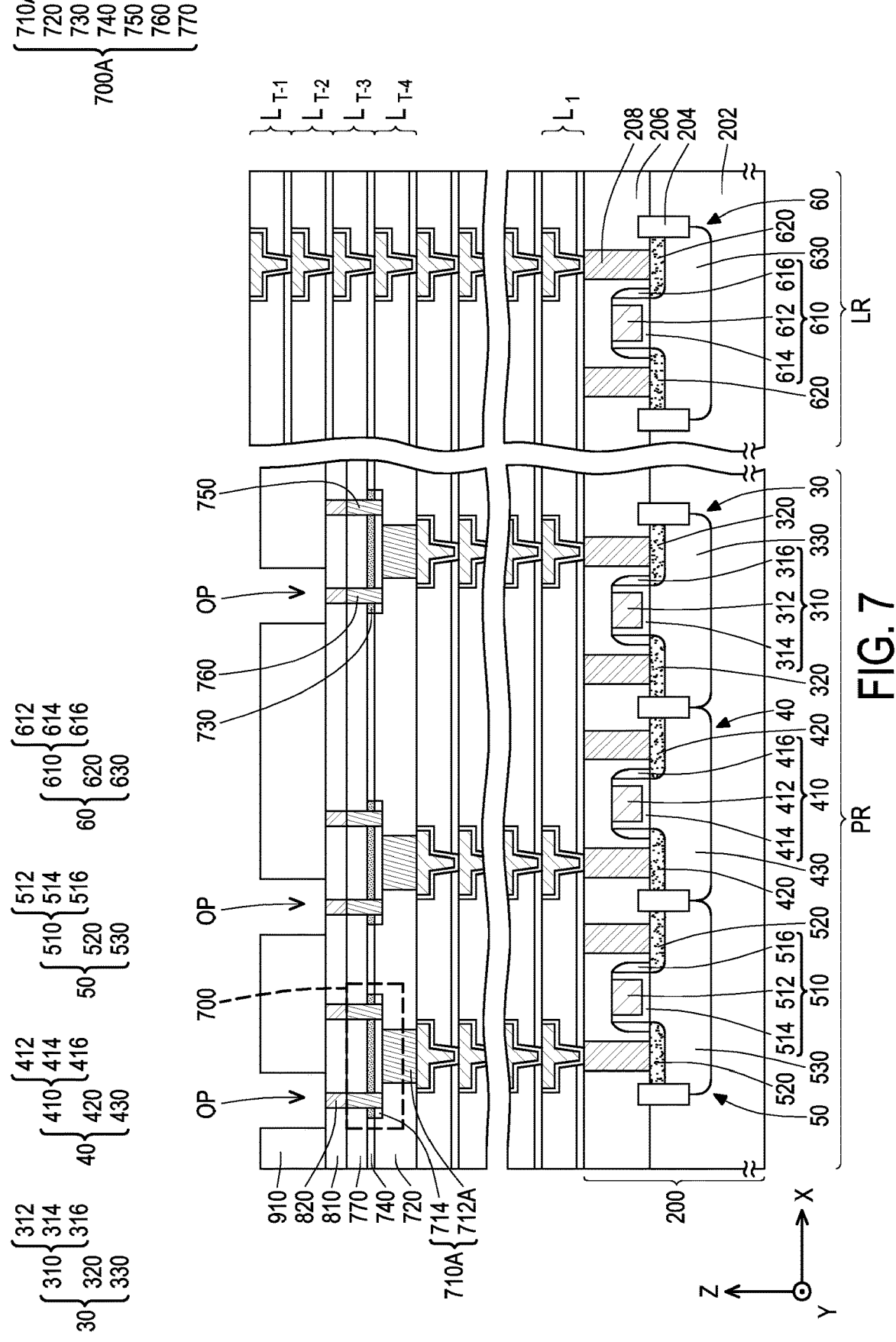

Referring to FIG. 7, in some embodiments, a dielectric layer 910 is disposed over the dielectric layer 810 and the conductive vias 820, where the dielectric layer 910 includes a plurality of openings OP exposing conductive connectors underlying thereto (such as at least one of the conductive vias 820 electrically coupled to each of the TFTs 700A). The formation and materials of the dielectric layer 910 may be substantially identical to or similar to the formation of the dielectric layer 720 as described in FIG. 3, and thus are not repeated herein for brevity. In one embodiment, the material of the dielectric layer 910 may be the same as the materials of the dielectric layers 720, 740, 770, 810, 120₁, 120_{T-4}, 120_{T-3}, 120_{T-2}, and/or 120_{T-1}. Alternatively, the material of the dielectric layer 910 may be different from the materials of the dielectric layers 720, 740, 770, 810, 120₁, 120_{T-4}, 120_{T-3}, 120_{T-2}, and/or 120_{T-1}.

For example, a shape of each of the openings OP may have a substantially circular shape (on the plane view), however the disclosure is not limited thereto. Alternatively, the shapes of the openings OP may be elliptical, oral, square, rectangular, hexagonal, octangular or any suitable polygonal shape. For example, the sidewalls of the openings OP are vertical sidewalls, where a lateral size of the openings OP are substantially constant. However, the disclosure is not limited thereto. Alternatively, the sidewalls of the openings OP are slant sidewalls, where a lateral size of the openings OP are gradually decreased in the direction from an illustrated top surface of the dielectric layer 910 toward an illustrated bottom surface of the dielectric layer 910.

Figure 8:
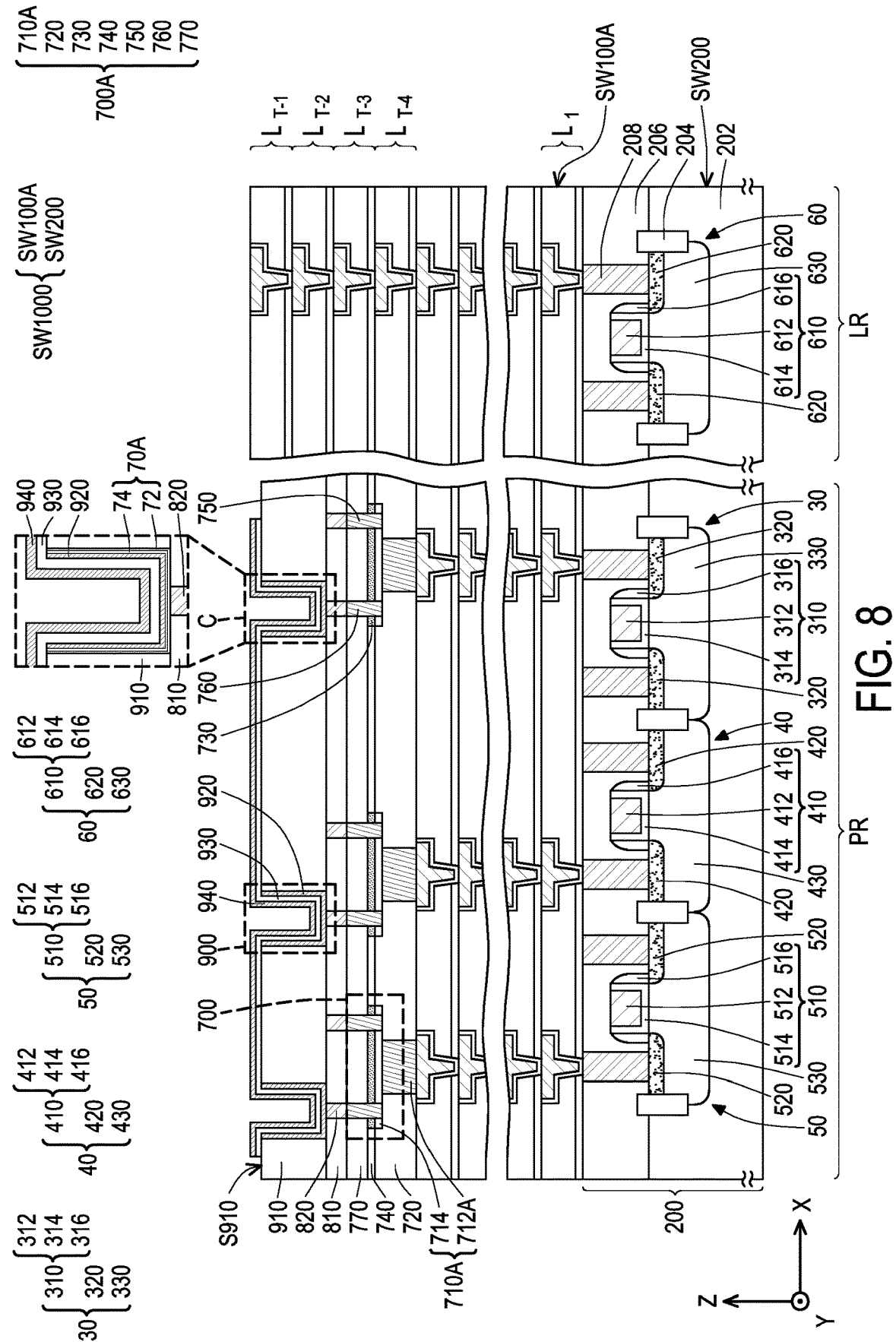

Referring to FIG. 8, in some embodiments, a plurality of capacitors 900 are disposed on the dielectric layer 910 and further extend into the openings OP formed in the dielectric layer 910. For example, the capacitors 900 are disposed on the dielectric layer 910 and further extend into the openings OP formed in the dielectric layer 910, so to electrically couple to the TFTs 700A through some of the conductive vias 820 exposed by the openings OP formed in the dielectric layer 910. The capacitors 900 individually may be a trench capacitor or a deep trench capacitor. In one embodiment, the capacitors 900 each are a metal-insulator-metal (MIM) capacitor. In an alternative embodiment, the capacitors 900 each are a metal-oxide-metal (MOM) capacitor. The capacitors 900 each may have a capacitance density greater than or substantially equal to 100 $nF/mm^2$. In some embodiments, the capacitors 900 individually have a capacitance density approximately ranging from 600 $nF/mm^2$ to 1200 $nF/mm^2$, although other suitable capacitance density may alternatively be utilized. The numbers of the capacitors 900 depicted in FIG. 8 is shown for illustrative purposes, and is not intended to limit the scope of the disclosure. In some embodiments, the capacitors 900 each include a conductive layer 920, a dielectric layer 930 and a conductive layer 940. In some embodiments, for each capacitor 900, the dielectric layer 930 is sandwiched between the conductive layer 920 and the conductive layer 940. Some of the conductive vias 820 underneath thereto may be connected to the conductive layer 920 of the capacitors 900 as shown in FIG. 8. Owing to these conductive vias 820, the capacitors 900 are electrically coupled to and electrically communicated to the TFTs 700A (e.g., the second source/drain elements (e.g., other one of 750 or 760) as aforementioned in FIG. 5), so to form a memory array in the interconnect 100 within the region PR. As illustrated in FIG. 8, the conductive layer 940 of each capacitor 900 is connected to each other, and the dielectric layer 930 of each capacitor 900 is connected to each other, where the conductive layer 920 of each capacitor 900 is separated from each other, for example. That is, the conductive layer 940 of each capacitor 900 is formed in a single layer which continuously extends over the dielectric layer 930 and further extends into the openings OP to cove (e.g., in direct contact with) the dielectric layer 930, and the dielectric layer 930 of each capacitor 900 is formed in a single layer which continuously extends over the dielectric layer 910 and further extends into the openings OP to cover (e.g., in direct contact with) the conductive layers 920 lining sidewalls and bottom surfaces of the openings OP and a portion of an illustrated top surface S910 of the dielectric layer 910, for example. In other words, the conductive layers 940 of the capacitors 900 are formed in the same layer, and the dielectric layers 930 of the capacitors 900 are formed in the same layer. In some embodiments, on the plane view along the direction Z, a vertical projection of the conductive layer 920 of each capacitor 900 is next to a vertical projection of the dielectric layer 910, a vertical projection of the dielectric layer 930 commonly shared by the capacitors 900 is overlapped with the vertical projection of the dielectric layer 910, and a vertical projection of the conductive layer 940 commonly shared by the capacitors 900 is overlapped with the vertical projection of the dielectric layer 910. The vertical projection of the conductive layer 920 is further overlapped with the vertical projection of the dielectric layer 930 and the vertical projection of the conductive layer 940, on the plane view along the direction Z.

For a non-limiting example, on the X-Y plane, the vertical projection of each of the conductive layers 920 is less than the vertical projection of the conductive layer 940 commonly shared by the capacitors 900 and is less than the vertical projection of the dielectric layer 930 commonly shared by the capacitors 900, where the vertical projection of the dielectric layer 930 commonly shared by the capacitors 900 is substantially equal to the vertical projection of the conductive layer 940 commonly shared by the capacitors 900. For another non-limiting example, the vertical projection of each of the conductive layer 920 is less than the vertical projection of the conductive layer 940 commonly shared by the capacitors 900 and is less than the vertical projection of the dielectric layer 930 commonly shared by the capacitors 900, where the vertical projection of the dielectric layer 930 commonly shared by the capacitors 900 is greater than the vertical projection of the conductive layer 940 commonly shared by the capacitors 900. For another non-limiting example, the vertical projection of each of the conductive layer 920 is less than the vertical projection of the conductive layer 940 commonly shared by the capacitors 900 and is less than the vertical projection of the dielectric layer 930 commonly shared by the capacitors 900, where the vertical projection of the dielectric layer 930 commonly shared by the capacitors 900 is less than the vertical projection of the conductive layer 940 commonly shared by the capacitors 900.

As illustrated in FIG. 8, the capacitors 900 adopts the commonly shared conductive layer 940 and the commonly shared dielectric layer 930, for example. However, the disclosure is not limited thereto; alternatively, the capacitors 900 may adopt only the commonly shared conductive layer 940. Or alternatively, the capacitors 900 may adopt only the commonly shared dielectric layer 930. Or, the capacitors 900 do not commonly share the conductive layer 940 and the dielectric layer 930.

In addition, in the disclosure, the conductive layer 920 may be referred to as a bottom electrode of each capacitor 900, the conductive layer 940 may be referred to as a top electrode of each capacitor 900, and a portion of the dielectric layer 930 sandwiched between the conductive layers 920 and 940 may be referred to as a capacitor dielectric of each capacitor 900. Furthermore, the commonly shared conductive layer 940 may further referred to as a reference electrode or a plate for receiving a reference voltage. The materials of the conductive layer 920 and the conductive layer 940 may be the same or different, the disclosure is not limited thereto. The dielectric layer 930 may be a silicon oxide layer, a silicon nitride layer, a silicon oxy-nitride layer, or other suitable dielectric layer, and may be formed by deposition or the like. The conductive layer 920 and the conductive layer 940 independently may be patterned copper layers, patterned aluminum layers or other suitable patterned metal layers, and may be formed by electroplating, deposition or the like. For example, the patterned copper layers are formed through plating process.

In some embodiments, at least one barrier structure is disposed between the capacitors 900 and the dielectric layer 910. As illustrated in FIG. 8, the at least one barrier structure 70A includes a plurality of barrier structures 70A which separate the capacitors 900 from the dielectric layer 910, for example. The barrier structures of the disclosure each may include a composite structure with two or more sub-layers formed of different materials. For example, each barrier structure 70A incudes a barrier layer 72 and a barrier layer 74 disposed thereon, and one barrier structure 70A separates one of the capacitors 900 from the dielectric layer 910 surrounding thereto, where the barrier layer 74 is disposed between the barrier layer 72 and the respective one of the capacitors 900, and the barrier layer 72 is disposed between the barrier layer 74 and the dielectric layer 910 surrounding thereto. In some embodiments, the illustrated top surface S910 of the dielectric layer 910 is substantially level with an illustrated top surface of the barrier layer 72 and an illustrated top surface of the barrier layer 74 of each of the barrier structures 70A and an illustrated top surface of the conductive layer 920 of each of the capacitors 900. That is, the illustrated top surface S910 of the dielectric layer 910 is substantially coplanar to the illustrated top surface of the barrier layer 72 and the illustrated top surface of the barrier layer 74 of each of the barrier structures 70A and the illustrated top surface of the conductive layer 920 of each of the capacitors 900. The barrier structures 70A line the sidewalls and the bottom surfaces of the conductive layer 920 of each of the capacitors 900, for example. As shown in FIG. 8 and FIG. 12A, the capacitors 900 may be formed in a plurality of openings OP formed in the dielectric layer 910, where the openings OP accessibly expose some of the conductive vias 820 underlying thereto. In the case, the barrier structures 70A may line the sidewalls and the bottom surfaces of the openings OP and in contact with the conductive vias 820 exposed therefrom, and the capacitors 900 may be disposed inside the openings O2 and disposed on the barrier structure 70A.

Continued on FIG. 8 in conjunction with FIG. 12A, an interface IF1 is disposed between the barrier layer 72 and the barrier layer 74. For example, the interface IF1 is formed by performing a surface treatment on the barrier layer 72. In some embodiments, the interface IF1 is referred to as an artificial interface of the disclosure. Owing to the interfaces IF1, the moisture or hydrogen (from the other components inside the semiconductor device 1000 or the external environment, during the operation or in the manufacture of the semiconductor device 1000) can be trapped at (e.g., absorbed by) the interface IF1, so that the capacitors 900 can be prevented from the contamination (e.g., negative impacts); thereby enhancing the performance of the semiconductor device 1000. The details, formations and materials of the barrier structures 70A (e.g., the barrier layer 72, the barrier layer 74 and the interface IF1) have been discussed in FIG. 10A, and thus are not repeated herein for brevity.

In the disclosure, the barrier structure may include more than two sub-layers. In a non-limiting example, the barrier structure 70A depicted in FIG. 12A and FIG. 8 may be substituted by a barrier structure 70B depicted in FIG. 12B. For example, the barrier structure 70B includes a composite structure with more than two sub-layers formed of different materials. As shown in FIG. 12B, the barrier structures 70B each may include three sub-layers, such as a barrier layer 72, a barrier 74 and a barrier layer 76. For example, the barrier structures 70B are formed to line the sidewalls and bottom surfaces of the openings OP penetrating the dielectric layer 910, where the capacitors 900 are separated from the dielectric layer 910 through the barrier structure 70B, and the sidewalls and bottom surfaces of the capacitors 900 are covered by (e.g., in physical contact with) the barrier structures 70B.

As illustrated in FIG. 12B, an interface IF1 is disposed between the barrier layer 72 and the barrier layer 74, and an interface IF2 is disposed between the barrier layer 72 and the barrier layer 76, for example. In some embodiments, the interface IF2 is formed by performing a surface treatment on the barrier layer 76. The details of the interface IF1 have been discussed in FIG. 10A and FIG. 3, the details of the interface IF2 have been discussed in FIG. 10B and FIG. 3, and thus are not repeated herein for brevity. In some embodiments, the interface IF2 is referred to as an artificial interface of the disclosure. Owing to the interfaces IF1 and IF2, the moisture or hydrogen (from the other components inside the semiconductor device 1000 or the external environment, during the operation or in the manufacture of the semiconductor device 1000) can be trapped at (e.g., absorbed by) the interfaces IF1 and IF2, so that the capacitors 900 can be prevented from the contamination (e.g., negative impacts); thereby enhancing the performance of the semiconductor device 1000. The interface IF2 may also be referred to as an barrier interface, an absorption interface or a moisture or hydrogen absorption interface, while the barrier structures 70B may also be referred to as a barrier layer or film with multi-layer structure, an absorption layer, an absorption structure, a moisture and/or hydrogen absorption layer, or a moisture and/or hydrogen absorption structure, sometimes.

In some embodiments, the illustrated top surface S910 of the dielectric layer 910 is substantially level with the illustrated top surfaces of the barrier layer 72, the illustrated top surface of the barrier layer 74 and an illustrated top surface of the barrier layer 76 of each of the barrier structures 70B and the illustrated top surface of the conductive layer 920 of each of the capacitors 900. That is, the illustrated top surface of the dielectric layer 910 is substantially coplanar to the illustrated top surfaces of the barrier layer 72, the barrier layer 74 and the barrier layer 76 of each of the barrier structures 70B and the illustrated top surface of the conductive layer 920 of each of the capacitors 900. The barrier structures 70B line the sidewalls and the bottom surfaces of the conductive layer 920 of each of the capacitors 900, for example. The details, formations and materials of the barrier structures 70B have been discussed in FIG. 10B, and thus are not repeated herein for brevity.

In some embodiments, a seed layer (not shown) is optionally disposed between the barrier structure (e.g., 70A and/or 70B) and the conductive layers 920 of the capacitors 900 where the barrier structure (e.g., 70A and/or 70B) is disposed between the optional seed layer and the dielectric layer 910. The details (e.g., formations, materials, positioning configuration, etc.) of the optional seed layer may be substantially identical to or similar to the details of the seed layer seed layer $130_1$ as described in FIG. 1 and/or the details of the optional seed layer have been discussed in FIG. 3 in conjunction with FIGS. 10A-10B, and thus are not repeated herein for brevity.

Referring to FIG. 9, in some embodiments, after the formation of the capacitors 900, a dielectric layer 830, a seed layer 840 and a conductive layer 850 are disposed over the structure depicted in FIG. 8 to form a build-up layer $L_T$ over the build-up layer $L_{T-1}$ within the region LR and over the capacitors 900 within the region PR, thereby forming the interconnect 100 over the substrate 200. As shown in FIG. 9, for example, the build-up layer $L_T$ is disposed on (e.g., in physical contact with) and electrically coupled to the build-up layer $L_{T-1}$ and the capacitors 900 for providing further routing function thereto. In some embodiments, the build-up layer $L_T$ electrically couples the build-up layer $L_{T-1}$ (electrically coupled to the devices formed in the substrate 200 within the region LR) and the capacitors 900 (electrically coupled to the devices formed in the substrate 200 within the region PR). In other words, the conductive layer 940 commonly shared by the capacitors 900 is electrically coupled to one of the devices (e.g., the transistor 60) formed in the substrate 200 within the region LR) through the build-up layers $L_1$-$L_{T-1}$ and some of the contact plugs 208, so to receive a reference voltage therefrom or to be electrically grounded or floating. The reference voltage may be any suitable constant voltage.

In some embodiments, the build-up layer $L_T$ includes a dielectric structure $D_T$ and a metallization layer $M_T$ disposed therein. The dielectric structure $D_T$ may include the dielectric layer 830, where the dielectric structure $D_T$ may be penetrated by a plurality of openings (not labeled). In the case, the metallization layer $M_T$ is disposed inside the openings formed in the dielectric layer 830, where the metallization layer $M_T$ includes a seed layer 840 and a conductive layer 850 disposed thereon, the seed layer 840 lines sidewalls of the openings formed in the dielectric layer 830, and the conductive layer 850 directly stacked on the seed layer 840. The conductive layer 850 of the metallization layer $M_T$ is electrically coupled to the conductive layer $140_{T-1}$ of the metallization layer $ML_{T-1}$ and the conductive layer 940 commonly shared by the capacitors 900 through the seed layer 840, for example, as shown in FIG. 9.

The openings formed in the dielectric layer 830 each may include a trench hole and a via hole underlying and spatially communicated to the trench hole. As illustrated in FIG. 9, portions of the metallization layer $M_T$ formed in the trench holes may be referred to as conductive lines, conductive traces or conductive wires 850t horizontally extended (e.g., extending in the direction X and/or the direction Y), and portions of the metallization layer $M_T$ formed in the via holes may be referred to as conductive vias 850v vertically extended (e.g., extending in the direction Z). In the case, an illustrated top surface of the metallization layer $M_T$ is substantially level with an illustrated top surface of the dielectric structure $D_T$. That is, the illustrated top surface of the metallization layer $M_T$ is substantially coplanar to the illustrated top surface of the dielectric structure $D_T$. The build-up layer $L_T$ may be referred to as a topmost build-up layer of the interconnect 100. The formation, material, and configuration of components of each of the build-up layer $L_T$ are similar to or substantially identical to the forming process, material, and configuration of the components of any one of the build-up layers $L_1$ to $L_{T-1}$ as aforementioned above, and thus are not repeated herein for brevity. The interconnect 100 may be referred to as interconnection, interconnect structure or routing structure of the semiconductor device 1000 for providing routing functions to the devices and/or the electronic components included in the semiconductor device 1000, which not only interconnecting the devices and/or the electronic components but also providing electronic connections to external electronic components or power source(s).

In addition, the build-up layers $L_1$ through $L_T$ may be referred to as redistribution layers or routing layers of the interconnect 100. T can be three, four, five, six, seven, eight, nine, ten, or more. In the disclosure, the layer number (T) of the build-up layers of the interconnect 100 may be three or more than three, depending on the demand and design requirements.

The capacitors 900 and the TFTs 700A electrically coupled thereto are together referred to as an array of memory cells or a memory cell array, where the one memory cell (see FIG. 13) include one capacitor 900 and a respective one TFT 700A electrically connected thereto. The capacitors 900 then may be referred to as storage capacitors or storing capacitors of the memory cells, and the TFTs 700A may be referred to as access transistors or selectors of the memory cells for controlling the capacitors 900 (such as charging or dis-charging, representing two values of a bit, "0" and "1"). In some embodiments, the memory cells are arranged into array. For one non-limiting example, the memory cells are arranged in the form of a matrix, such as a N×N array or a N×M array (N, M>0, N may or may not be equal to M) along the direction X and the direction Y. However, the disclosure is not limited thereto.

Up to here, the semiconductor device 1000 is manufactured. In some embodiments, the semiconductor device 1000 includes the substrate 200 including a plurality of transistors (e.g., 30, 40, 50, 60, and so on), the interconnect 100 disposed on the substrate 200 and electrically coupling to the transistors (e.g., 30, 40, 50, 60, and so on), a plurality of low-temperature TFTs (e.g., 700A) embedded in and electrically coupled to the interconnect 100, a plurality of capacitors (e.g., 900) embedded in and electrically to the interconnect 100, and at least one barrier structure (e.g., 70A and/or 70B) is embedded in the interconnect 100 to separate at least one of conductive elements (e.g., 712A, 750, and/or 760) of the low-temperature TFTs (e.g., 700A) and/or at least one of conductive elements (e.g., 920) of the capacitors (e.g., 900) from dielectrics surrounding thereto, where the capacitors (e.g., 900) are electrically coupled to the low-temperature TFTs (e.g., 700A), respectively. For example, the circuitry of each memory cell includes one TFT 700A and a respective one capacitor 900 overlying and electrically coupled thereto. That is, the circuitry of each memory capacitor is 1T1C configuration. Referring to FIG. 13 in conjunction with FIG. 9, in the circuitry of each memory cell disposed in the interconnect 100 of the semiconductor device 1000, the gate (e.g., 712A) of one TFT 700A is electrically coupled to a word line WL (e.g., the conductive layer of the metallization layer of the build-up layer underlying thereto), the first source/drain element (e.g., 750) of the TFT 700A is electrically coupled to a bit line BL (e.g., the conductive vias 820 and/or a conductive layer connected to the conductive vias 820), and the second source/drain element (e.g., 760) of the TFT 700A is electrically coupled to the bottom electrode (e.g., 920) of the respective one capacitor 900 through another conductive via 820, while the top electrode (e.g., 940) of the respective one capacitor 900 is electrically coupled to the reference voltage or electrically grounded (or floating) through the metallization layer $M_T$ of the interconnect 100.

In some embodiments, for the semiconductor device 1000, the gates (e.g., the gate electrodes 712A) of the TFTs 700A are separated from the dielectric layer 720 laterally covering thereto through the barrier structures 70A (see FIG. 3 and FIG. 10A) or the barrier structures 70B (see FIG. 3 and FIG. 10B), for example. Alternatively, in the semiconductor device of the disclosure, some of the gates (e.g., the gate electrodes 712A) of the TFTs 700A may be separated from the dielectric layer 720 laterally covering thereto through the barrier structures 70A (see FIG. 3 and FIG. 10A), and some of the gates (e.g., the gate electrodes 712A) of the TFTs 700A may be separated from the dielectric layer 720 laterally covering thereto through the barrier structures 70B (see FIG. 3 and FIG. 10B). The disclosure is not limited thereto.

In some embodiments, for the semiconductor device 1000, the source/drain elements (e.g., the source/drain regions 750, 760) of the TFTs 700A are separated from the dielectric layer 770, the semiconductor patterns 730 and the gate dielectric patterns 714 laterally covering thereto through the barrier structures 70A (see FIG. 5 and FIG. 11A) or the barrier structures 70B (see FIG. 5 and FIG. 11B), for example. Alternatively, in the semiconductor device of the disclosure, some of the source/drain elements (e.g., the source/drain regions 750, 760) of the TFTs 700A may be separated from the dielectric layer 770, the semiconductor patterns 730 and the gate dielectric patterns 714 laterally covering thereto through the barrier structures 70A (see FIG. 5 and FIG. 11A), and some of the source/drain elements (e.g., the source/drain regions 750, 760) of the TFTs 700A may be separated from the dielectric layer 770, the semiconductor patterns 730 and the gate dielectric patterns 714 laterally covering thereto through the barrier structures 70B (see FIG. 5 and FIG. 11B). The disclosure is not limited thereto.

In some embodiments, for the semiconductor device 1000, the bottom electrodes (e.g., the conductive layer 920) of the capacitors 900 are separated from the dielectric layer 910 laterally covering thereto through the barrier structures 70A (see FIG. 8 and FIG. 12A) or the barrier structures 70B (see FIG. 8 and FIG. 12B), for example. Alternatively, in the semiconductor device of the disclosure, some of the bottom electrodes (e.g., the conductive layer 920) of the capacitors 900 may be separated from the dielectric layer 910 laterally covering thereto through the barrier structures 70A (see FIG. 8 and FIG. 12A), and some of the bottom electrodes (e.g., the conductive layer 920) of the capacitors 900 may be separated from the dielectric layer 910 laterally covering thereto through the barrier structures 70B (see FIG. 8 and FIG. 12B). The disclosure is not limited thereto.

On the other hand, as shown in the semiconductor device 1000, the sidewall and bottom surface of each of the gates (e.g., the gate electrodes 712A) of the TFTs 700A, the source/drain elements (e.g., the source/drain regions 750, 760) of the TFTs 700 A and the bottom electrodes (e.g., the conductive layer 920) of the capacitors 900 are lined by a respective one barrier structure 70A, a respective one barrier structure 70B, or a combination thereof, for example. However, the disclosure is not limited thereto; the performance of the semiconductor device 1000 can still be improved as long as at least one of: (A) the sidewalls and bottom surfaces of the gates (e.g., the gate electrodes 712A) of the TFTs 700A, (B) the sidewalls and bottom surfaces of the source/drain elements (e.g., the source/drain regions 750, 760) of the TFTs 700A or (C) the sidewalls and bottom surfaces of the bottom electrodes (e.g., the conductive layer 920) of the capacitors 900 are lined by the barrier structures 70A and/or 70B.

In one non-limiting example, only the sidewalls and bottom surfaces of the gates (e.g., the gate electrodes 712A) of the TFTs 700A may be lined by a respective one barrier structure 70A, a respective one barrier structure 70B, or a combination thereof. In another non-limiting example, only the sidewalls and bottom surfaces of the source/drain elements (e.g., the source/drain regions 750, 760) of the TFTs 700A may be lined by a respective one barrier structure 70A, a respective one barrier structure 70B, or a combination thereof. In another non-limiting example, only the sidewalls and bottom surfaces of the bottom electrodes (e.g., the conductive layer 920) of the capacitors 900 may be lined by a respective one barrier structure 70A, a respective one barrier structure 70B, or a combination thereof.

In one non-limiting example, only the sidewalls and bottom surfaces of the gates (e.g., the gate electrodes 712A) of the TFTs 700A and the source/drain elements (e.g., the source/drain regions 750, 760) of the TFTs 700A may be lined by a respective one barrier structure 70A, a respective one barrier structure 70B, or a combination thereof. In another non-limiting example, only the sidewalls and bottom surfaces of the gates (e.g., the gate electrodes 712A) of the TFTs 700A and the bottom electrodes (e.g., the conductive layer 920) of the capacitors 900 may be lined by a respective one barrier structure 70A, a respective one barrier structure 70B, or a combination thereof. In another non-limiting example, only the sidewalls and bottom surfaces of the source/drain elements (e.g., the source/drain regions 750, 760) of the TFTs 700A and the bottom electrodes (e.g., the conductive layer 920) of the capacitors 900 may be lined by a respective one barrier structure 70A, a respective one barrier structure 70B, or a combination thereof.

Figure 14:
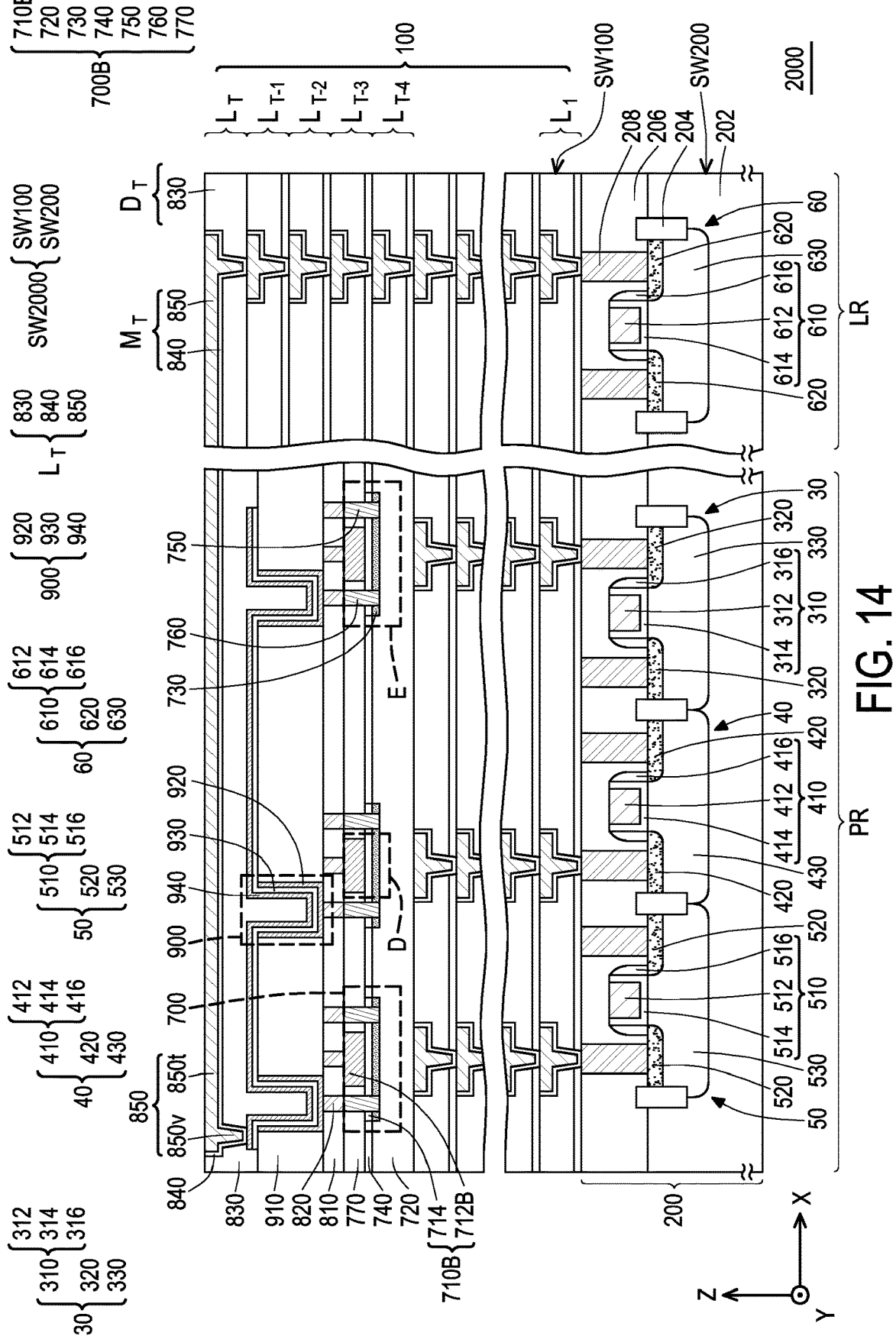
FIG. 14 is a schematic cross-sectional view showing a semiconductor device in accordance with alternative embodiments of the disclosure.
Figure 15A:
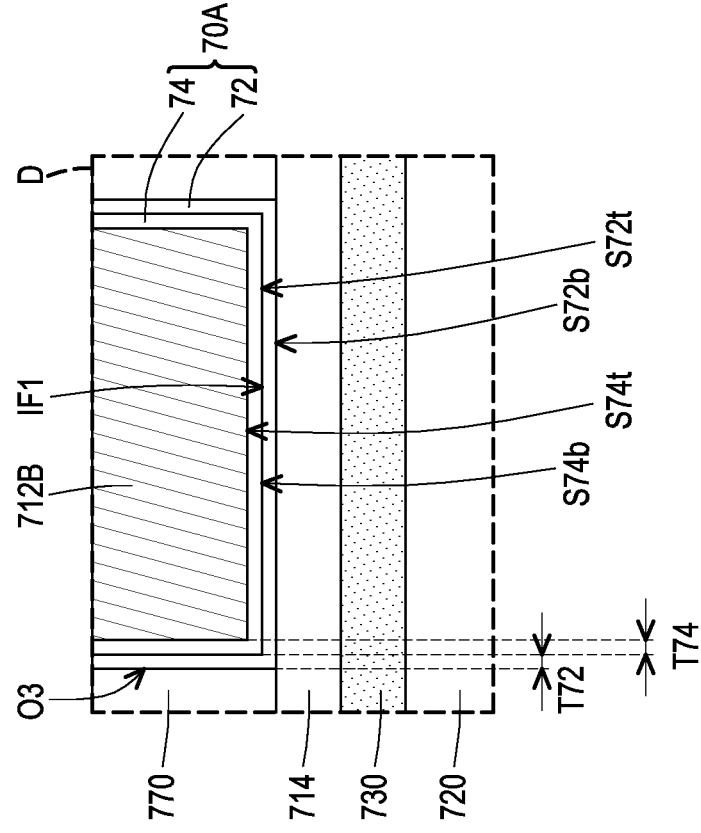
FIG. 15A and FIG. 15B are enlarged and schematic cross-sectional views respectively showing a part of a semiconductor device in accordance with some embodiments of the disclosure.
Figure 15B:
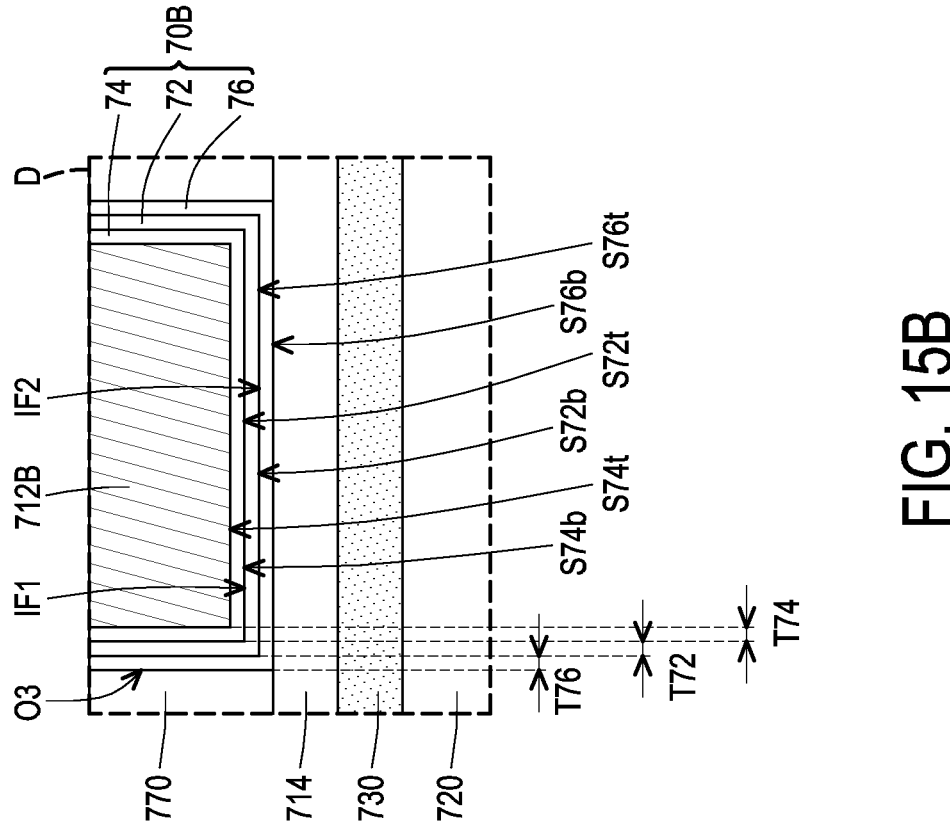
Figure 16A:
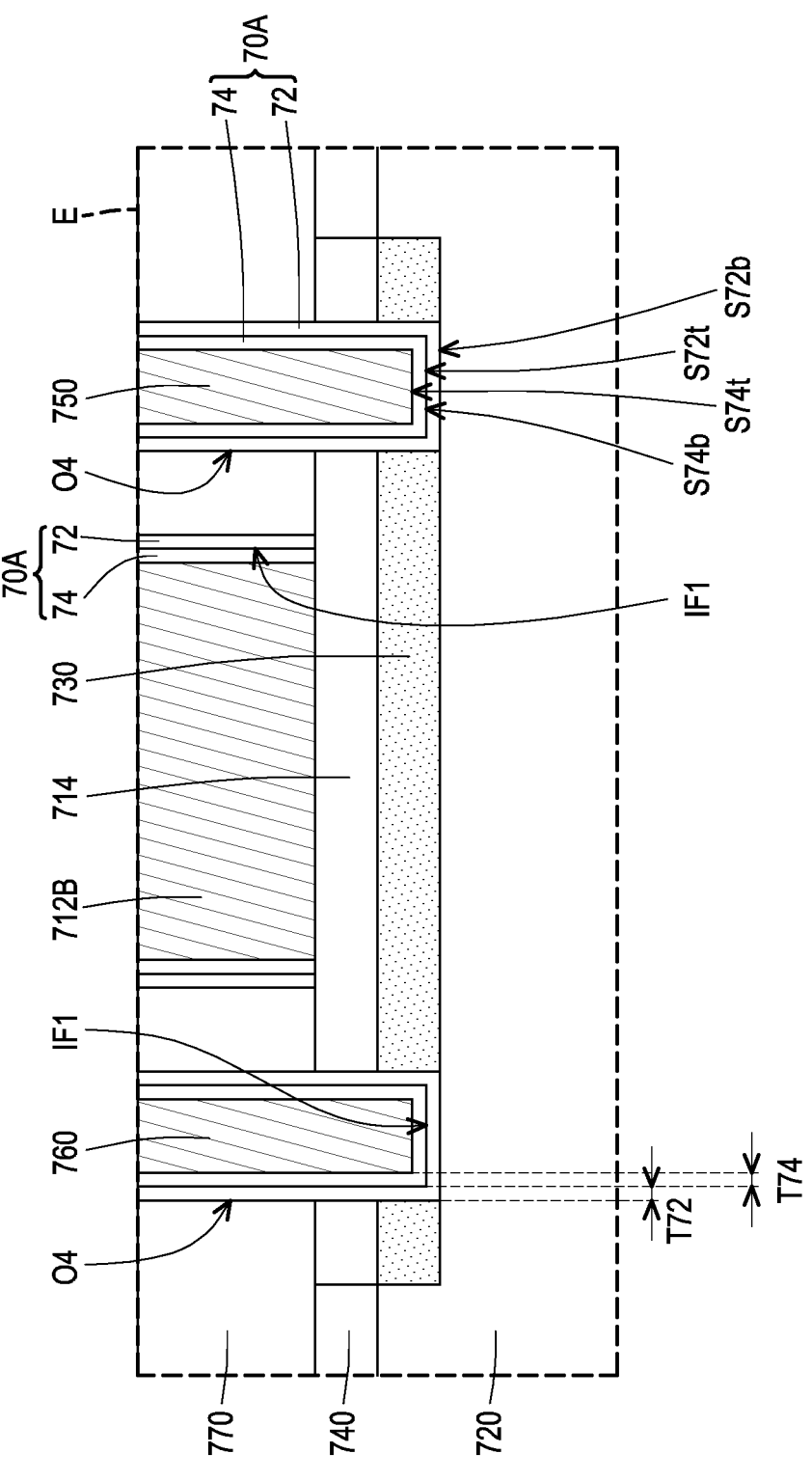
FIG. 16A and FIG. 16B are enlarged and schematic cross-sectional views respectively showing a part of a semiconductor device in accordance with some embodiments of the disclosure.
Figure 16B:
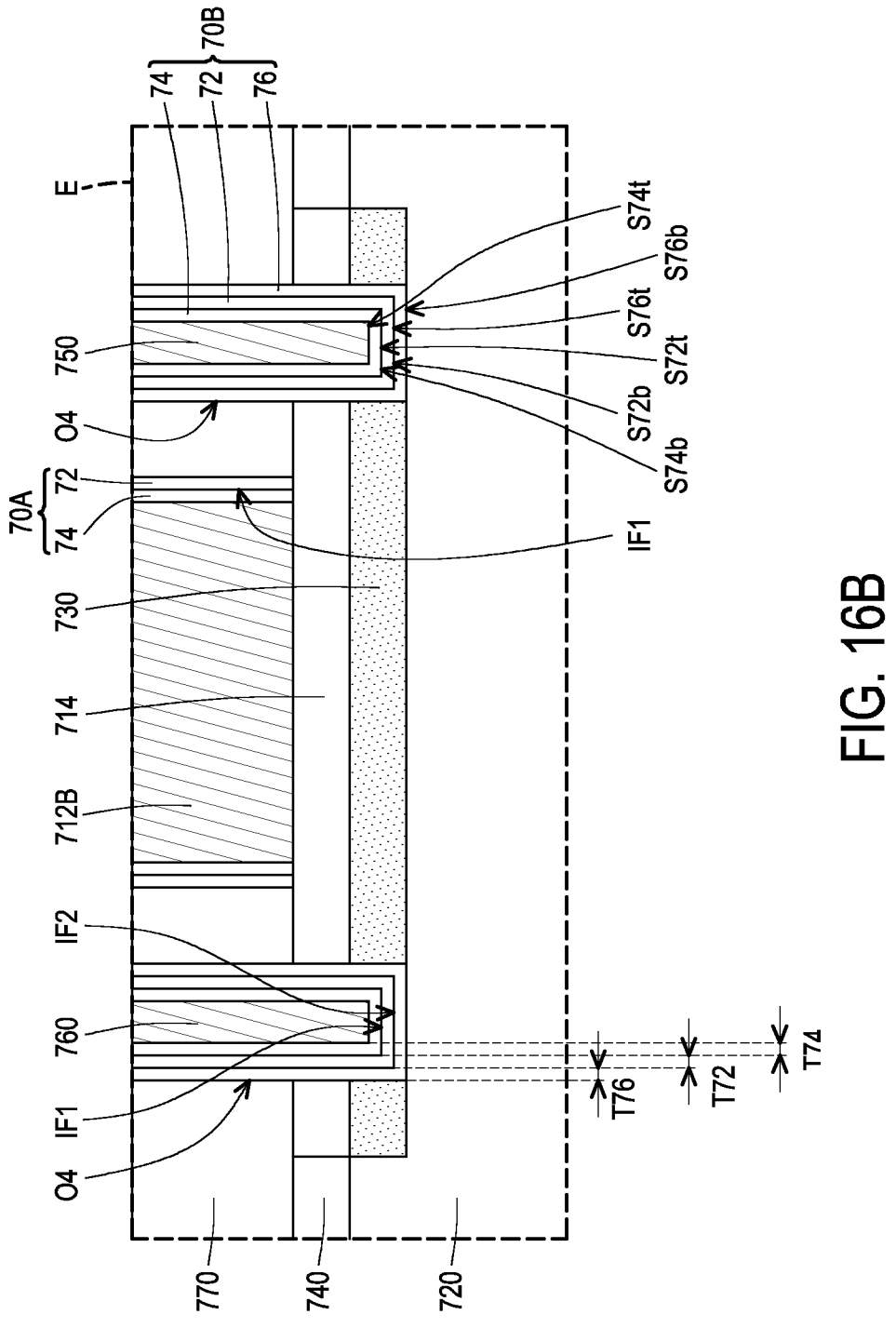

FIG. 14 is a schematic cross-sectional view showing a semiconductor device 2000 in accordance with alternative embodiments of the disclosure. FIG. 15A and FIG. 15B are enlarged and schematic cross-sectional views respectively showing a part of a semiconductor device in accordance with some embodiments of the disclosure, where the enlarged and schematic cross-sectional views of FIG. 15A and FIG. 15B are outlined in a dash-box D of FIG. 15. FIG. 16A and FIG. 16B are enlarged and schematic cross-sectional views respectively showing a part of a semiconductor device in accordance with some embodiments of the disclosure, where the enlarged and schematic cross-sectional views of FIG. 16A and FIG. 16B are outlined in a dash-box E of FIG. 15. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated.

In some embodiments, the semiconductor device 2000 of FIG. 15 is similar to the semiconductor device 1000 of FIG.

9; the difference is that, in the semiconductor device 2000 of FIG. 15, the TFTs 700A (e.g., low-temperature processed bottom-gate transistors) are substituted by a plurality of TFTs 700B (e.g., low-temperature processed top-gate transistors). In some embodiments, the semiconductor device 2000 includes the substrate 200 including a plurality of transistors (e.g., 30, 40, 50, 60, and so on), the interconnect 100 disposed on the substrate 200 and electrically coupling to the transistors (e.g., 30, 40, 50, 60, and so on), a plurality of low-temperature TFTs (e.g., 700B) embedded in and electrically coupled to the interconnect 100, a plurality of connectors (e.g., 820), a plurality of capacitors (e.g., 900) embedded in and electrically to the interconnect 100, and at least one barrier structure (e.g., 70A and/or 70B) is embedded in the interconnect 100 to separate at least one of conductive elements (e.g., 712B, 750, and/or 760) of the low-temperature TFTs (e.g., 700B) and/or at least one of conductive elements (e.g., 920) of the capacitors (e.g., 900) from dielectrics surrounding thereto, where the capacitors (e.g., 900) are electrically coupled to the low-temperature TFTs (e.g., 700B) through the conductive vias 820, respectively. For example, illustrated top surfaces of the conductive vias 820 may be substantially level with an illustrated top surface of the dielectric layer 810, so that the conductive vias 820 may be accessibly revealed by the dielectric layer 810. In other words, the illustrated top surfaces of the conductive vias 820 may be substantially coplanar to the illustrated top surface of the dielectric layer 810. The structures, formation, materials, and functions of each of the substrate 200, the transistors 30-60, the interconnect 100, the dielectric layer 810, the conductive vias 820, and the capacitors 900 have been described in FIG. 1 through FIG. 9, and thus are repeated herein for brevity.

The TFTs 700B each include a gate structure 710B (including a gate electrode 712B and a gate dielectric pattern 714 underlying thereto), a dielectric layer 720 underlying the gate structure 710B, a semiconductor pattern 730 laterally covered by the dielectric layer 720 and underlying the gate structure 710B, a dielectric layer 740 laterally covering the gate dielectric pattern 714 and overlying the dielectric layer 720, a pair of source/drain regions 750, 760 penetrating through the gate dielectric pattern 714 and the semiconductor pattern 730 and being at two opposite sides of the gate electrode 712B, and a dielectric layer 770 laterally covering the gate electrode 712B and the source/drain regions 750, 760, in some embodiments. As shown in FIG. 14, the dielectric layer 720 may be disposed on the build-up layer within the region PR, where multiple semiconductor patterns 730 may be disposed in a plurality of openings (or recesses) formed in the dielectric layer 720, and multiple gate structures 710B and multiple source/drain regions 750, 760 may be formed on the dielectric layer 720. In such case, the gate structures 710B may be standing on the semiconductor patterns 730, where the source/drain regions 750, 760 may penetrate through the gate dielectric layers 714 of the gate structures 710B and the semiconductor patterns 730 to be standing on the dielectric layer 720. As shown in FIG. 14, two source/drain regions 750, 760 of each pair of the source/drain regions 750, 760 may be disposed at two opposite sides of the gate electrodes 712B of the gate structures 710B. In addition, the gate dielectric layers 714 of the gate structures 710B are laterally covered by the dielectric layer 740, and the gate electrodes 712B of the gate structures 710B and the source/drain regions 750, 760 are laterally covered by the dielectric layer 770. In some embodiments, the conductive vias 820 are disposed on (e.g., in physical contact with) and electrically couple the capacitors 900 and the TFTs 700B. As shown in FIG. 14, some of the conductive vias 820 are disposed on (e.g., in physical contact with) and electrically connected to the source/drain regions 750, some of the conductive vias 820 are disposed on (e.g., in physical contact with) and electrically connected to the source/drain regions 760, and some of the conductive vias 820 are disposed on (e.g., in physical contact with) and electrically connected to the gate electrodes 712B, for example. The formation and material of each of the gate electrode 712B and gate dielectric pattern 714 of the gate structure 710B, the dielectric layer 20, the semiconductor pattern 730, the dielectric layer 740, the source/drain regions 750, 760 and the dielectric layer 770 included in the capacitor 700B is substantially identical to or similar to the formation and material of each of the gate electrode 712B and gate dielectric pattern 714 of the gate structure 710B, the dielectric layer 20, the semiconductor pattern 730, the dielectric layer 740, the source/drain regions 750, 760 and the dielectric layer 770 included in the capacitor 900 as described in FIG. 3 through FIG. 5.

The TFTs 700B may be referred to as low-temperature TFTs, which may be able to be formed in the BEOL process.

Owing to the configurations of the TFTs 700B, their fabrication is able to formed in the interconnect 100 (FIG. 14) during the BEOL processes, thus the manufacturing process of the semiconductor device 2000 is simplified, thereby lowering the manufacturing cost. In addition, due to the TFTs 700B are formed in the interconnect 100 (FIG. 14) during the BEOL processes, the occupied area in a silicon substrate/wafer of the semiconductor device 2000 is reduced, the manufacturing cost is further reduced. The gate electrode 712B of each gate structure 710B is referred to as a gate of each TFT 700B, the pair of the source/drain regions 750, 760 is referred to as source/drain elements or regions of the each TFT 700B, and the portion of the semiconductor pattern 730 (e.g., overlapped with the gate electrode 712B of the gate structure 710B and disposed between the pair of the source/drain regions 750, 760) is referred to as a channel or a channel region of each TFT 700B, where a conduction status of the channel or the channel region is controlled by a voltage applied or induced onto the gate electrode 712B (e.g., through the conductive vias 820 electrically coupled thereto). In the case, the conduction status of the channel or the channel region can be detected and/or controlled by the devices (such as the transistor 30, the transistor 40, and the transistor 50 embedded in the substrate 200) electrically coupled thereto. The gate dielectric pattern 714 of each gate structure 710B may be referred to as a gate dielectric layer of each TFT 700B.

For example, illustrated top surfaces of the semiconductor patterns 730 may be substantially level with an illustrated top surface of the dielectric layer 720, so that the semiconductor patterns 730 may be accessibly revealed by the dielectric layer 720. In other words, the illustrated top surfaces of the semiconductor patterns 730 may be substantially coplanar to the illustrated top surface of the dielectric layer 720. For example, illustrated top surfaces of the gate dielectric patterns 714 may be substantially level with an illustrated top surface of the dielectric layer 740, so that the gate dielectric patterns 714 may be accessibly revealed by the dielectric layer 740. In other words, the illustrated top surfaces of the gate dielectric patterns 714 may be substantially coplanar to the illustrated top surface of the dielectric layer 740. For example, illustrated top surfaces of the gate electrode 712B and illustrated top surfaces of the source/drain regions 650, 670 may be substantially level with an illustrated top surface of the dielectric layer 770, so that the gate electrode 712B and the source/drain regions 650, 670 may be accessibly revealed by the dielectric layer 770. In other words, the illustrated top surfaces of the gate electrode 712B and the illustrated top surfaces of the source/drain regions 650, 670 may be substantially coplanar to the illustrated top surface of the dielectric layer 770.

The capacitors 900 and the TFTs 700B electrically coupled thereto are together referred to as an array of memory cells or a memory cell array, where the one memory cell (see FIG. 13) include one capacitor 900 and a respective one TFT 700B electrically connected thereto. The capacitors 900 then may be referred to as storage capacitors or storing capacitors of the memory cells, and the TFTs 700B may be referred to as access transistors or selectors of the memory cells for controlling the capacitors 900 (such as charging or dis-charging, representing two values of a bit, "0" and "1"). In some embodiments, the memory cells are arranged into array. For one non-limiting example, the memory cells are arranged in the form of a matrix, such as a N×N array or a N×M array (N, M>0, N may or may not be equal to M) along the direction X and the direction Y. However, the disclosure is not limited thereto.

For example, the circuitry of each memory cell includes one TFT 700B and a respective one capacitor 900 overlying and electrically coupled thereto. That is, the circuitry of each memory capacitor is 1T1C configuration. Referring to FIG. 14 in conjunction with FIG. 13, in the circuitry of each memory cell disposed in the interconnect 100 of the semiconductor device 2000, the gate (e.g., 712B) of one TFT (e.g., 700B) is electrically coupled to a word line WL (e.g., the conductive vias 820 and/or a conductive layer connected to the conductive vias 820), the first source/drain element (e.g., 750) of the TFT (e.g., 700B) is electrically coupled to a bit line BL (e.g., the conductive vias 820 and/or a conductive layer connected to the conductive vias 820), and the second source/drain element (e.g., 760) of the TFT (e.g., 700B) is electrically coupled to the bottom electrode (e.g., 920) of the respective one capacitor 900 through other conductive vias 820, while the top electrode (e.g., 940) of the respective one capacitor 900 is electrically coupled to the reference voltage or electrically grounded (or floating) through the metallization layer M$_T$ of the interconnect 100.

In some embodiments, for the semiconductor device 2000, the gates (e.g., the gate electrodes 712B) of the TFTs 700B are separated from the dielectric layer 770 laterally covering thereto through the barrier structures 70A (see FIG. 14 and FIG. 15A) or the barrier structures 70B (see FIG. 14 and FIG. 15B), for example. Alternatively, in the semiconductor device of the disclosure, some of the gates (e.g., the gate electrodes 712B) of the TFTs 700B may be separated from the dielectric layer 770 laterally covering thereto through the barrier structures 70A (see FIG. 14 and FIG. 15A), and some of the gates (e.g., the gate electrodes 712B) of the TFTs 700B may be separated from the dielectric layer 770 laterally covering thereto through the barrier structures 70B (see FIG. 14 and FIG. 15B). Owing to the interfaces IF1 and/or IF2 in the barrier structures, the moisture or hydrogen (from the other components inside the semiconductor device 2000 or the external environment, during the operation or in the manufacture of the semiconductor device 2000) can be trapped at (e.g., absorbed by) the interfaces IF1 and IF2, so that the gates (e.g., the gate electrodes 712B) of the TFTs 700B can be prevented from the contamination (e.g., negative impacts); thereby enhancing the performance of the semiconductor device 2000.

In some embodiments, for the semiconductor device 2000, the source/drain elements (e.g., the source/drain regions 750, 760) of the TFTs 700B are separated from the dielectric layer 770, the semiconductor patterns 730 and the gate dielectric patterns 714 laterally covering thereto through the barrier structures 70A (see FIG. 15 and FIG. 16A) or the barrier structures 70B (see FIG. 15 and FIG. 16B), for example. Alternatively, in the semiconductor device of the disclosure, some of the source/drain elements (e.g., the source/drain regions 750, 760) of the TFTs 700A may be separated from the dielectric layer 770, the semiconductor patterns 730 and the gate dielectric patterns 714 laterally covering thereto through the barrier structures 70A (see FIG. 15 and FIG. 16A), and some of the source/drain elements (e.g., the source/drain regions 750, 760) of the TFTs 700A may be separated from the dielectric layer 770, the semiconductor patterns 730 and the gate dielectric patterns 714 laterally covering thereto through the barrier structures 70B (see FIG. 15 and FIG. 16B). Owing to the interfaces IF1 and/or IF2 in the barrier structures, the moisture or hydrogen (from the other components inside the semiconductor device 2000 or the external environment, during the operation or in the manufacture of the semiconductor device 2000) can be trapped at (e.g., absorbed by) the interfaces IF1 and IF2, so that the source/drain elements (e.g., the source/drain regions 750, 760) of the TFTs 700B can be prevented from the contamination (e.g., negative impacts); thereby enhancing the performance of the semiconductor device 2000.

In some embodiments, for the semiconductor device 2000, the bottom electrodes (e.g., the conductive layer 920) of the capacitors 900 are separated from the dielectric layer 910 laterally covering thereto through the barrier structures 70A (see FIG. 14 and FIG. 12A) or the barrier structures 70B (see FIG. 14 and FIG. 12B), for example. Alternatively, in the semiconductor device of the disclosure, some of the bottom electrodes (e.g., the conductive layer 920) of the capacitors 900 may be separated from the dielectric layer 910 laterally covering thereto through the barrier structures 70A (see FIG. 14 and FIG. 12A), and some of the bottom electrodes (e.g., the conductive layer 920) of the capacitors 900 may be separated from the dielectric layer 910 laterally covering thereto through the barrier structures 70B (see FIG. 14 and FIG. 12B). Owing to the interfaces IF1 and/or IF2 in the barrier structures, the moisture or hydrogen (from the other components inside the semiconductor device 2000 or the external environment, during the operation or in the manufacture of the semiconductor device 2000) can be trapped at (e.g., absorbed by) the interfaces IF1 and IF2, so that the bottom electrodes (e.g., the conductive layer 920) of the capacitors 900 can be prevented from the contamination (e.g., negative impacts); thereby enhancing the performance of the semiconductor device 2000.

On the other hand, as shown in the semiconductor device 2000, the sidewall and bottom surface of each of the gates (e.g., the gate electrodes 712B) of the TFTs 700B, the source/drain elements (e.g., the source/drain regions 750, 760) of the TFTs 700B and the bottom electrodes (e.g., the conductive layer 920) of the capacitors 900 are lined by a respective one barrier structure 70A, a respective one barrier structure 70B, or a combination thereof, for example. However, the disclosure is not limited thereto; the performance of the semiconductor device 1000 can still be improved as long as at least one of: (A) the sidewalls and bottom surfaces of the gates (e.g., the gate electrodes 712B) of the TFTs 700B, (B) the sidewalls and bottom surfaces of the source/drain elements (e.g., the source/drain regions 750, 760) of the TFTs 700B or (C) the sidewalls and bottom surfaces of the bottom electrodes (e.g., the conductive layer 920) of the capacitors 900 are lined by the barrier structures 70A and/or 70B.

In one non-limiting example, only the sidewalls and bottom surfaces of the gates (e.g., the gate electrodes 712B) of the TFTs 700B may be lined by a respective one barrier structure 70A, a respective one barrier structure 70B, or a combination thereof. In another non-limiting example, only the sidewalls and bottom surfaces of the source/drain elements (e.g., the source/drain regions 750, 760) of the TFTs 700B may be lined by a respective one barrier structure 70A, a respective one barrier structure 70B, or a combination thereof. In another non-limiting example, only the sidewalls and bottom surfaces of the bottom electrodes (e.g., the conductive layer 920) of the capacitors 900 may be lined by a respective one barrier structure 70A, a respective one barrier structure 70B, or a combination thereof.

In one non-limiting example, only the sidewalls and bottom surfaces of the gates (e.g., the gate electrodes 712B) of the TFTs 700B and the source/drain elements (e.g., the source/drain regions 750, 760) of the TFTs 700B may be lined by a respective one barrier structure 70A, a respective one barrier structure 70B, or a combination thereof. In another non-limiting example, only the sidewalls and bottom surfaces of the gates (e.g., the gate electrodes 712B) of the TFTs 700B and the bottom electrodes (e.g., the conductive layer 920) of the capacitors 900 may be lined by a respective one barrier structure 70A, a respective one barrier structure 70B, or a combination thereof. In another non-limiting example, only the sidewalls and bottom surfaces of the source/drain elements (e.g., the source/drain regions 750, 760) of the TFTs 700B and the bottom electrodes (e.g., the conductive layer 920) of the capacitors 900 may be lined by a respective one barrier structure 70A, a respective one barrier structure 70B, or a combination thereof.

The semiconductor devices 1000, 2000 and modifications thereof individually may be referred to as a dynamic random-access memory (DRAM). The semiconductor devices 1000, 2000 and modifications thereof may be further mounted onto another electronical component or onto a circuit structure, such as a mother board, a package substrate, a printed circuit board (PCB), a printed wiring board, and/or other carrier that is capable of carrying integrated circuits. Or, the semiconductor devices 1000, 2000 and/or modifications thereof may be or may be part of an integrated Fan-Out (InFO) package, an InFO package having a Package-on-Package (PoP) structure, a chip-on-wafer-on-substrate (CoWoS) package, a flip chip package of an InFO package, or the like. The disclosure is not limited thereto. Owing to the barrier structures (e.g., 70A, 70B, or modifications thereof) including the interface IF1 and/or the interface IF2 in the semiconductor device of the disclosure, the moisture or hydrogen (from the other components inside the semiconductor device or the external environment, during the operation or in the manufacture of the semiconductor device) can be trapped at (e.g., absorbed by) the interfaces IF1 and IF2, so that the conductive elements (the gates and source/drain regions of the selectors and the bottom electrode of the storage capacitors) of the memory cells can be prevented from the contamination (e.g., negative impacts); thereby enhancing the performance of the semiconductor device. In addition, the barrier structures (e.g., 70A, 70B, or modifications thereof) including the interface IF1 and/or the interface IF2 may be adopted by logic devices, memory devices, or any other suitable deices that need to repel hydrogen and/or moisture. For example, the barrier structures (e.g., 70A, 70B, or modifications thereof) including the interface IF1 and/or the interface IF2 may be applied to a static random-access memory (SRAM) of BEOL, a memory of one-transistor-one-resistor (e.g., 1T1R configuration), flash type non-volatile memory (NVM) of BEOL, or the like that are suitable to apply the barrier structures (e.g., 70A, 70B, or modifications thereof) accompanied with low-temperature transistors. The disclosure is not limited thereto.

In accordance with some embodiments, a semiconductor device includes a substrate, an interconnect, a memory cell, and a plurality of first barrier structures. The interconnect is disposed over the substrate. The memory cell is disposed in the interconnect within a memory region of the substrate, where the memory cell includes a transistor and a capacitor. The transistor includes a gate, source/drain elements respectively standing at two opposite sides of the gate, and a channel disposed between the source/drain elements and overlapped with the gate. The capacitor is disposed over the transistor and electrically coupled to one of the source/drain elements. The plurality of first barrier structures line sidewalls and bottom surfaces of the source/drain elements, and each include a first barrier layer and a second barrier layer disposed between the source/drain elements and the first barrier layer, where a first absorption interface is disposed between the first barrier layer and the second barrier layer.

In accordance with some embodiments, a semiconductor device includes a substrate, a back-end-of-line (BEOL) routing structure, a plurality of selectors, a plurality of storage capacitors, and a plurality of barrier structures. The substrate has a logic region including a plurality of first transistors and a peripheral region including a plurality of second transistors and next to the logic region. The BEOL routing structure is disposed over the substrate and interconnects the plurality of first transistors and the plurality of second transistors. The plurality of selectors are disposed in the BEOL routing structure within the peripheral region. The plurality of storage capacitors are disposed over and electrically coupled to the plurality of selectors, respectively. The plurality of barrier structures line a sidewall and a bottom surface of at least one conductive element of the plurality of storage capacitor or the plurality of selectors, and each includes a first barrier layer and a second barrier layer disposed between the at least one conductive element and the first barrier layer, where a first absorption interface is disposed between the first barrier layer and the second barrier layer.

In accordance with some embodiments, a method of manufacturing a semiconductor device includes the following steps: providing a substrate; forming a plurality of build-up layers over the substrate; disposing a memory cell over a portion of the plurality of build-up layers within a memory region of the substrate, the memory cell comprising a transistor and a capacitor disposed over the transistor, the transistor comprising a gate, source/drain elements respectively standing at two opposite sides of the gate, and a channel disposed between the source/drain elements and overlapped with the gate, and the capacitor being electrically coupled to one of the source/drain elements; forming a plurality of barrier structures lining sidewalls and bottom surfaces of the source/drain elements, the plurality of barrier structures each comprising a first barrier layer and a second barrier layer disposed between the source/drain elements and the first barrier layer, wherein a first absorption interface is formed between one first barrier layer and a respective one second barrier layer; and forming a topmost build-up layer over the memory cell to form an interconnect of the substrate.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a substrate;
an interconnect, disposed over the substrate;
a memory cell, disposed in the interconnect within a memory region of the substrate, wherein the memory cell comprises:
a transistor, comprising a gate, source/drain elements respectively standing at two opposite sides of the gate, and a channel disposed between the source/drain elements and overlapped with the gate; and
a capacitor, disposed over the transistor and electrically coupled to one of the source/drain elements; and
a plurality of first barrier structures, lining sidewalls and bottom surfaces of the source/drain elements, and each comprising:
a first barrier layer; and
a second barrier layer, disposed between the source/drain elements and the first barrier layer, wherein a first absorption interface is disposed between the first barrier layer and the second barrier layer.

2. The semiconductor device of claim 1, wherein the first absorption interface comprises a hydrogen absorption interface, a moisture absorption interface, or a hydrogen and moisture absorption interface.

3. The semiconductor device of claim 1, wherein the channel is under the gate in a stacking direction of the substrate and the interconnect.

4. The semiconductor device of claim 1, wherein the channel is above the gate in a stacking direction of the substrate and the interconnect.

5. The semiconductor device of claim 1, wherein the plurality of first barrier structures each further comprise:
a third barrier layer, wherein the first barrier layer is disposed between the third barrier layer and the second barrier layer.

6. The semiconductor device of claim 5, wherein a second absorption interface is disposed between the first barrier layer and the third barrier layer, and
wherein the second absorption interface comprises a hydrogen absorption interface, a moisture absorption interface, or a hydrogen and moisture absorption interface.

7. The semiconductor device of claim 1, further comprising:
a second barrier structure, lining a sidewall and a bottom surface of the gate and comprising:
a third barrier layer; and
a fourth barrier layer, disposed between the gate and the third barrier layer, wherein a second absorption interface is disposed between the third barrier layer and the fourth barrier layer, wherein the second absorption interface comprises a hydrogen absorption interface, a moisture absorption interface, or a hydrogen and moisture absorption interface.

8. The semiconductor device of claim 7, wherein the second barrier structure further comprises:

a fifth barrier layer, wherein the third barrier layer is disposed between the fourth barrier layer and the fifth barrier layer.

9. The semiconductor device of claim 8, wherein a third absorption interface is disposed between the third barrier layer and the fifth barrier layer, and wherein the third absorption interface comprises a hydrogen absorption interface, a moisture absorption interface, or a hydrogen and moisture absorption interface.

10. The semiconductor device of claim 1, wherein the capacitor comprises a bottom electrode, a top electrode and a dielectric layer sandwiched therebetween, and the semiconductor device further comprises:

a third barrier structure, lining a sidewall and a bottom surface of the bottom electrode of the capacitor and comprising:

a third barrier layer; and a fourth barrier layer, disposed between the bottom electrode of the capacitor and the third barrier layer, wherein a second absorption interface is disposed between the third barrier layer and the fourth barrier layer, wherein the second absorption interface comprises a hydrogen absorption interface, a moisture absorption interface, or a hydrogen and moisture absorption interface.

11. The semiconductor device of claim 10, wherein the third barrier structure further comprises:

a fifth barrier layer, wherein the third barrier layer is disposed between the fourth barrier layer and the fifth barrier layer.

12. The semiconductor device of claim 11, wherein a third absorption interface is disposed between the third barrier layer and the fifth barrier layer, and wherein the third absorption interface comprises a hydrogen absorption interface, a moisture absorption interface, or a hydrogen and moisture absorption interface.

13. A semiconductor device, comprising:

a substrate, having a logic region comprising a plurality of first transistors and a peripheral region comprising a plurality of second transistors and next to the logic region;

a back-end-of-line (BEOL) routing structure, disposed over the substrate and interconnecting the plurality of first transistors and the plurality of second transistors;

a plurality of selectors, disposed in the BEOL routing structure within the peripheral region;

a plurality of storage capacitors, disposed over and electrically coupled to the plurality of selectors, respectively; and a plurality of barrier structures, lining a sidewall and a bottom surface of at least one conductive element of the plurality of storage capacitor or the plurality of selectors, and each comprising:

a first barrier layer; and a second barrier layer, disposed between the at least one conductive element and the first barrier layer, wherein a first absorption interface is disposed between the first barrier layer and the second barrier layer.

14. The semiconductor device of claim 13, wherein the plurality of selectors comprise a plurality of low-temperature bottom gate transistors each comprising a gate, a pair of source/drain regions disposed at two opposite sides of the gate, a channel disposed between the pair of source/drain regions, and the channel is overlying the gate in a stacking direction of the substrate and the BEOL routing structure, and wherein the at least one conductive element comprises the gates of the plurality of low-temperature bottom gate transistors.

15. The semiconductor device of claim 13, wherein the plurality of selectors comprise a plurality of low-temperature bottom gate transistors each comprising a gate, a pair of source/drain regions disposed at two opposite sides of the gate, a channel disposed between the pair of source/drain regions, and the channel is overlying the gate in a stacking direction of the substrate and the BEOL routing structure, and wherein the at least one conductive element comprises the pairs of source/drain regions of the plurality of low-temperature bottom gate transistors.

16. The semiconductor device of claim 13, wherein the plurality of storage capacitors comprise a plurality of trench capacitors or a plurality of deep trench capacitors each comprising a first electrode, a second electrode and a capacitor dielectric disposed therebetween, wherein the second electrode is commonly shared between the plurality of trench capacitors or the plurality of deep trench capacitors, and wherein the at least one conductive element comprises the first electrodes of the plurality of trench capacitors or the plurality of deep trench capacitors.

17. The semiconductor device of claim 13, wherein the plurality of barrier structures each further comprise:

a third barrier layer, wherein the first barrier layer is disposed between the third barrier layer and the second barrier layer, wherein a second absorption interface is disposed between the first barrier layer and the third barrier layer, and wherein the second absorption interface comprises a hydrogen absorption interface, a moisture absorption interface, or a hydrogen and moisture absorption interface.

18. A method of manufacturing a semiconductor device, comprising:

providing a substrate;

forming a plurality of build-up layers over the substrate;

disposing a memory cell over a portion of the plurality of build-up layers within a memory region of the substrate, the memory cell comprising a transistor and a capacitor disposed over the transistor, the transistor comprising a gate, source/drain elements respectively standing at two opposite sides of the gate, and a channel disposed between the source/drain elements and overlapped with the gate, and the capacitor being electrically coupled to one of the source/drain elements;

forming a plurality of barrier structures lining sidewalls and bottom surfaces of the source/drain elements, the plurality of barrier structures each comprising a first barrier layer and a second barrier layer disposed between the source/drain elements and the first barrier layer, wherein a first absorption interface is formed between one first barrier layer and a respective one second barrier layer; and forming a topmost build-up layer over the memory cell to form an interconnect of the substrate.

19. The method of claim 18, wherein the first absorption interface is formed between the first barrier layer and the second barrier layer by performing a surface treatment on a surface of the first barrier layer proximal to the respective one second barrier layer.

20. The method of claim 18, wherein the plurality of barrier structures each further comprise a third barrier layer, wherein the first barrier layer is disposed between the third barrier layer and the second barrier layer, wherein a second absorption interface is formed between the first barrier layer and the third barrier layer by performing a surface treatment on a surface of the third barrier layer proximal to the respective one first barrier layer.

\* \* \* \* \*